(12) United States Patent
Yamaguchi

(10) Patent No.: US 10,818,769 B2
(45) Date of Patent: Oct. 27, 2020

(54) SEMICONDUCTOR DEVICE HAVING A FERROELECTRIC MEMORY AND MANUFACTURING METHOD THEREOF

(71) Applicant: RENESAS ELECTRONICS CORPORATION, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/193,877

(22) Filed: Nov. 16, 2018

(65) Prior Publication Data
US 2019/0207009 A1 Jul. 4, 2019

(30) Foreign Application Priority Data
Dec. 28, 2017 (JP) ................. 2017-253646

(51) Int. Cl.
| | | |
|---|---|---|
| H01L 29/51 | (2006.01) | |
| H01L 21/8234 | (2006.01) | |
| H01L 29/66 | (2006.01) | |
| H01L 27/088 | (2006.01) | |
| H01L 29/78 | (2006.01) | |
| H01L 27/11592 | (2017.01) | |
| H01L 27/1159 | (2017.01) | |

(52) U.S. Cl.
CPC .... *H01L 29/516* (2013.01); *H01L 21/823462* (2013.01); *H01L 27/088* (2013.01); *H01L 27/1159* (2013.01); *H01L 27/11592* (2013.01); *H01L 29/513* (2013.01); *H01L 29/6684* (2013.01); *H01L 29/78391* (2014.09); *H01L 29/785* (2013.01)

(58) Field of Classification Search
CPC ...................................................... H01L 29/516
USPC ....................................................... 257/295
See application file for complete search history.

(56) References Cited

U.S. PATENT DOCUMENTS

| | | | |
|---|---|---|---|
| 2015/0214322 A1 | 7/2015 | Mueller et al. | |
| 2016/0111549 A1* | 4/2016 | Baars ................ | H01L 29/40111 257/295 |
| 2017/0040331 A1* | 2/2017 | Van Houdt ........... | H01L 29/516 |
| 2017/0338350 A1* | 11/2017 | Flachowsky ........ | H01L 29/7848 |
| 2019/0108998 A1* | 4/2019 | Mueller-Meskamp ..................... | H01L 21/02181 |

* cited by examiner

*Primary Examiner* — Jami Valentine Miller
(74) *Attorney, Agent, or Firm* — McDermott Will & Emery LLP

(57) ABSTRACT

In a ferroelectric memory having a ferroelectric film between a gate electrode and a semiconductor substrate, dielectric breakdown of a gate insulating film is prevented and the polarization performance of the ferroelectric film is enhanced to improve the performance of a semiconductor device. In a memory cell including a field effect transistor including a control gate electrode formed over the semiconductor substrate, between the control gate electrode and a main surface of the semiconductor substrate, a paraelectric film and the ferroelectric film are formed by being stacked in this order over the main surface of the semiconductor substrate.

11 Claims, 40 Drawing Sheets

| OPERATION \ APPLIED VOLTAGE | Vd | Vg | Vs | Vb |
|---|---|---|---|---|
| WRITE | 0 | -4V | 0 | 0 |
| ERASE | 0 | 4V | 0 | 0 |
| READ | Vdd | 0 | 0 | 0 |

| OPERATION \ APPLIED VOLTAGE | Vd | Vcg | Vmg | Vs | Vb |
|---|---|---|---|---|---|
| WRITE | 0 | 0 | -4V | 0 | 0 |
| ERASE | 0 | 0 | 4V | 0 | 0 |
| READ | Vdd | Vdd | 0 | 0 | 0 |

# SEMICONDUCTOR DEVICE HAVING A FERROELECTRIC MEMORY AND MANUFACTURING METHOD THEREOF

CROSS-REFERENCE TO RELATED APPLICATIONS

The disclosure of Japanese Patent Application No. 2017-253646 filed on Dec. 28, 2017, 2017 including the specification, drawings and abstract is incorporated herein by reference in its entirety.

BACKGROUND

The present invention relates to a semiconductor device and a manufacturing method thereof, and particularly to a technique which is effective when applied to a semiconductor device used as a storage element using a ferroelectric film and a manufacturing method thereof.

In recent years, as a semiconductor storage element operating at a low voltage, a ferroelectric memory using a ferroelectric material has been developed. The ferroelectric memory is a nonvolatile storage element in which the direction of polarization of the ferroelectric material is controlled to cause a shift between a state where information is written and a state where information is erased.

As a field effect transistor which operates at a high speed and can be reduced in size, leakage current, and power consumption, a fin-type transistor is known. The fin-type transistor (FINFET standing for Fin Field Effect Transistor) is a semiconductor element having, e.g., a plate-like (wall-like) pattern made of a semiconductor layer protruding over a substrate as a channel layer and having a gate electrode formed so as to mount over the pattern.

Patent Document 1 (Specification of US Patent Application Publication No. 2015/0214322) describes a ferroelectric memory made of a transistor including a SiON layer, a $HfO_2$ layer, a TiN layer, and a gate electrode which are formed in this order over a semiconductor substrate.

RELATED ART DOCUMENT

Patent Document

[Patent Document 1]
  Specification of US Patent Application Publication No. 2015/0214322

SUMMARY

In a ferroelectric memory using a $HfO_2$ film which is a ferroelectric film, the crystal phase of the $HfO_2$ film needs to be orthorhombic. However, the orthorhombic crystal phase is a metastable phase. When an amorphous (non-crystalline) $HfO_2$ film is formed over a semiconductor substrate during a manufacturing process of a semiconductor device and then heat treatment is performed for crystallization at a high temperature of, e.g., about 600 to 1000° C., the crystal phase of the $HfO_2$ film shifts to a monoclinic crystal phase, which is a stable phase. This causes a problem in that the $HfO_2$ film is no longer ferroelectric but is paraelectric, and the element does not normally operate as the storage element.

When a voltage is applied to a gate electrode for the purpose of applying a positive or negative electric field to a ferroelectric film and control polarization inversion, if an electron that has entered the ferroelectric film from a semiconductor substrate is trapped in the ferroelectric film, the performance of the ferroelectric film deteriorates. To prevent this, it can be considered to insert an interfacial layer (block layer) under the ferroelectric film and thus inhibit the performance deterioration of a ferroelectric layer due to charge trapping. However, when the dielectric constant of the interfacial layer is low, a problem arises in that an electric field induced in the ferroelectric film causes dielectric breakdown of the interfacial layer, resulting in a breakdown voltage failure. In the case of inserting a metal film between the interfacial layer and the ferroelectric layer, when the electrostatic capacitance of the interfacial layer is low, a problem arises in that an electric field is less likely to be applied to the ferroelectric layer to increase a voltage for causing polarization inversion.

Other problems and novel features of the present invention will become apparent from a statement in the present specification and the accompanying drawings.

The following is a brief description of the outline of a representative one of the embodiments disclosed in the present invention.

In a semiconductor device according to an embodiment, in a memory cell including a field effect transistor including a control gate electrode formed over a semiconductor substrate, between the control gate electrode and a main surface of the semiconductor substrate, a paraelectric film and a ferroelectric film are formed by being stacked in this order over the main surface of the semiconductor are formed.

The embodiment disclosed in the present invention can improve the performance of the semiconductor device.

DETAILED DESCRIPTION

Figure 1:
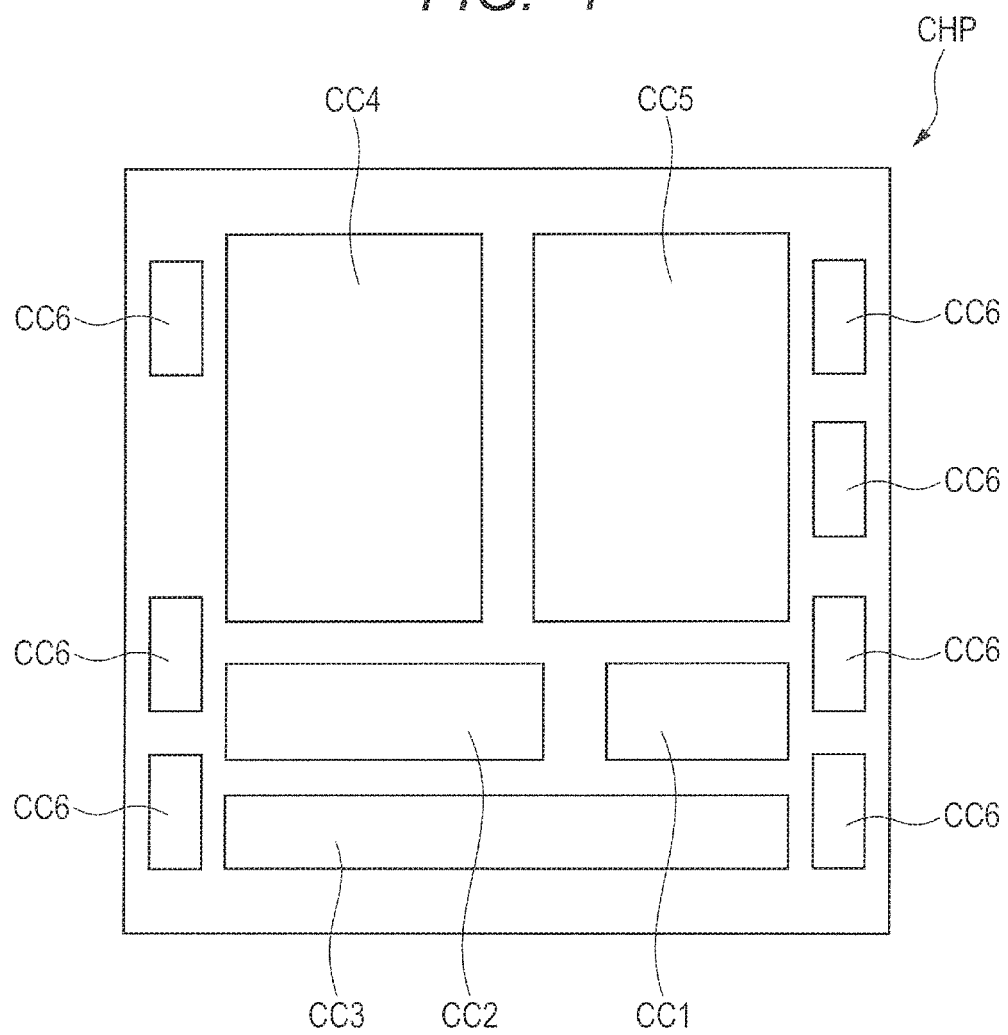
FIG. 1 is a schematic view showing a layout configuration of a semiconductor chip in which a semiconductor device as a first embodiment of the present invention is mounted.

The following will describe the embodiments of the present invention in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

First Embodiment

<Example of Layout Configuration of Semiconductor Chip>

Figure 2:
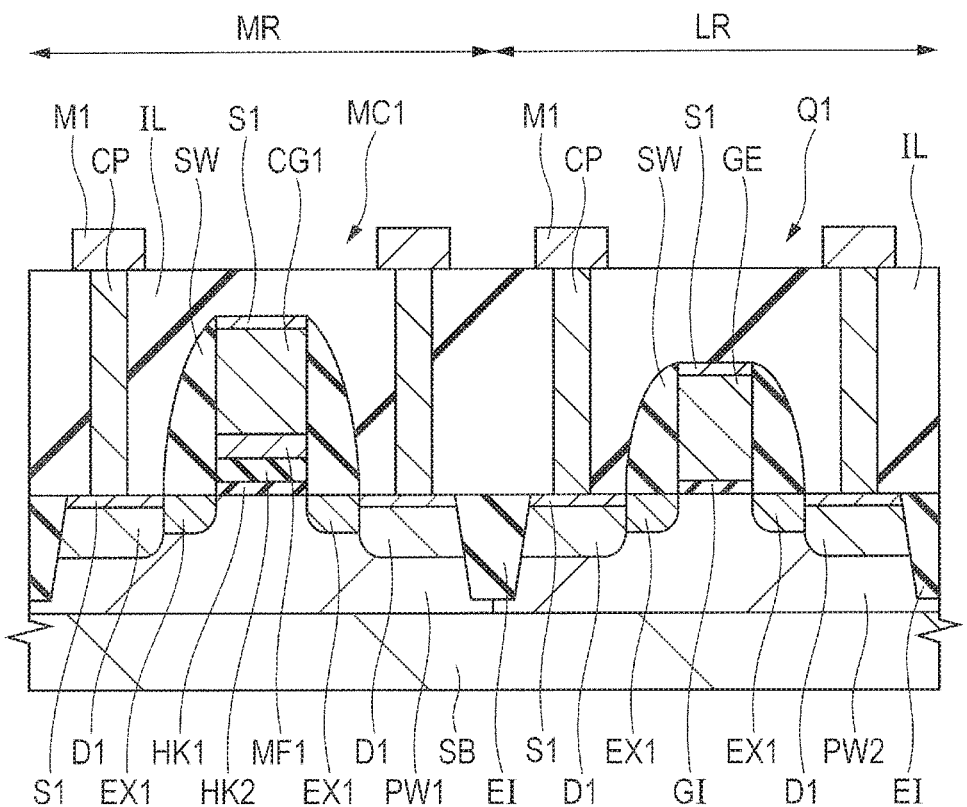
FIG. 2 is a cross-sectional view showing the semiconductor device as the first embodiment of the present invention.
Figure 3:
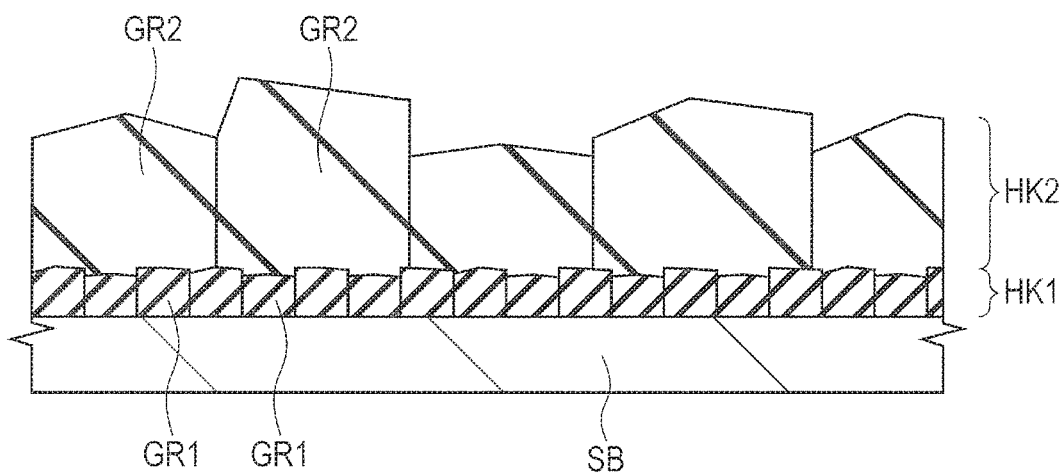
FIG. 3 is an enlarged cross-sectional view showing a portion of the semiconductor device as the first embodiment of the present invention.
Figures 4, 5:
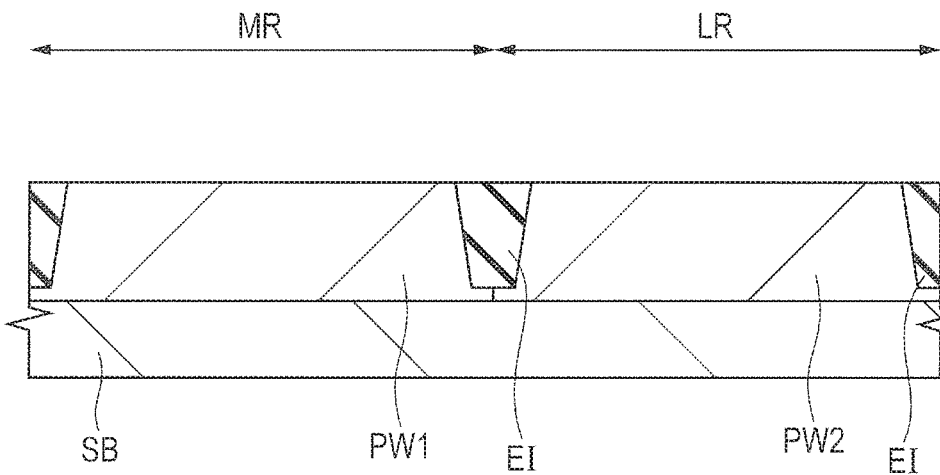
FIG. 4 is a table showing an example of conditions under which voltages are applied to the individual portions of a selected memory cell during "Write", "Erase", and "Read" operations in the semiconductor device as the first embodiment of the present invention.
FIG. 5 is a cross-sectional view illustrating a manufacturing process of the semiconductor device as the first embodiment of the present invention.

Referring to FIGS. 1 to 4, a description will be given of a semiconductor device having a ferroelectric memory, which is a nonvolatile memory, in the present first embodiment. FIG. 1 is a schematic view showing an example of a layout configuration of a semiconductor chip in which the semiconductor device in the present first embodiment is mounted. FIG. 2 is a cross-sectional view showing the semiconductor device as the present first embodiment. FIG. 3 is an enlarged cross-sectional view showing a portion of the semiconductor device as the present first embodiment. FIG. 4 is a table showing an example of conditions under which voltages are applied to the individual portions of a selected memory cell during "Write", "Erase", and "Read" operations in the semiconductor device as the present first embodiment.

First, a description will be given of the layout configuration of the semiconductor device (semiconductor chip) in which a system including the nonvolatile memory is formed. In FIG. 1, a semiconductor chip CHP has a CPU (Central Processing Unit) CC1, a RAM (Random Access Memory) CC2, and an analog circuit CC3. The semiconductor chip CHP also has an EEPROM (Electrically Erasable Programmable Read Only Memory) CC4, a ferroelectric memory CC5, and an I/O (Input/Output) circuit CC6 to form the semiconductor device.

The CPU (circuit) CC1 is referred to also as a central processing unit, reads an instruction from a storage device, decodes the instruction, and performs various arithmetic operations, control, and the like on the basis of the instruction.

The RAM (circuit) CC2 is a memory from which information stored therein can be read randomly, i.e., as required and in which information to be stored can be newly written. The RAM CC2 is referred to also as a randomly writable/readable memory. As the RAM, a SRAM (Static RAM) using a static circuit is used.

The analog circuit CC3 processes signals of a voltage and a current which temporally continuously vary, i.e., analog signals. The analog circuit CC3 includes, e.g., an amplification circuit, a conversion circuit, a modulation circuit, an oscillation circuit, a power supply circuit, and the like.

The EEPROM CC4 and the ferroelectric memory CC5 are among nonvolatile memories in which information stored therein are electrically rewritable by a write operation and an erase operation and are referred to also as electrically erasable and programmable read only memories. Each of memory cells in the EEPROM CC4 includes, e.g., a storage (memory) MONOS (Metal Oxide Nitride Oxide Semiconductor) transistor, a storage (memory) MNOS (Metal Nitride Oxide Semiconductor) transistor, or the like. In the EEPROM CC4, various frequently rewritten data is stored. The EEPROM CC4 or the ferroelectric memory CC5 has not only a memory cell array in which a plurality of nonvolatile memory cells are arranged in rows and columns, but also an address buffer, a row decoder, a column decoder, a verify sense amplifier circuit, a sense amplifier circuit, a write circuit, and the like.

The I/O circuit CC6 is an input/output circuit intended to perform data output from inside the semiconductor chip CHP to an external device coupled to the semiconductor chip CHP, data input from the external device coupled to the semiconductor chip CHP into the semiconductor chip, and the like.

The semiconductor device in the present first embodiment has a memory cell region and a logic circuit region. In the memory cell region, the memory cell array in which the plurality of nonvolatile memory cells are arranged in rows and columns is formed. In the logic circuit region, the CPU CC1, the RAM CC2, the analog circuit CC3, and the I/O circuit CC6 as well as the address buffer, the row decoder, the column decoder, the verify sense amplifier circuit, the sense amplifier circuit, the write circuit, and the like of the EEPROM CC4 or the ferroelectric memory CC5 are formed.

<Structure of Semiconductor Device>

FIG. 2 shows a memory cell MC1 and an n-type transistor Q1 in the present first embodiment. The left part of FIG. 2 shows a memory cell region MR where the memory cell MC included in the nonvolatile memory, which is the ferroelectric memory, is formed. The right part of FIG. 2 shows a logic circuit region (peripheral circuit region) LR where the n-type transistor Q1, which is an n-type MISFET (Metal Insulator Semiconductor Field Effect Transistor or MIS field effect transistor), is formed. Peripheral circuits refer to the circuits other than the nonvolatile memory. The peripheral circuits include the control circuit, the sense amplifier, the column decoder, the row decoder, the input/output circuit for data exchange to/from the outside of a memory module, the power supply circuit, and the like inside the memory module and include a processor such as the CPU, various analog circuits, a SRAM (Static Random Access Memory) memory module, an external input/output circuit, and the like outside the memory module. The n-type transistor formed in the logic circuit region LR is a lower-breakdown-voltage MISFET driven with a voltage lower than that used to drive the memory cell MC1.

The memory cell MC1 formed in the memory cell region MR is formed in, e.g., the ferroelectric memory CC5 of FIG. 1. The n-type transistor Q1 in the logic circuit region LR is formed in, e.g., the RAM CC2, the CPU CC1, or the like.

In the present first embodiment, a description will be given of the case where, as the transistor included in the memory cell MC1 in the memory cell region MR, the n-channel MISFET is formed. However, it is also possible to invert the conductivity type and form a p-channel MISFET in the memory cell region MR. Likewise, in the present first embodiment, a description will be given of the case where the n-channel MISFET is formed in the logic circuit region LR. However, it is also possible to invert the conductivity type and form a p-channel MISFET in the logic circuit region LR. It is also possible to form both of an n-channel MISFET and a p-channel MISFET, i.e., a CMISFET (Complementary MISFET) in the logic circuit region LR.

As shown in FIG. 2, the semiconductor device in the present first embodiment has a semiconductor substrate (semiconductor wafer) SB made of p-type monocrystalline silicon (Si) having a specific resistance of, e.g., about 1 to 10 Ωcm or the like. The semiconductor substrate SB includes a main surface (upper surface) and a back surface (lower surface) opposite to the main surface. The memory cell MC1 and the n-type transistor Q1 are formed in the main surface of the semiconductor substrate SB. In the main surface of the semiconductor substrate SB, a plurality of trenches are formed and, in the trenches, isolation regions EI made of an insulating film defining active regions are formed. The isolation regions EI are provided so as to electrically isolate individual elements from each other between the individual regions arranged along the main surface of the semiconductor substrate SB. In each of the memory cell region MR and the logic circuit region LR also, the isolation regions EI are provided so as to electrically isolate a plurality of elements from each other.

The isolation regions EI are made of an insulator such as silicon oxide and formed by, e.g., a STI (Shallow Trench Isolation) method, a LOCOS (Local Oxidation of Silicon) method, or the like. The isolation regions EI are formed herein by the STI method.

The memory cell MC1 in the ferroelectric memory formed in the memory cell region MR is a nonvolatile storage element including a control gate electrode CG1 formed over the semiconductor substrate SB via a multilayer film including a paraelectric film HK1, a ferroelectric film HK2, and a metal film MF1 which are formed in this order and a pair of source and drain regions formed in the upper surface of the semiconductor substrate SB located lateral to the control gate electrode CG1. In the main surface of the semiconductor substrate SB under the memory cell MC1, a p-type well PW1 is formed in which a p-type impurity (e.g., B (boron)) is introduced at a relatively low concentration. The control gate electrode CG1 is made of, e.g., a polysilicon film.

Each of the foregoing pair of source and drain regions has an extension region EX1 which is an n⁻-type semiconductor region in which an n-type impurity (e.g., As (arsenic), P (phosphorus), or both of As and P) is introduced at a relatively low concentration. The extension regions EX1, diffusion regions D1, and the p-type well PW1 are each formed to extend from the main surface (upper surface) of the semiconductor substrate SB to respective points at the middle of the depth of the semiconductor substrate SB. The depth of the p-type well PW1 is larger than the respective depths of the extension regions EX1, the diffusion regions D1, and the isolation regions EI. Each of the foregoing pair of source and drain regions has the diffusion region (diffusion layer) D1 which is an n⁺-type semiconductor region in which an n-type impurity (e.g., As (arsenic) or both of As and P) is introduced at a relatively high concentration.

Thus, each of the foregoing pair of source and drain regions has not only the diffusion region D1 where the n-type impurity concentration is higher, but also the extension region EX1 where the impurity concentration is lower than in the diffusion region D1. In other words, each of the foregoing pair of source and drain regions has an LDD (Lightly doped Drain) structure. In each of the pair of source and drain regions, the extension region EX1 is formed at a position closer to the control gate electrode CG1 than the position of the diffusion region D1. Specifically, the extension region EX1 and the diffusion region D1 are formed in the main surface of the semiconductor substrate SB, and the extension region EX1 is disposed between the diffusion region D1 and the main surface of the semiconductor substrate SB immediately below the control gate electrode CG1. The extension region EX1 is formed shallower than the diffusion region D1 herein, but may also be formed deeper than the diffusion region D1.

When the depth is mentioned in the present invention with regard to a semiconductor region formed in the main surface (upper surface) of the semiconductor substrate SB, the depth refers to a distance in a direction (height direction, depth direction, perpendicular direction, or vertical direction) perpendicular to the main surface of the semiconductor substrate SB, which is the distance from the upper surface of the semiconductor substrate SB to the lower surface of the semiconductor region at a lowest position (closer to the back surface of the semiconductor substrate SB).

In the channel length direction of the MISFET included in the memory cell MC1, the both side surfaces of a multi-layer film including the paraelectric film HK1, the ferroelectric film HK2, the metal film MF1, and the control gate electrode CG1 are in contact with respective sidewall spacers SW each made of an insulating film. Each of the sidewall spacers SW is made of a multi-layer film including, e.g., a silicon nitride film and a silicon oxide film. Between the foregoing multi-layer film and the sidewall spacers SW, offset spacers each made of, e.g., a silicon nitride film, a silicon oxide film, or a multi-layer film thereof may also be formed. The respective upper surfaces of the control gate electrode CG1 and the diffusion regions D1 are exposed from the sidewall spacers SW.

The lower-breakdown-voltage n-type transistor Q1 includes a gate electrode GE formed over the main surface of the semiconductor substrate SB via a gate insulating film GI and the pair of source and drain regions formed in the main surface of the semiconductor substrate SB located lateral to the gate electrode GE. Similarly to the source and drain regions formed in the memory cell region MR, the source and drain regions have extension regions EX2 which are n$^-$-type semiconductor regions and diffusion regions D2 which are n$^+$-type semiconductor regions each having an impurity concentration higher than that of each of the extension regions EX2. The extension regions EX2 and the diffusion regions D2 are formed in the main surface of the semiconductor substrate SB, and the extension regions EX2 are disposed between the diffusion regions D2 and the main surface of the semiconductor substrate SB immediately below the gate electrode GE.

The gate insulating film GI has a thickness of, e.g., about 2 nm and is made of, e.g., a silicon oxide film. For example, the gate electrode GE is made of a polysilicon film. The both side surfaces of the gate electrode GE of the n-type transistor Q1 in the channel length direction are covered with the respective sidewall spacers SW. The sidewall spacers SW expose the upper surface of the gate electrode GE and the upper surfaces of the diffusion regions D2. In the main surface of the semiconductor substrate SB under the n-type transistor Q1, a p-type well PW2 is formed in which a p-type impurity (e.g., B (boron)) is introduced at a relatively low concentration is formed. The depth of the p-type well PW2 is larger than the respective depths of the extension regions EX2, the diffusion regions D2, and the isolation regions EI.

Since the lower-breakdown-voltage n-type transistor Q1 is an element required to operate at a high speed, the gate length of the gate electrode GE is relatively small and the thickness of the gate insulating film GI is relatively small.

The respective thicknesses of the control gate electrode CG1 and the gate electrode GE are equal, but the height of the upper surface of the control gate electrode CG1 is larger than the height of the upper surface of the gate electrode GE. This is because, between the gate electrode GE and the semiconductor substrate SB, only one silicon oxide film is provided as the gate insulating film GI while, between the control gate electrode CG1 and the semiconductor substrate SB, the multi-layer film including the paraelectric film HK1, the ferroelectric film HK2, and the metal film MF1 is formed. Note that the paraelectric film HK1 and the ferroelectric film HK2 have the function of the gate insulating film. The height mentioned herein refers to a distance in the height direction, which is the distance from the main surface of the semiconductor substrate SB unless particularly described otherwise.

The respective upper surfaces of the control gate electrode CG1 and the diffusion regions D1 in the memory cell region MR and the gate electrode GE and the diffusion regions D1 in the logic circuit region LR are covered with silicide layers S1. Each of the silicide layers S1 is made of, e.g., a cobalt silicide layer, a nickel silicide layer, a nickel platinum silicide layer, or the like.

Over the semiconductor substrate SB, an interlayer insulating film IL is formed to cover the memory cell MC1 and the n-type transistor Q1. The interlayer insulating film IL is made mainly of, e.g., a silicon oxide film and has a planarized upper surface. The thickness of the interlayer insulating film IL is larger than the thickness of a multi-layer film including the paraelectric film HK1, the ferroelectric film HK2, the metal film MF1, the control gate electrode CG1, and the silicide layer S1. The interlayer insulating film IL covers the control gate electrode CG1, the gate electrode GE, and the silicide layers S1 over the respective upper surfaces thereof.

To the respective upper surfaces of the control gate electrode CG1 and the pair of diffusion regions D1, plugs (contact plugs) CP are coupled via the silicide layers S1. The plugs CP are coupling metal films (conductive coupling portions) extending through the interlayer insulating film IL. In FIG. 1, the plug electrically coupled to the control gate electrode CG1 is not shown, but is formed in another region.

Likewise, to the respective upper surfaces of the gate electrode GE and the pair of diffusion regions D2, the plugs CP are coupled via the silicide layers S1. In FIG. 1, the plug electrically coupled to the gate electrode GE is not shown, but is formed in another region.

Each of the plurality of plugs CP is made mainly of, e.g., W (tungsten). It is conceivable that the plug CP includes a main conductor film made of W (tungsten) and a barrier conductor film covering the side and bottom surfaces of the main conductor film. However, in the drawing, the illustration of a multi-layer structure including the main conductor film and the barrier conductor film is omitted, and the plug CP is shown as one conductor film. Note that, as the material of the barrier conductor film, e.g., TiN (titanium nitride) can be used.

Over the interlayer insulating film IL and the plugs CP, an interlayer insulating film (not shown) is additionally formed. The interlayer insulating film is made mainly of, e.g., a silicon oxide film. The interlayer insulating film has a plurality of wire trenches extending from the upper surface thereof to the lower surface thereof. In each of the wire trenches, a wire M1 is embedded. The wire M1 is made mainly of, e.g., Cu (copper) and formed by, e.g., a so-called single damascene method. The upper surfaces of the wires M1 and the upper surface of the interlayer insulating film are planarized to be generally flush with each other. The interlayer insulating film and the plurality of wires M1 are included in the first wiring layer. The first wiring layer is located above the main surface of the semiconductor substrate SB and closest to the main surface of the semiconductor substrate SB.

The bottom surfaces of the wires M1 are coupled to the upper surfaces of the plugs CP. Consequently, the wires M1 are electrically coupled to the control gate electrode CG1, the gate electrode GE, and the source and drain regions via the plugs CP and the silicide layers S1. Note that the wires M1 electrically coupled respectively to the control gate electrode CG1 and the gate electrode GE are formed in another region not shown in FIG. 1.

The paraelectric film HK1 used herein has a dielectric constant (relative permittivity) higher than that of SiN (silicon nitride). In short, the paraelectric film HK1 is a so-called high-k film. The paraelectric film HK1 is an insulating film made of a material in which dielectric polarization occurs when an electric field is applied thereto and the dielectric polarization is reduced to zero when the electric field is removed therefrom, i.e., a paraelectric material. Specifically, in the paraelectric film HK1, unlike in a ferroelectric material, no polarization remains in the absence of the applied electric field. The paraelectric film HK1 is made of, e.g., $HfSiO_4$ (hafnium silicate), $HfO_2$ (hafnia), or $ZrO_2$ (zirconia). In the paraelectric film HK1, an impurity such as Zr (zirconium), Si (silicon), N (nitrogen), C (carbon), or F (fluorine) may also be introduced. The thickness of the paraelectric film HK1 is, e.g., 2 nm.

The paraelectric film HK1 has a polycrystalline structure, which is a crystal structure (crystal phase) other than an orthorhombic crystal structure. Specifically, examples of the crystal structure of a film containing Hf or Zr include an orthorhombic crystal structure, a monoclinic crystal structure, and a tetragonal crystal structure, and the crystal structure of the paraelectric film HK1 is not the orthorhombic crystal structure, but the monoclinic crystal structure or the tetragonal crystal structure. Even if some of a large number of crystal grains included in the paraelectric film HK1 have the orthorhombic crystal structures, the ratio of the volume of the orthorhombic crystal grains to the unit volume of the paraelectric film HK1 is less than 50%. In other words, 50% or more of the large number of crystal grains included in the paraelectric film HK1 have crystal structures other than the orthorhombic crystal structure. This means that the main crystal phase of the plurality of crystal grains included in the paraelectric film HK1 is the monoclinic crystal phase, the tetragonal crystal phase, or both of the monoclinic crystal phase and the tetragonal crystal phase. In other words, 50% or more of the large number of crystal grains included in the paraelectric film HK1 have crystal structures other than the orthorhombic crystal structure. In the present invention, a high-k film made mainly of crystals other than an orthorhombic crystal is referred to as a paraelectric film.

The ferroelectric film HK2 is a film having a dielectric constant (relative permittivity) higher than that of each of SiN (silicon nitride) and a paraelectric material. In other words, the ferroelectric film HK2 is neither a SiN film nor an insulating film having a dielectric constant lower than that of the SiN film. In short, the ferroelectric film HK2 is a so-called high-k film and the dielectric constant (relative permittivity) of the ferroelectric film HK2 is higher than the dielectric constant (relative permittivity) of the paraelectric film HK1. The ferroelectric film HK2 is an insulating film made of a material in which dielectric polarization occurs when an electric field is applied thereto and the polarization is not reduced to zero even when the electric field is removed therefrom, i.e., a dielectric material. Specifically, in the ferroelectric film HK2, unlike in a paraelectric material, the polarization remains even in the absence of the applied electric field. In the ferroelectric material, electric dipoles are aligned even in the absence of an external electric field, and the directions of the dipoles can be changed using an electric field.

To allow a high-k film to serve as a ferroelectric film, it is necessary for the high-k film to have an orthorhombic crystal phase. In other words, the high-k film formed mainly of crystals having the crystal phases other than the orthorhombic crystal phase is a paraelectric film. Accordingly, in a ferroelectric memory, to increase residual polarization in a ferroelectric film, improve the performance of a ferroelectric material, and reduce a drive power for the ferroelectric memory, it is necessary to maximize the ratio of orthorhombic crystals to all the crystals included in the ferroelectric film.

The ferroelectric film HK2 is made of, e.g., $HfSiO_4$ (hafnium silicate), $HfO_2$ (hafnia), or $HfZrO_2$ (hafnium zirconium dioxide). In short, the ferroelectric film HK2 is a hafnium oxide ($Hf_xO_y$) film. In the ferroelectric film HK2, an impurity such as Zr (zirconium), Si (silicon), N (nitrogen), C (carbon), or F (fluorine) may be introduced. Specifically, the ferroelectric film HK2 includes, e.g., $HfO_2$ and an impurity (such as, e.g., Zr or Si) which are mixed at a 1:1 ratio. The impurity concentration of the ferroelectric film HK2 is, e.g., 50%. The concentration (impurity concentration) of the impurity (Zr, Si, N, C, or F) in the ferroelectric film HK2 is higher than the concentration (impurity concentration) of the impurity (Zr, Si, N, C, or F) in the paraelectric film HK1.

The thickness of the ferroelectric film HK2 is, e.g., 10 to 20 nm. Thus, the thickness of the ferroelectric film HK2 is larger than the thickness of the paraelectric film HK1. This allows an electric field (gate electric field) generated by applying a voltage to the control gate electrode CG1 to be more easily applied to the ferroelectric film HK2. Specifically, when the ferroelectric film HK2 is formed thicker than the paraelectric film HK1, the gate electric field is concentrated on the ferroelectric film HK2 so that the ferroelectric film HK2 is more easily polarized. This can reduce the operating voltage of the memory cell MC1.

The ferroelectric film HK2 has a polycrystalline structure, which is an orthorhombic crystal structure (crystal phase). Even if some of a large number of crystal grains included in the ferroelectric film HK2 have crystal structures other than the orthorhombic crystal structure, the ratio of the volume of the crystal grains other than orthorhombic crystal grains to the unit volume of the ferroelectric film HK2 is less than 50%. In other words, 50% or more of the large number of crystal grains included in the ferroelectric film HK2 have the orthorhombic crystal structures. In short, the ferroelectric film mentioned in the present invention is a high-k film made mainly of orthorhombic crystals.

The metal film MF1 is a conductive film made of, e.g., a TiN (titanium nitride) film. The thickness of the metal film MF1 is, e.g., 10 to 20 nm. The metal film MF1 is a cap film provided so as to give a stress to the ferroelectric film HK2. In the process of manufacturing the ferroelectric memory, a $HfO_2$ film deposited in a non-crystalline (amorphous) state is heated to thus form the ferroelectric film HK2 made of the crystallized $HfO_2$ film. At this time, the heating is performed with the metal film MF1 being formed over the amorphous $HfO_2$ film to increase the likelihood of formation of orthorhombic crystal grains in the ferroelectric film HK2. Specifically, by forming the metal film MF1, the ratio of the orthorhombic crystal grains to all the crystal grains included in the ferroelectric film HK2 is increased to thus allow the ferroelectric film HK2 to be polarized at a low voltage. This can reduce the power consumption of the memory cell MC1.

The paraelectric film HK1 is an interfacial layer (block layer) provided to prevent electrons from being trapped (captured) in the gate insulating film including the ferroelectric film HK2. When the ferroelectric memory is operated, a voltage may be applied to the control gate electrode to apply a positive or negative electric field to the ferroelectric film and control the polarization inversion of the ferroelectric film. In that case, electrons may enter the ferroelectric film from the semiconductor substrate. When charges are consequently trapped in the gate insulating film including the ferroelectric film, the performance of the ferroelectric film deteriorates.

Specifically, when a positive voltage is applied to the control gate electrode to bring the memory cell including the transistor in the ferroelectric memory into an erased state (state where the threshold voltage of the transistor is low), charges are trapped in the gate insulating film to increase the threshold voltage of the transistor. Conversely, when a negative voltage is applied to the control gate electrode to bring the memory cell into a written state (state where the threshold voltage of the transistor is high), the charges trapped in the gate insulating film are extracted therefrom to reduce the threshold voltage of the transistor. As a result, the charges trapped in the gate insulating film may prevent the ferroelectric memory from normally operating.

To prevent charges from being thus trapped, in the present first embodiment, the paraelectric film HK1 is formed as the interfacial layer (block layer) between the ferroelectric film HK2 and the semiconductor substrate SB which are shown in FIG. 2. This can prevent charges from being trapped in the gate insulating film including the paraelectric film HK1 and the ferroelectric film HK2. As a result, it is possible to prevent the performance of the ferroelectric film HK2 from deteriorating.

Next, using FIG. 3, a description will be given of a specific configuration of the paraelectric film HK1 and the ferroelectric film HK2. FIG. 3 shows the respective polycrystalline structures of the paraelectric film HK1 and the ferroelectric film HK2 in enlarged relation. The illustration of a structure (including the control gate electrode, the sidewall spacers, the interlayer insulating film, and the like) above the ferroelectric film HK2 is omitted.

As shown in FIG. 3, the paraelectric film HK1 includes a plurality of crystals GR1, while the ferroelectric film HK2 includes a plurality of crystals GR2. The diameter (grain diameter) of each of the crystals GR1 is, e.g., 1 to 2 nm, while the diameter (grain diameter) of each of the crystals GR2 is, e.g., 5 to 10 nm. In other words, the average grain diameter of the crystals GR2 included in the ferroelectric film HK2 is larger than the average grain diameter of the crystals GR1 included in the paraelectric film HK1. The respective grain diameters and heights of the plurality of crystals GR1 are varied, and the respective grain diameters and heights of the plurality of crystals GR2 are also varied. Accordingly, each of the upper surfaces of the paraelectric film HK1 and the ferroelectric film HK2 has unevenness. Since the grain diameters of the crystals GR2 included in the ferroelectric film HK2 are larger than the grain diameters of the crystals GR1 included in the paraelectric film HK1, the unevenness (roughness) of the upper surface of the ferroelectric film HK2 is larger than the unevenness (roughness) of the upper surface of the paraelectric film HK1.

One reason for the size difference between the crystals GR1 and GR2 is that the ferroelectric film HK2 is formed to have a thickness larger than that of the paraelectric film HK1. Another reason is that the grain diameters of the crystals GR2 are set large to thus improve the polarization property of the ferroelectric film HK2. Ideally, the ferroelectric film HK2 preferably includes only single crystals. However, since it is difficult to form single crystals, the ferroelectric film HK2 is formed as a polycrystalline film. Since no polarization occurs in the boundary region (crystal grain boundary) between the adjacent crystals GR2, the number of the crystal grain boundaries is preferably minimized.

Accordingly, in the present first embodiment, the crystals GR2 are formed larger than the crystals GR1 to reduce the number of the crystal grain boundaries. By increasing the crystal grain diameters, the plurality of crystals GR2 included in the ferroelectric film HK2 are more likely to be polarized in equal directions. This can increase residual polarization after the application of the voltage to the ferroelectric film HK2. The residual polarization is the size of polarization remaining in the ferroelectric film HK2 when the electric field applied to the ferroelectric film HK2 is zero. By increasing the residual polarization in the ferroelectric film HK2, it is possible to reduce the operating voltage of the ferroelectric memory and improve an information retention property in the ferroelectric memory.

<Operations in Semiconductor Device>

Next, a description will be given of an example of operations in the nonvolatile memory with reference to FIG. 4.

FIG. 4 is a table showing an example of conditions under which voltages are applied to the individual portions of a selected memory cell during "Write", "Erase", and "Read" operations. In the table of FIG. 4, a voltage Vd applied to the drain region of the memory cell (selected memory cell) MC1 shown in FIG. 2, a voltage Vg applied to the control gate electrode CG1 thereof, a voltage Vs applied to the source region thereof, and a voltage Vb applied to the p-type well PW1 thereof during each of the "Write", "Erase", and "Read" operations are shown. Note that what is shown in the table of FIG. 4 is a preferred example of the conditions for voltage application. The conditions for voltage application are not limited thereto, and can variously be changed as necessary. In the present first embodiment, bringing the memory cell MC1 into the state where the ferroelectric film HK2 is upwardly polarized and the threshold voltage of the transistor included in the memory cell MC1 is relatively high is defined as the "Write" operation. On the other hand, bringing the memory cell MC1 into the state where the ferroelectric film HK2 is downwardly polarized and the threshold voltage of the transistor included in the memory cell MC1 is relatively low is defined as the "Erase" operation".

In the present first embodiment, the "Write" operation to the memory cell MC1 is performed by applying a negative voltage to the control gate electrode CG1 thereof. Specifically, such voltages as shown in, e.g., the "Write" row in FIG. 4 are applied to the individual portions of the selected memory cell to which the "Write" operation is performed. Thus, the ferroelectric film HK2 of the selected memory cell is upwardly polarized to effect the "Write" operation. This increases the threshold voltage of the transistor included in the memory cell MC1. As a result, the memory cell MC1 is brought into the written state.

In the present first embodiment, the "Erase" operation to the memory cell MC1 is performed by applying a positive voltage to the control gate electrode CG1 thereof. Specifically, such voltages as shown in the "Erase" row in FIG. 4 are applied to the individual portions of the selected memory cell to which the "Erase" operation is performed. Thus, the ferroelectric film HK2 of the selected memory cell is downwardly polarized to effect the "Erase" operation. This reduces the threshold voltage of the transistor included in the memory cell MC1. As a result, the memory cell MC1 is brought into the erased state.

When the "Read" operation is performed, such voltages as shown in, e.g., the "Read" row in FIG. 4 are applied to the individual portions of the selected memory cell to which the "Read" operation is performed. By setting the voltage Vg to be applied to the control gate electrode CG1 during the "Read" operation to a value between the threshold voltage of the foregoing transistor in the written state and the threshold voltage of the foregoing transistor in the erased state, the written state or the erased state can be determined.

<Effects of Semiconductor Device>

Figure 75:
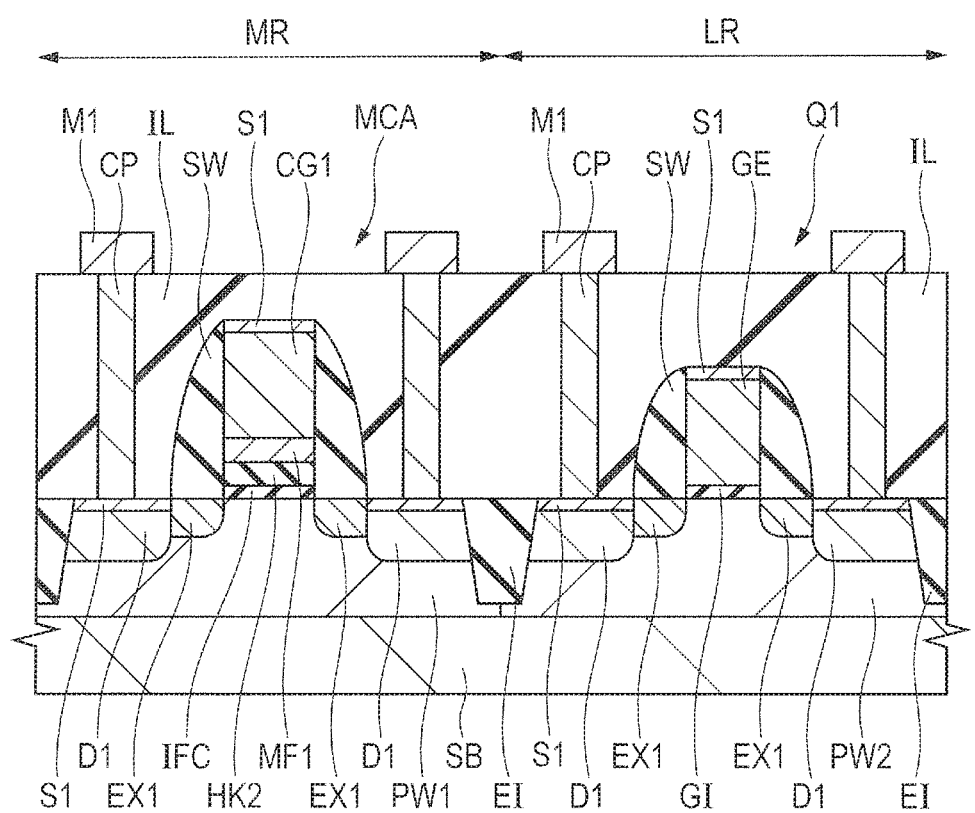
FIG. 75 is a cross-sectional view illustrating a manufacturing process of a semiconductor device as a comparative example.

Next, using FIG. 75, a description will be given of the effects of the semiconductor device in the present first embodiment. FIG. 75 is a cross-sectional view showing a memory cell MCA in a ferroelectric memory as a semiconductor device in a comparative example.

A structure of the memory cell MCA in the comparative example shown in FIG. 75 is mainly different from that of the memory cell in the present first embodiment in that, between the ferroelectric film HK2 and the semiconductor substrate SB, an insulating film IFC, which is neither a ferroelectric film nor a paraelectric film, is formed. The insulating film IFC is made of, e.g., a silicon oxide film or a silicon nitride film. Specifically, the dielectric constant (relative permittivity) of the insulating film IFC is not more than that of silicon nitride so that the insulating film IFC is not a high-k film.

As described above, in the ferroelectric memory including the transistors, to prevent charges from being trapped in the gate insulating film including the ferroelectric film, it can be considered to form the interfacial layer (block layer) between the ferroelectric film and the semiconductor substrate. Accordingly, in the comparative example, the insulating film IFC made of, e.g., a silicon nitride film is provided under the ferroelectric film HK2 to be interposed between the semiconductor substrate and the ferroelectric film HK2. However, when the insulating film IFC as the interfacial layer is made of a material having a low dielectric constant such as silicon nitride or silicon oxide, a problem arises in that the electric field induced in the ferroelectric film HK2 causes dielectric breakdown of the interfacial layer, resulting in a breakdown voltage failure.

By contrast, in the present first embodiment, as shown in FIG. 2, the paraelectric film HK1 is formed as the interfacial layer. By thus forming the paraelectric film HK1 made of a material having a dielectric constant (relative permittivity) higher than that of silicon nitride, it is possible to prevent the electric field induced in the ferroelectric film HK2 from causing dielectric breakdown of the interfacial layer. Therefore, it is possible to improve the reliability of the semiconductor device.

Also, in the present first embodiment, as described using FIG. 3, the crystals GR2 are formed larger than the crystals GR1 to allow the residual polarization in the ferroelectric film HK2 to be increased. This can reduce the operating voltage of the ferroelectric memory and improve the information retention property in the ferroelectric memory. As a result, it is possible to improve the performance of the semiconductor device.

As an approach taken to form the crystals GR2 larger than the crystals GR1, the paraelectric film HK1 is formed under the ferroelectric film HK2 to come in contact with the lower surface of the ferroelectric film HK2. In the case where the interfacial layer is formed of the paraelectric film HK1, when the ferroelectric film HK2 is formed over the upper surface of the interfacial layer, crystal nuclei are less likely to be formed in the ferroelectric film HK2 than in the case where the interfacial layer is formed of a silicon nitride film, a silicon oxide film, or the like. As a result, the number of the crystals GR2 included in the ferroelectric film HK2 is reduced. This allows each of the crystals GR2 to grow large without being inhibited from growing by the adjacent crystals GR2. Thus, by forming the paraelectric film HK1 as the interfacial layer under the ferroelectric film HK2, the crystals GR2 included in the ferroelectric film HK2 can be formed large.

<Manufacturing Process of Semiconductor Device>

Using FIGS. 5 to 20, the following will describe a method of manufacturing the semiconductor device in the present first embodiment. FIGS. 5 to 20 are cross-sectional views of the semiconductor device in the present first embodiment during the formation process thereof. FIGS. 5 to 20 show the memory cell region MR and the logic circuit region LR which are arranged in this order in a left-to-right direction.

First, as shown in FIG. 5, the semiconductor substrate SB is provided herein. The semiconductor substrate SB is made of p-type monocrystalline silicon having a specific resistance of, e.g., about 1 to 10 Ωcm or the like. Subsequently, in the peripheral surface of the semiconductor substrate SB, using a photolithographic technique and an etching method, a plurality of trenches (isolation trenches) are formed. Then, a silicon oxide film is formed using, e.g., a CVD (Chemical Vapor Deposition) method to be embedded in each of the plurality of trenches. Then, the silicon oxide film located outside each of the plurality of trenches is removed to form the isolation region EI left in each of the trenches. The isolation region EI is made mainly of an insulator such as silicon oxide and has, e.g., a STI structure.

Subsequently, in the memory cell region MR, using an ion implantation method, an impurity is introduced into the main surface of the semiconductor substrate SB to form the p-type well PW1 as a p-type semiconductor region extending from the main surface of the semiconductor substrate SB to a point at the middle of the depth of the semiconductor substrate SB. On the other hand, in the logic circuit region LR, using an ion implantation method, an impurity is introduced into the main surface of the semiconductor substrate SB to form the p-type well PW2 as a p-type semiconductor region extending from the main surface of the semiconductor substrate SB to a point at the middle of the depth of the semiconductor substrate SB. The p-type wells PW1 and PW2 are formed by implanting a p-type impurity (e.g., B (boron)).

Figure 6:
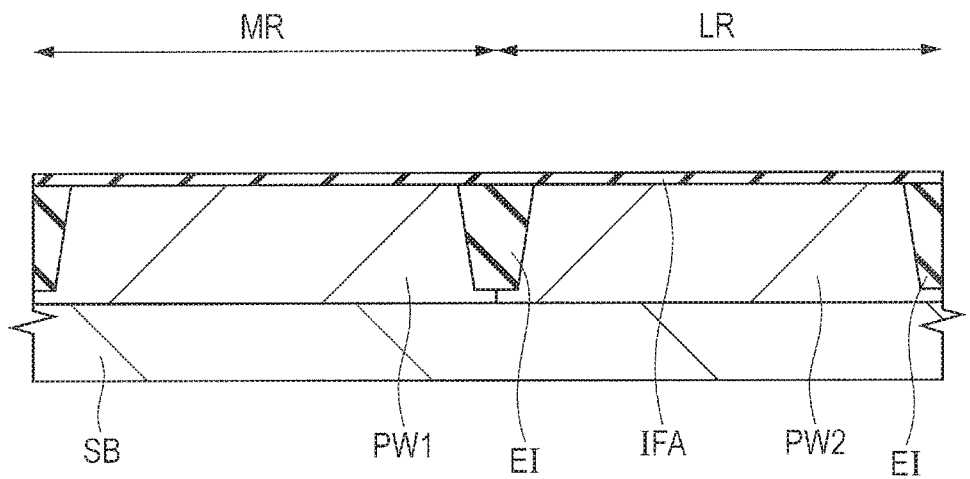
FIG. 6 is a cross-sectional view illustrating the manufacturing process of the semiconductor device, which is subsequent to FIG. 5.

Next, as shown in FIG. 6, over the main surface of the semiconductor substrate SB, an insulating film IFA is formed. The insulating film IFA has a thickness of, e.g., about 2 nm and is made of, e.g., a silicon oxide film. The insulating film IFA can be formed by, e.g., an oxidation method such as a thermal oxidation method, a CVD method, or the like.

Figure 7:
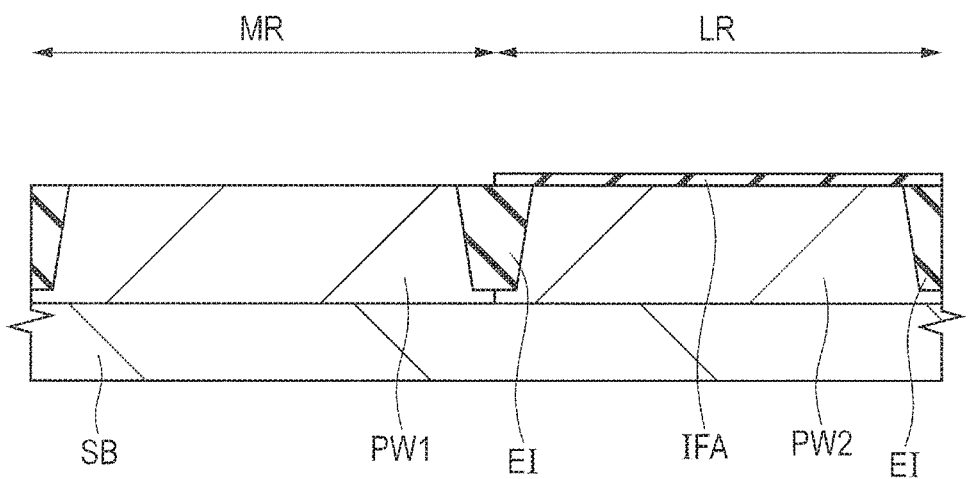
FIG. 7 is a cross-sectional view illustrating the manufacturing process of the semiconductor device, which is subsequent to FIG. 6.

Next, as shown in FIG. 7, using a photolithographic technique and an etching method, the insulating film IFA is removed from the memory cell region MR. Thus, in the main cell region MR, the main surface of the semiconductor substrate SB is exposed.

Figure 8:
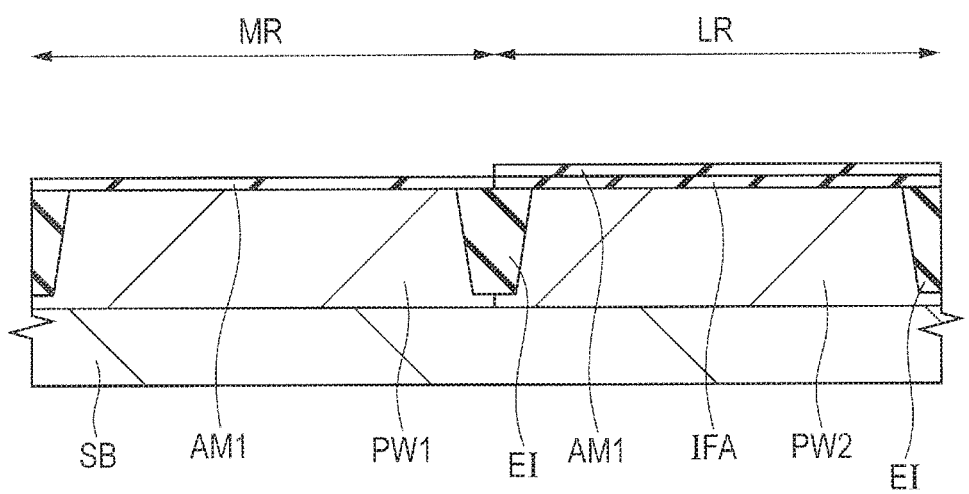
FIG. 8 is a cross-sectional view illustrating the manufacturing process of the semiconductor device, which is subsequent to FIG. 7.

Next, as shown in FIG. 8, over the main surface of the semiconductor substrate SB, a high-k film (insulating film) AM1 in a non-crystalline (amorphous) state is formed. The high-k film AM1 can be formed by, e.g., a CVD method, a PVD (Physical Vapor Deposition) method, or an ALD (Atomic Layer Deposition) method. The thickness of the high-k film AM1 is, e.g., 1 to 2 nm.

Figure 9:
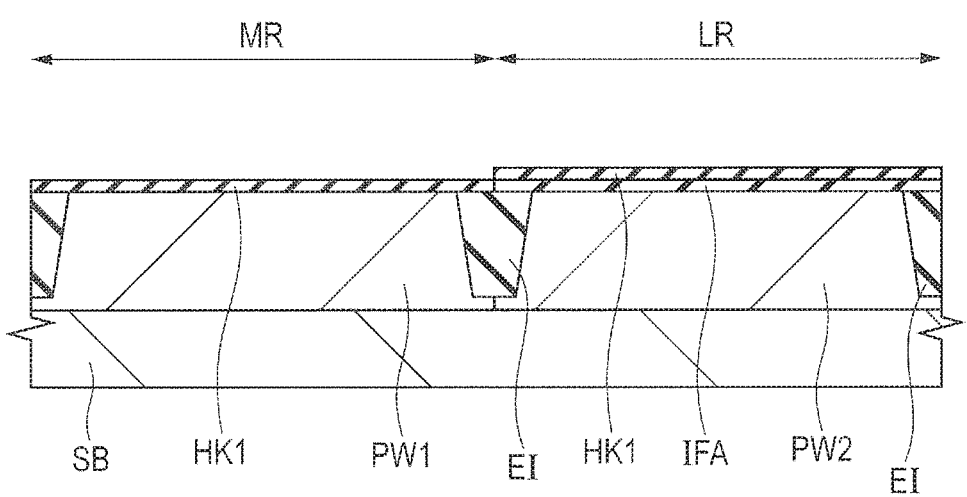
FIG. 9 is a cross-sectional view illustrating the manufacturing process of the semiconductor device, which is subsequent to FIG. 8.

Next, as shown in FIG. 9, the high-k film AM1 is heated at about 600 to 1000° C. to be crystallized (first heat treatment). Thus, the paraelectric film HK1 is formed. The thickness of the paraelectric film HK1 is, e.g., about 1 to 2 nm. The paraelectric film HK1 has a dielectric constant (relative permittivity) higher than that of silicon nitride and is made of, e.g., HfSiO$_4$ (hafnium silicate), HfO$_2$ (hafnia), or ZrO$_2$ (zirconia). Into the paraelectric film HK1, an impurity such as Zr (zirconium), Si (silicon), N (nitrogen), C (carbon), or F (fluorine) may also be introduced.

The paraelectric film HK1 is a polycrystalline body including a plurality of crystals (crystal grains or microcrystals). The average diameter (crystal grain diameter) of the plurality of crystals is, e.g., 1 to 2 nm. These crystals have crystal structures other than an orthorhombic crystal structure. In short, the paraelectric film HK1 is a polycrystalline film made mainly of monoclinic crystals or tetragonal crystals. The semiconductor substrate SB is heated herein at a relatively high temperature of about 600 to 1000° C. to thus form the paraelectric film HK1. Accordingly, as the crystals included in the paraelectric film HK1, monoclinic crystals in a stable phase are likely to be formed.

The first heat treatment can be performed using an RTA (Rapid Thermal Annealing) method. Alternatively, the first heat treatment can be performed by a furnace anneal process. In the furnace anneal process, a plurality of semiconductor wafers placed in a vertical furnace are subjected to simultaneous heat treatment.

Figure 10:
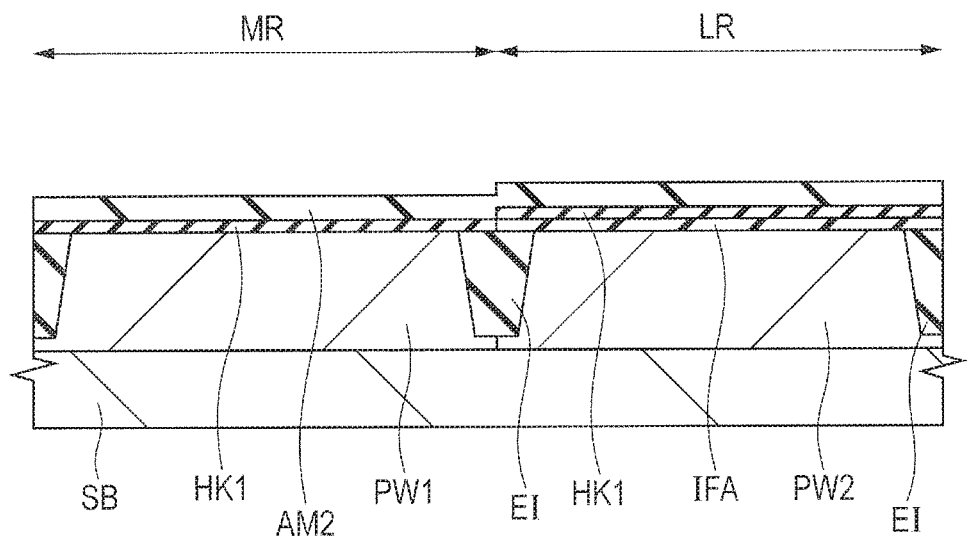
FIG. 10 is a cross-sectional view illustrating the manufacturing process of the semiconductor device, which is subsequent to FIG. 9.

Next, as shown in FIG. 10, over the main surface of the semiconductor substrate SB, a high-k film (insulating film) AM2 in a non-crystalline (amorphous) state containing Hf (hafnium) is formed. In other words, over the paraelectric film HK1, the high-k film AM2 is formed. The high-k film AM2 can be formed by, e.g., a CVD method, a PVD method, or an ALD method. The thickness of the high-k film AM2 is, e.g., 10 to 20 nm.

Figure 11:
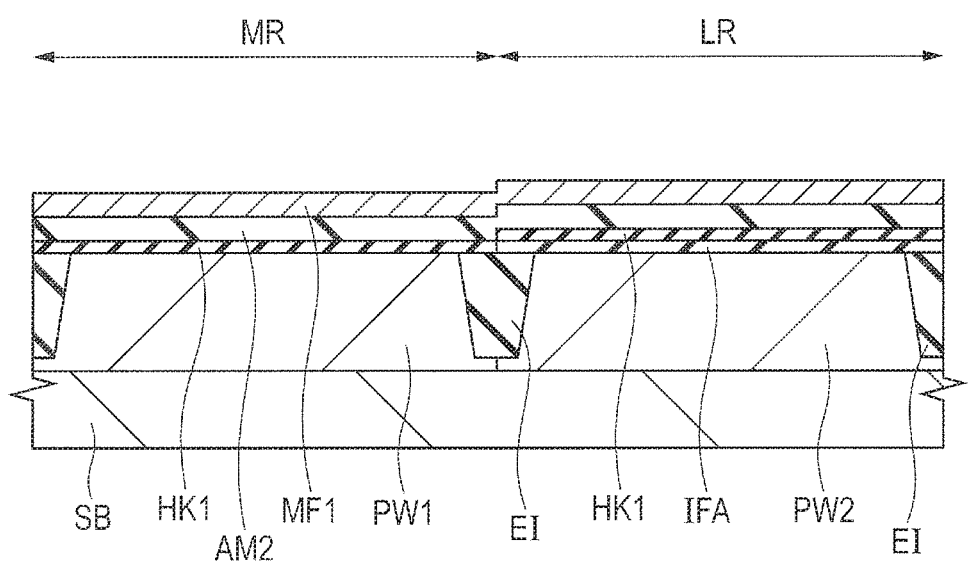
FIG. 11 is a cross-sectional view illustrating the manufacturing process of the semiconductor device, which is subsequent to FIG. 10.

Next, as shown in FIG. 11, using, e.g., a CVD method or a sputtering method, the metal film MF1 as the cap film is formed over the high-k film AM2. The metal film MF1 is made of, e.g., a TiN (titanium nitride) film and has a thickness of, e.g., 10 to 20 nm. The metal film MF1 is formed in contact with the upper surface of the high-k film AM2. The metal film MF1 is provided so as to apply a stress to the high-k film AM2.

Figure 12:
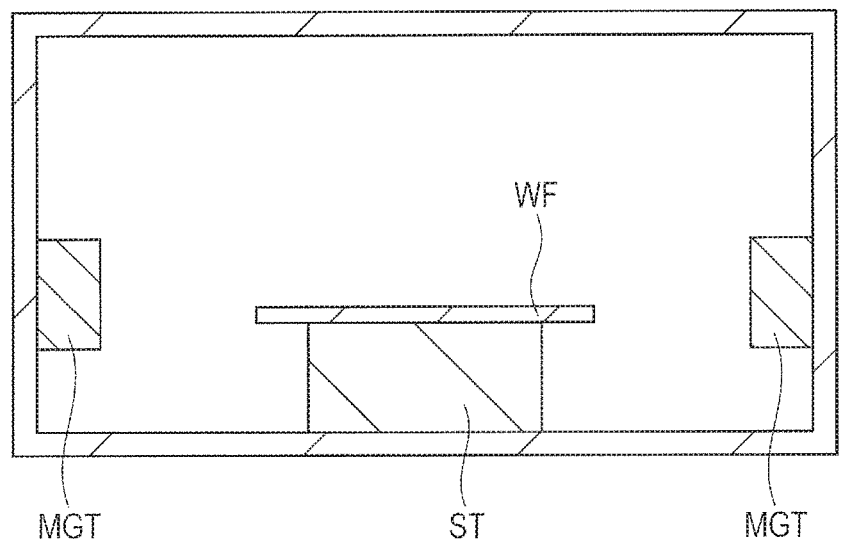
FIG. 12 is a schematic view of a microwave heating device used in the manufacturing process of the semiconductor device as the first embodiment of the present invention.
Figure 13:
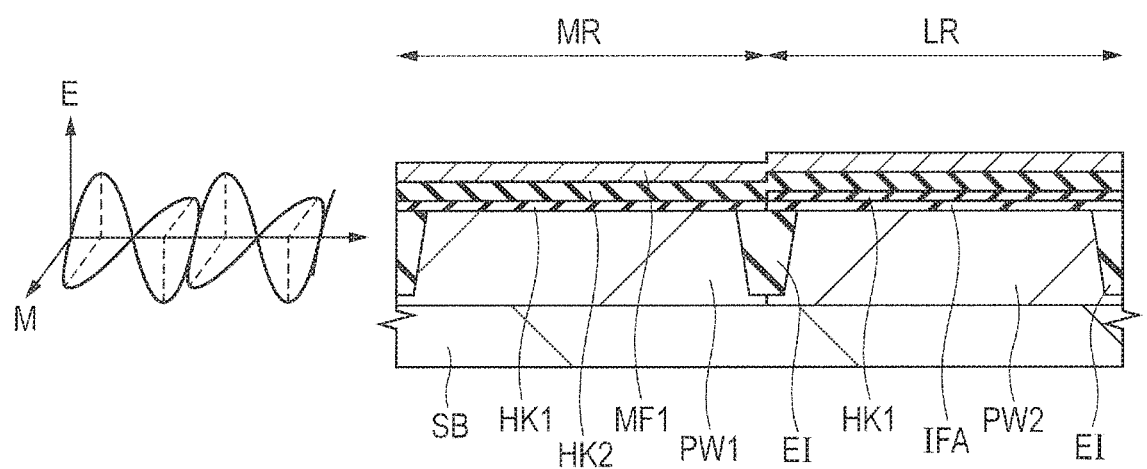
FIG. 13 is a cross-sectional view illustrating the manufacturing process of the semiconductor device, which is subsequent to FIG. 11.

Next, using the microwave heating device shown in FIG. 12, as shown in FIG. 13, the high-k film AM2 is heated at 300 to 400° C. (second heat treatment). By thus crystallizing the high-k film AM2, the ferroelectric film HK2 is formed. The thickness of the ferroelectric film HK2 is, e.g., 10 to 20 nm. The ferroelectric film HK2 has a dielectric constant (relative permittivity) higher than those of silicon nitride and the paraelectric film HK1 and is made of, e.g., HfSiO$_4$ (hafnium silicate), HfO$_2$ (hafnia), or HfZrO$_2$ (hafnium zirconium dioxide). In the ferroelectric film HK2, an impurity such as Zr (zirconium), Si (silicon), N (nitrogen), C (carbon), or F (fluorine) may also be introduced. The concentration of such an impurity in the ferroelectric film HK2 is higher than the concentration of the impurity (Zi, Si, N, C, or F) in the paraelectric film HK1.

The ferroelectric film HK2 is a polycrystalline body including a plurality of crystals (crystal grains). The average diameter (crystal grain diameter) of the plurality of crystals is, e.g., 5 to 10 nm. The crystal grain diameters in the ferroelectric film HK2 are larger than the crystal grain diameters in the paraelectric film HK1. Accordingly, variations in the grain diameter of each of the plurality of crystals included in the ferroelectric film HK2 are larger than variations in the grain diameter of each of the plurality of crystals included in the paraelectric film HK1. Consequently, the unevenness (roughness) of the upper surface of the ferroelectric film HK2 is larger than the unevenness (roughness) of the upper surface of the paraelectric film HK1.

Each of these crystals has an orthorhombic crystal structure. In short, the ferroelectric film HK2 is a polycrystalline film made mainly of orthorhombic crystals. The semiconductor substrate SB is heated herein at a relatively low temperature of about 300 to 400° C. to thus form the ferroelectric film HK2. Consequently, as the crystals included in the ferroelectric film HK2, orthorhombic crystals in a metastable phase are likely to be formed. As a result of performing the second heat treatment in the state where a stress is applied to the high-k film AM2 from the metal film MF1 formed over the high-k film AM2 (see FIG. 11), in the ferroelectric film HK2, not monoclinic crystals or tetragonal crystals, but orthorhombic crystals are likely to be formed. When a heating temperature in the second heat treatment is less than 300° C., crystallization is less likely to occur so that, in the second heat treatment, the heating is performed under a temperature condition of not less than 300° C.

The microwave heating device shown in FIG. 12 includes a wafer stage ST in a container and a pair of magnetrons (microwave oscillators) MGT disposed such that the wafer stage ST is interposed therebetween in a horizontal direction. In the second heat treatment, with a semiconductor wafer WF as the semiconductor substrate SB being placed over the wafer stage ST, an oscillating electromagnetic wave (radio frequency (RF) or microwave) from the magnetrons MGT is applied to the semiconductor wafer WF. Thus, the high-k film AM2 is heated by a heating method using the lattice vibration of crystals to form the ferroelectric film HK2. The frequency of the microwave applied herein is set to 1 to 10 GHz, specifically to, e.g., 2.45 GHz.

At this time, as shown in FIG. 13, a microwave having an electric field E which vibrates in a direction at 90 degrees (perpendicular) to the main surface of the semiconductor substrate SB is applied. In other words, the direction in which a magnetic field M of the microwave vibrates is along the main surface of the semiconductor substrate SB. Specifically, the microwave is caused to be incident on the high-k film AM2 such that the direction in which the electric field E of the microwave vibrates is perpendicular to the upper surface of the high-k film AM2. As a result, in the process of crystallization of the high-k film AM2, crystals which are polarized in the perpendicular direction are selectively heated and grown by the microwave having the electric field E which vibrates in the perpendicular direction. Consequently, in the ferroelectric film HK2, orthorhombic crystals polarized in the perpendicular direction are formed. Since the crystals polarized in the perpendicular direction are selectively heated by the microwave having the electric field E which vibrates in the perpendicular direction, the crystallization can be achieved at a low temperature of not more than 400° C.

The second heat treatment is performed herein in the state where the high-k film AM2 is formed over the paraelectric film HK1 having the upper surface where crystal nuclei are less likely to be formed. Accordingly, the number of the crystals included in the ferroelectric film HK2 is reduced. As a result, the crystals included in the ferroelectric film HK2 are allowed to grow large without being inhibited from growing by another adjacent crystal.

Figure 14:
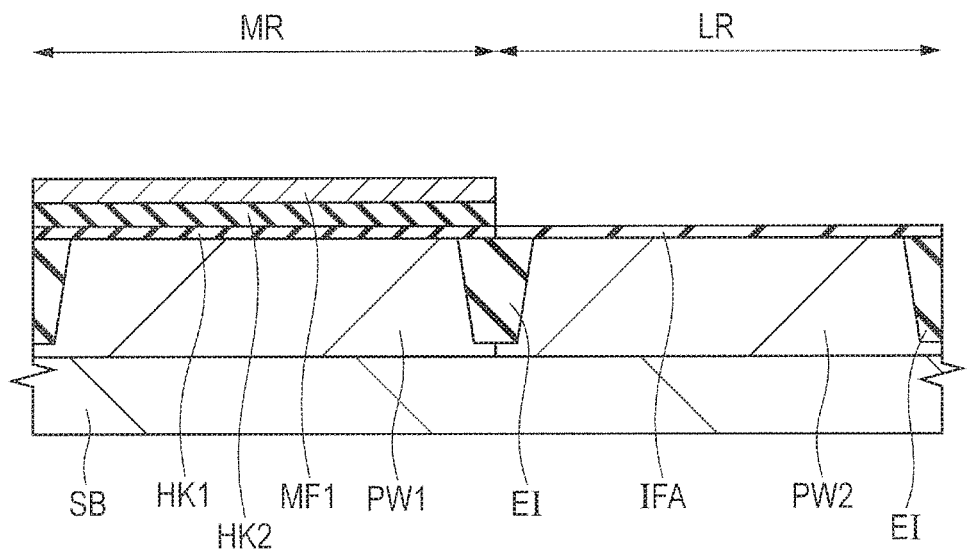
FIG. 14 is a cross-sectional view illustrating the manufacturing process of the semiconductor device, which is subsequent to FIG. 13.

Next, as shown in FIG. 14, using a photolithographic technique and an etching method, the metal film MF1, the ferroelectric film HK2, and the paraelectric film HK1 are removed from the logic circuit LR to expose the insulating film IFA.

Figure 15:
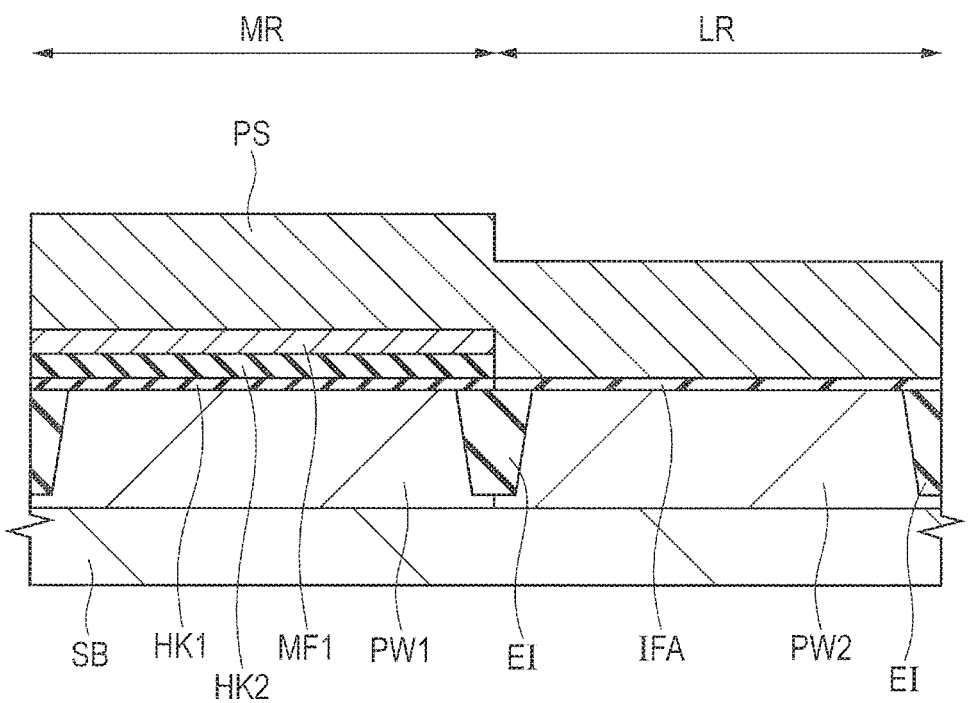
FIG. 15 is a cross-sectional view illustrating the manufacturing process of the semiconductor device, which is subsequent to FIG. 14.

Next, as shown in FIG. 15, over the main surface of the semiconductor substrate SB, a polysilicon film PS is formed. The polysilicon film PS is formed to cover the upper surface of the metal film MF1 in the memory cell region MR and the upper surface of the insulating film IFA in the logic circuit region LR.

Figure 16:
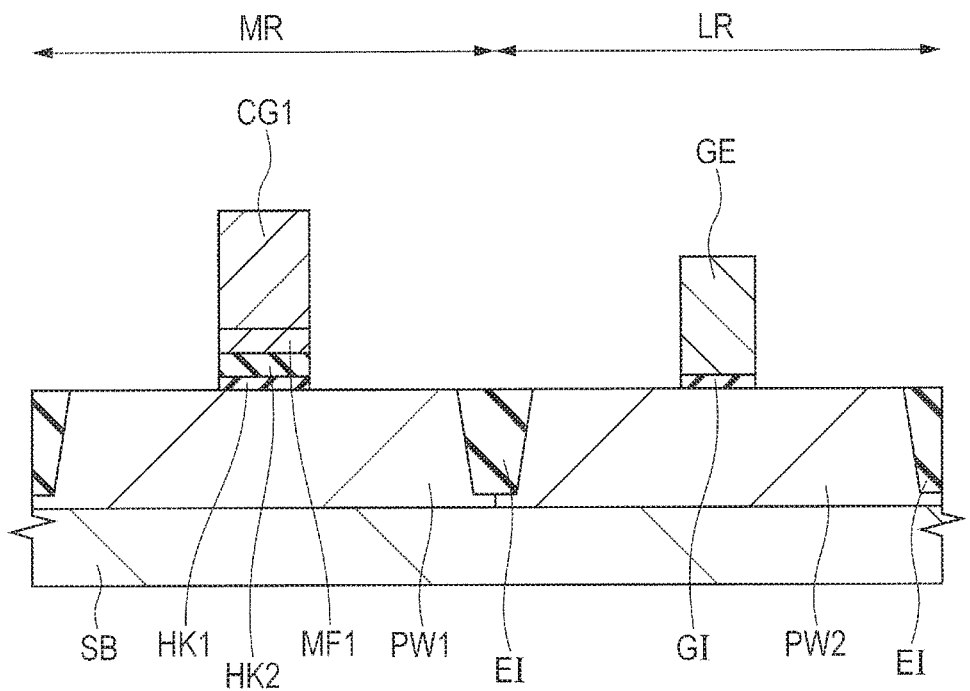
FIG. 16 is a cross-sectional view illustrating the manufacturing process of the semiconductor device, which is subsequent to FIG. 15.

Next, as shown in FIG. 16, using a photolithographic technique and a dry etching method, the polysilicon film PS, the metal film MF1, the ferroelectric film HK2, the paraelectric film HK1, and the insulating film IFA are processed to thus expose the main surface of the semiconductor substrate SB and the upper surfaces of the isolation regions EI. By this patterning step, in the memory cell region MR, the control gate electrode CG1 made of the polysilicon film PS is formed and, in the logic circuit region LR, the gate electrode GE made of the polysilicon film PS and the gate insulating film GI made of the insulating film IFA are formed. Thus, in the memory cell region MR, a multi-layer body including the paraelectric film HK1, the ferroelectric film HK2, the metal film MF1, and the control gate electrode CG1 which are stacked in this order over the main surface of the semiconductor substrate SB is formed. On the other hand, in the logic circuit region LR, a multi-layer body including the gate insulating film GI and the gate electrode GE which are stacked in this order over the main surface of the semiconductor substrate SB is formed.

Figure 17:
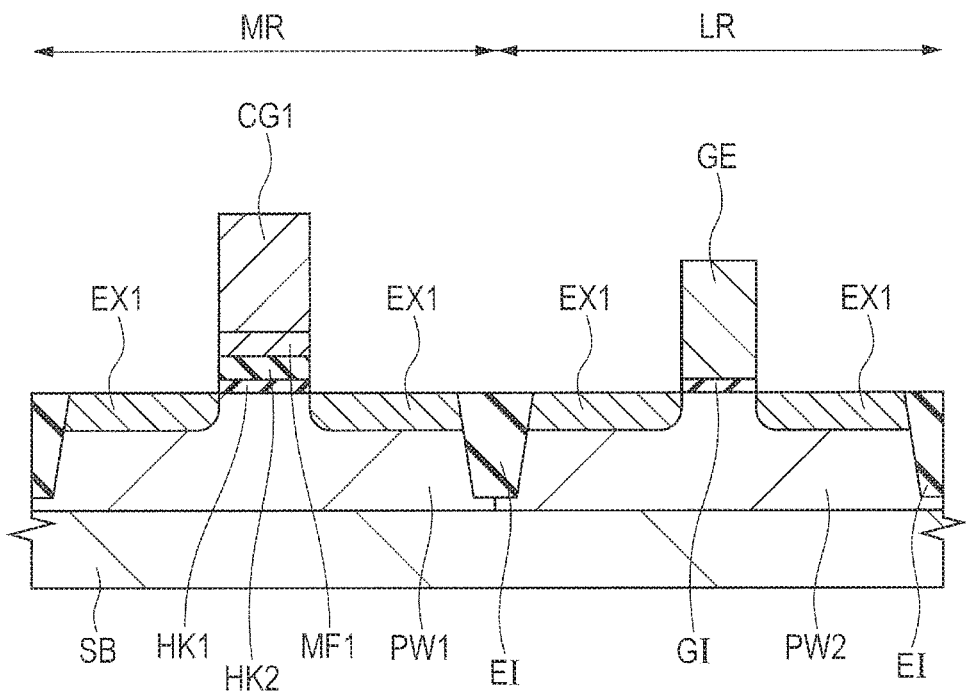
FIG. 17 is a cross-sectional view illustrating the manufacturing process of the semiconductor device, which is subsequent to FIG. 16.

Next, as shown in FIG. 17, using the control gate electrode CG1 and the gate electrode GE as a mask (ion implantation blocking mask), ion implantation is performed on the main surface of the semiconductor substrate SB. Thus, in the main surface of the semiconductor substrate SB in each of the memory cell region MR and the logic circuit region LR, the pair of extension regions EX1 as the n-type semiconductor regions are formed. The extension regions EX1 can be formed by implanting an n-type impurity (e.g., P (phosphorus) or As (arsenic)). The extension regions EX1 are each formed to reach a predetermined depth from the main surface of the semiconductor substrate SB. The depths of the extension regions EX1 are shallower than those of the isolation regions EI and the p-type wells PW1 and PW2.

Figure 18:
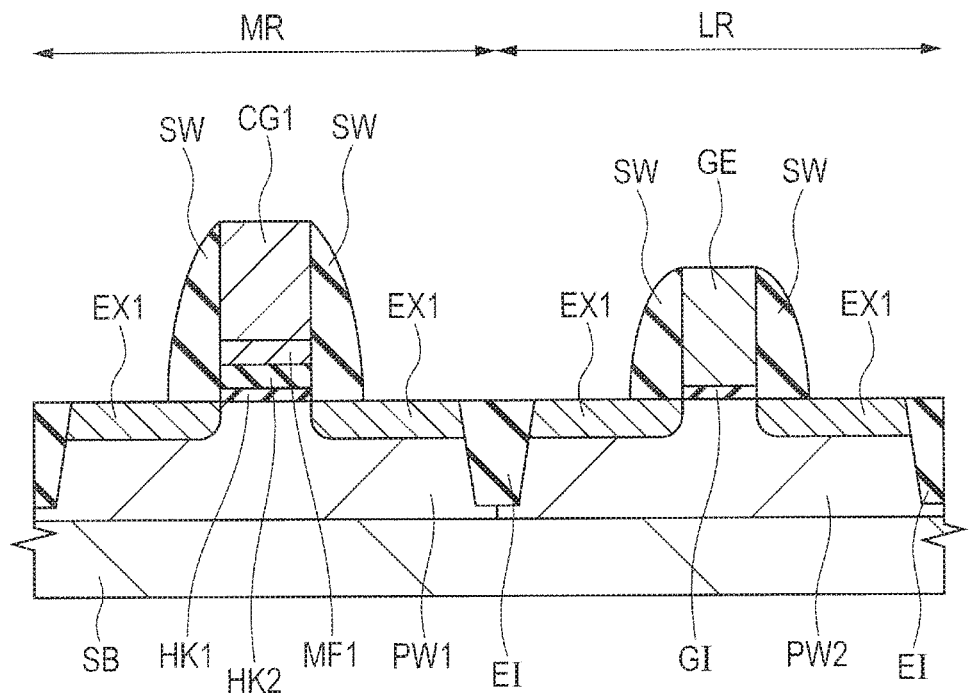
FIG. 18 is a cross-sectional view illustrating the manufacturing process of the semiconductor device, which is subsequent to FIG. 17.

Next, as shown in FIG. 18, over the semiconductor substrate SB, an insulating film is deposited by a CVD method or the like to cover each of the control gate electrode CG1 and the gate electrode GE. The insulating film is made of a multi-layer film including, e.g., a silicon oxide film and a silicon nitride film. Subsequently, the insulating film is partly removed using a dry etching method to expose the respective upper surfaces of the semiconductor substrate SB, the control gate electrode CG1, and the gate electrode GE. Thus, the sidewall spacers SW made of the insulating films covering the respective side surfaces of the control gate electrode CG1 and the gate electrode GE are self-alignedly formed.

Figure 19:
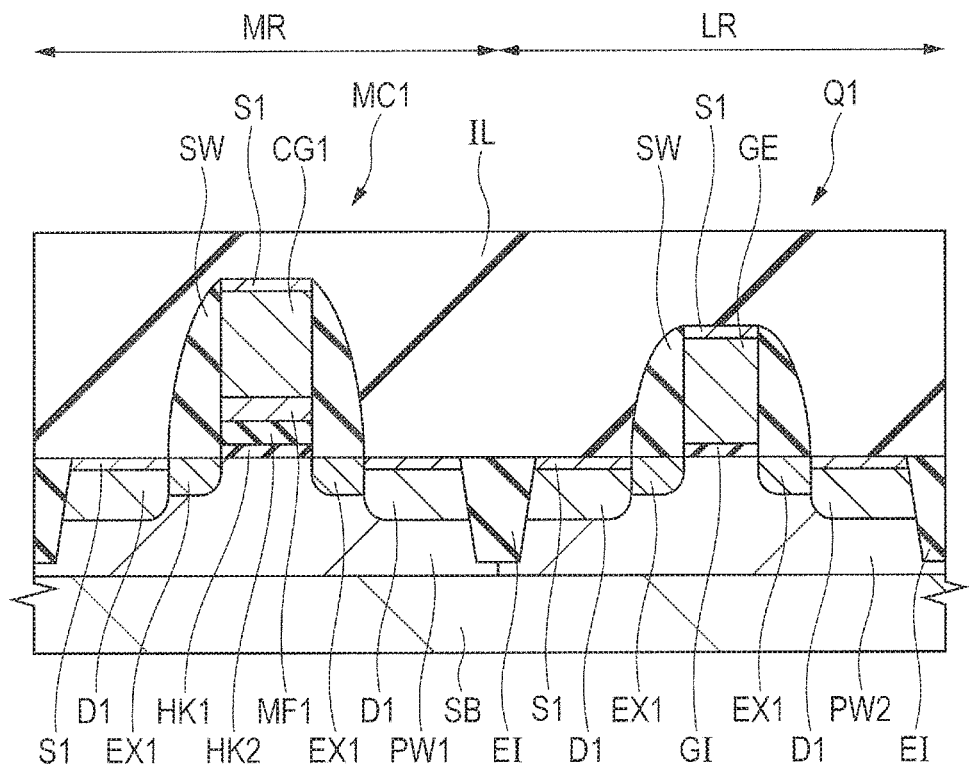
FIG. 19 is a cross-sectional view illustrating the manufacturing process of the semiconductor device, which is subsequent to FIG. 18.

Next, as shown in FIG. 19, using the control gate electrode CG1, the gate electrode GE, and the sidewall spacers SW as a mask (ion implantation blocking mask), ion implantation is performed on the main surface of the semiconductor substrate SB. Thus, in the main surface of the semiconductor substrate SB in each of the memory cell region MR and the logic circuit region LR, the pair of diffusion regions D1 as the n-type semiconductor regions are formed. The diffusion regions D1 can be formed by implanting an n-type impurity (e.g., P (phosphorus) or As (arsenic)). The diffusion regions D1 are each formed to reach a predetermined depth from the main surface of the semiconductor substrate SB. The depths of the diffusion regions D1 are deeper than those of the extension regions EX1 and shallower than those of the isolation regions EI and the p-type wells PW1 and PW2. The diffusion regions D1 have impurity concentrations higher than those of the extension regions EX1.

In the memory cell region MR, the pair of extension regions EX1 and the pair of diffusion regions D1 which are formed such that the control gate electrode CG1 is interposed therebetween are included in the source and drain regions. Specifically, the extension region EX1 and the diffusion region D1 which are in contact with each other on one of both sides of the control gate electrode CG1 serve as the source region, while the extension region EX1 and the diffusion region D1 which are in contact with each other on the other side of the control gate electrode CG1 serve as the drain region. Likewise, in the logic circuit region LR, the pair of extension regions EX1 and the pair of diffusion regions D1 which are formed such that the gate electrode GE is interposed therebetween are included in the source and drain regions.

As a result, in the memory cell region MR, the memory cell MC1 of the ferroelectric memory which includes the MISFET (MIS field effect transistor) including the paraelectric film HK1, the ferroelectric film HK2, the control gate electrode CG1, and the source and drain regions is formed. On the other hand, in the logic circuit region LR, the n-type transistor Q1 which is the MISFET (MIS field effect transistor) including the gate electrode GE and the source and drain regions is formed. The paraelectric film HK1 and the ferroelectric film HK2 function as the gate insulating film of the transistor included in the memory cell MC1.

Subsequently, a known salicide process is performed to form the silicide layers S1 in the respective upper surfaces of the control gate electrode CG1, the gate electrode GE, and the diffusion regions D1. Over the semiconductor substrate SB, e.g., a NiPt film is deposited herein by a sputtering method and then subjected to heat treatment to form the silicide layers S1. Then, the unneeded NiPt film is removed.

Subsequently, over the main surface of the semiconductor substrate SB, an insulating film is deposited by a CVD method or the like. Then, the upper surface of the insulating film is planarized to form the interlayer insulating film IL made of the insulating film. The interlayer insulating film IL is made mainly of a silicon oxide film. The interlayer insulating film IL may also have a thick silicon oxide film and a thin silicon nitride film (liner film) interposed between the silicon oxide film and each of the semiconductor substrate SB, the control gate electrode CG1, the gate electrode GE, the sidewall spacers SW, and the silicide layers S1. The upper surface of the interlayer insulating film IL can be planarized by a polishing process using, e.g., a CMP (Chemical Mechanical Polishing) method.

Figure 20:
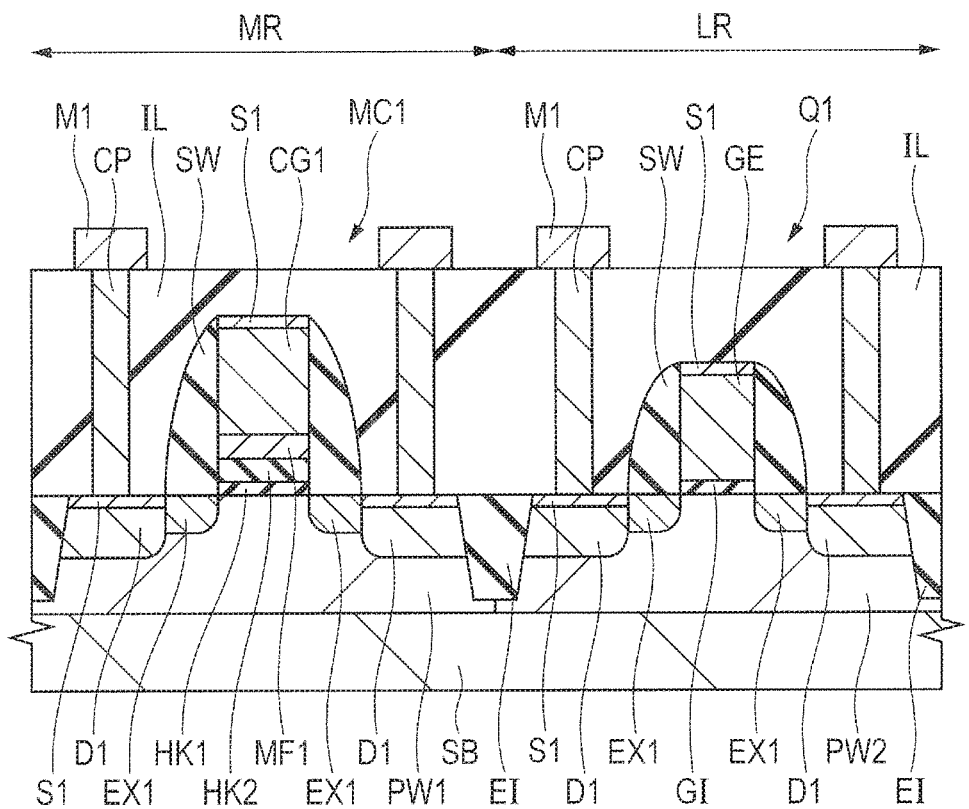
FIG. 20 is a cross-sectional view illustrating the manufacturing process of the semiconductor device, which is subsequent to FIG. 19.

Next, as shown in FIG. 20, using a photolithographic technique and a dry etching method, a plurality of contact holes (coupling holes) extending through the interlayer insulating film IL and exposing the respective upper surfaces of the plurality of silicide layers S1 are formed. Specifically, the contact holes expose the upper surfaces of the silicide layers S1 covering the respective upper surfaces of the control gate electrode CG1, the gate electrode GE, and the diffusion regions D1. The respective contact holes provided immediately above the control gate electrode CG1 and the gate electrode GE are formed in a region not shown.

Subsequently, over the main surface of the semiconductor substrate SB, a metal film is formed using, e.g., a sputtering method. Thus, the metal film is embedded in each of the plurality of contact holes. Then, polishing is performed using a CMP method to expose the upper surface of the interlayer insulating film IL. In this polishing step, the metal film is removed from over the interlayer insulating film IL to form the plugs CP each made of the metal film in the respective contact holes. The plugs CP are made mainly of, e.g., W (tungsten). It is conceivable that each of the plugs CP includes, e.g., a main conductor film made of W (tungsten) and a barrier conductor film covering the side and bottom surfaces of the main conductor film. However, in the drawings, the illustration of a multi-layer structure including the main conductor film and the barrier conductor film is omitted, and the plug CP is shown as a single conductor film. As the material of the barrier conductor film, e.g., TiN (titanium nitride) can be used.

Subsequently, over the interlayer insulating film IL, the wires M1 are formed. Each of the wires M1 is made of a multi-layer structure including a barrier conductor film (such as, e.g., a titanium nitride film, a tantalum film, or a tantalum nitride film) and a main conductor film (copper film) formed over the barrier conductor film. In the drawing, for simpler illustration, the barrier conductor film and the main conductor film are integrally shown as each of the wires M1.

The wires M1 can be formed by, e.g., a so-called single damascene method. Specifically, by forming an interlayer insulating film having wire trenches over the interlayer insulating film IL and embedding a metal film in the wire trenches, the wires M1 can be formed. However, the illustration of the interlayer insulating film located lateral to the wires M1 is omitted herein.

By the process described above, the semiconductor device in the present first embodiment is generally completed.

<Effects of Manufacturing Method of Semiconductor Device>

Next, a description will be given of the effects of the manufacturing method of the semiconductor device in the present first embodiment.

As described above about the effects of the semiconductor device in the present first embodiment, in the present first embodiment, to prevent charges from being trapped in the gate insulating film including the ferroelectric film HK2, the paraelectric film HK1 is formed as the interfacial layer (block layer) between the ferroelectric film HK2 and the semiconductor substrate SB. This can prevent the electric field induced in the ferroelectric film HK2 from causing dielectric breakdown in the interfacial layer. Therefore, it is possible to improve the reliability of the semiconductor device.

Also, in the present first embodiment, as described using FIG. 3, the crystals GR2 in the ferroelectric film HK2 are formed larger than the crystals GR1 in the paraelectric film HK1 to allow the residual polarization in the ferroelectric film HK2 to be increased. This can reduce the operating voltage of the ferroelectric film and improve the information retention property of the ferroelectric memory. Therefore, it is possible to improve the performance of the semiconductor device. Since the paraelectric film HK1 is formed as the interfacial layer in contact with the lower surface of the ferroelectric film HK2, the crystals GR2 can be formed larger than the crystals GR1.

Also, in the present first embodiment, in the second heat treatment described using FIGS. 12 and 13, heating is performed using the microwave having the electric field which vibrates in the direction perpendicular to the main surface of the semiconductor substrate SB. This allows an orthorhombic crystal polarized in the perpendicular direction to be grown in the ferroelectric film HK2. In other words, it is possible to prevent a crystal which is polarized in a direction other than the perpendicular direction from growing in the ferroelectric film HK2. As a result, the plurality of crystals included in the ferroelectric film HK2 are polarized in equal directions to allow the residual polarization in the ferroelectric film HK2 to be increased.

By performing the second heat treatment using the microwave, it is possible to achieve crystallization at a low temperature of not more than 400° C. and allow an orthorhombic crystal to be easily formed in the ferroelectric film HK2 formed thereby. Specifically, by increasing the ratio of the orthorhombic crystals to all the crystals included in the ferroelectric film HK2, it is possible to increase the residual polarization in the ferroelectric film HK2.

By performing the second heat treatment with the metal film MF1 being formed over the high-k film AM2 (see FIG. 11), it is possible to increase the likelihood of formation of the orthorhombic crystals in the ferroelectric film HK2.

As described above, by increasing the likelihood of formation of the orthorhombic crystals in the ferroelectric film HK2, it is possible to enhance the polarization performance of the ferroelectric film HK2. Briefly, even when the voltage applied to the control gate electrode CG1 of the memory cell MC1 is low, the ferroelectric film HK2 can be polarized to allow a reduction in the power consumption of the ferroelectric memory. In addition, the increased residual polarization allows an improvement in retention property. Therefore, it is possible to improve the performance of the semiconductor device.

<Modification 1>

In the present first modification, a description will be given of formation of a thin insulating film between the paraelectric layer as the interfacial layer and the main surface of the semiconductor substrate.

Figure 21:
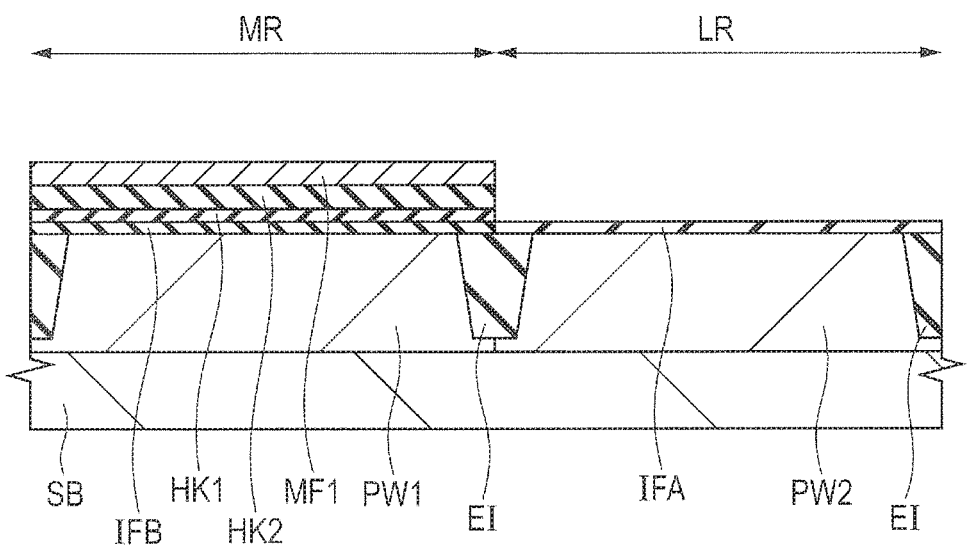
FIG. 21 is a cross-sectional view illustrating a manufacturing process of a semiconductor device as a first modification of the first embodiment of the present invention.

In a manufacturing process of a semiconductor device in the present first modification, after the insulating film IFA is processed by the process described using FIG. 7, as shown in FIG. 21, an insulating film IFB is formed over the main surface of the semiconductor substrate SB of the memory cell MC1 using, e.g., an oxidation method. Then, the steps described using FIGS. 8 to 13 are performed. Alternatively, after the insulating film IFA is formed by the step described using FIG. 6, it may also be possible to perform the steps described using FIGS. 8 to 13 with the insulating film IFA remaining in the memory cell region MR without performing the step of removing the insulating film IFA described above using FIG. 7. The insulating film IFB is made of, e.g., a silicon oxide film and the thickness thereof is, e.g., 1 to 2 nm.

Figure 22:
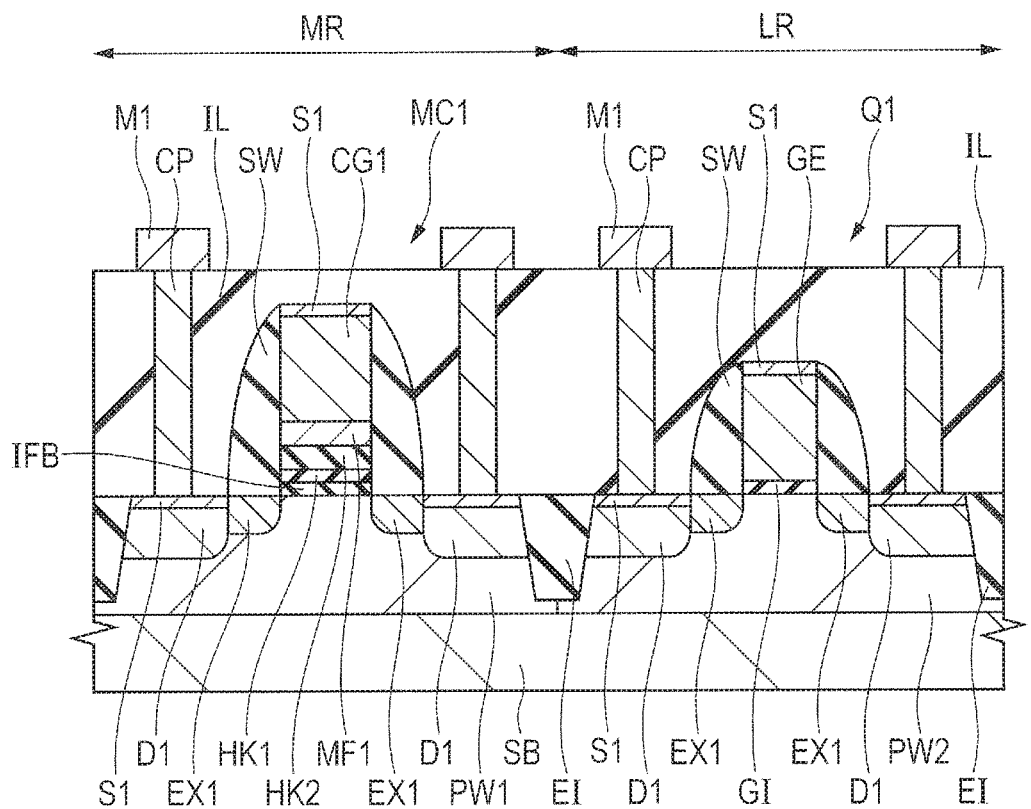
FIG. 22 is a cross-sectional view illustrating the manufacturing process of the semiconductor device, which is subsequent to FIG. 21.

Subsequently, by performing the same steps as those described using FIGS. 14 to 20, the semiconductor device in the present first modification shown in FIG. 22 can be formed. Consequently, the memory cell MC1 in the semiconductor device in the present first modification has the insulating film IFB, the paraelectric film HK1, the ferroelectric film HK2, and the metal film MF1 which are stacked in this order over the main surface of the semiconductor substrate SB between the main surface of the semiconductor substrate SB and the control gate electrode CG1.

In the present first modification, between the paraelectric film HK1 and the main surface of the semiconductor substrate SB, the insulating film IFB is formed as a portion of the interfacial layer (block) layer. This can prevent charges from being trapped in the ferroelectric film HK2 and the paraelectric film HK1 during the operation of the memory cell MC1.

Specifically, when a positive voltage is applied to the control gate electrode CG1 to bring the memory cell MC1 into an erased state (state where the threshold voltage of the transistor is low), it is possible to prevent charges from being trapped in the ferroelectric film HK2 and the paraelectric film HK1 and increasing the threshold voltage of the transistor. On the other hand, when a negative voltage is applied to the control gate electrode CG1 to bring the memory cell MC1 into a written state (state where the threshold voltage of the transistor is high), it is possible to prevent the charges trapped in the ferroelectric film HK2 and the paraelectric film HK1 from being extracted therefrom and reducing the threshold voltage of the transistor. This can prevent the deterioration of the retention property of the memory cell MC1. This can also prevent the deterioration of the performance of the ferroelectric memory which switches the memory cell MC1 between the written state and the erased state by controlling the threshold voltage. In addition, it is possible to reduce the power consumption of the memory cell MC1.

<Modification 2>

In the present second modification, a description will be given of the case where another metal film is further inserted between the interfacial layer and the ferroelectric film.

Figure 23:
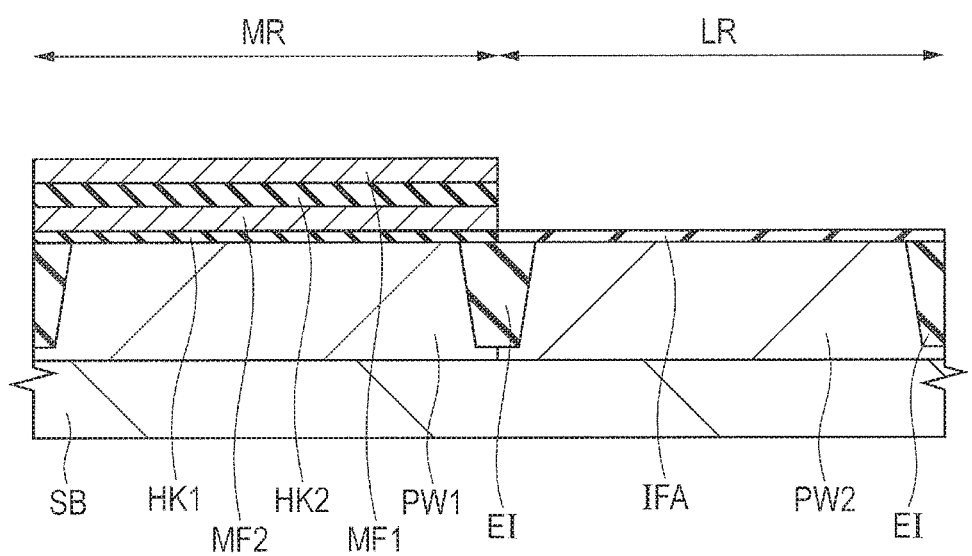
FIG. 23 is a cross-sectional view illustrating a manufacturing process of a semiconductor device as a second modification of the first embodiment of the present invention.

In a manufacturing process of the semiconductor device in the present second modification, after the steps described using FIGS. 5 to 10 are performed, as shown in FIG. 23, a metal film MF2 is formed over the paraelectric film HK1 using, e.g., a CVD method or a sputtering method. The metal film MF2 is made of, e.g., a TiN (titanium nitride) film and has a thickness of, e.g., 10 to 20 nm. Then, the steps descried using FIGS. 11 to 13 are performed.

Figure 24:
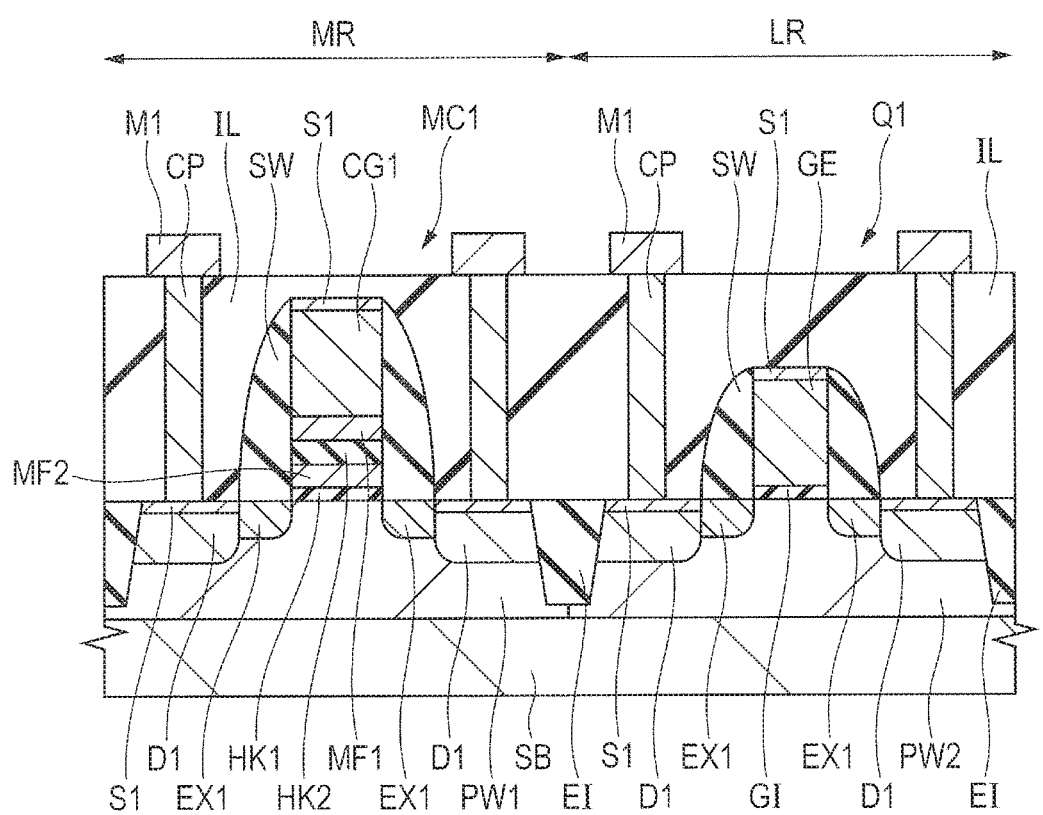
FIG. 24 is a cross-sectional view illustrating the manufacturing process of the semiconductor device, which is subsequent to FIG. 23.

Subsequently, by performing the same steps as those described using FIGS. 14 to 20, the semiconductor device in the present second modification shown in FIG. 24 can be formed. Consequently, the memory cell MC1 in the semiconductor device in the present second modification has the paraelectric film HK1, the metal film MF2, the ferroelectric film HK2, and the metal film MF1 which are stacked in this order over the main surface of the semiconductor substrate SB between the main surface of the semiconductor substrate SB and the control gate electrode CG1.

When the metal film MF2 is not formed, the threshold voltage of the transistor included in the memory cell MC1 is determined directly by the polarization of each of the crystal grains of the ferroelectric film HK2 so that a local threshold variation is likely to occur. By contrast, in the present second modification, the metal film MF2 in an electrically floating state functions as an electrode and equalizes the electric field resulting from the polarization of the ferroelectric film HK2. This can prevent the threshold voltage of the transistor from varying and thus improve the performance and reliability of the semiconductor device.

In the case where the metal film is inserted between the interfacial layer and the ferroelectric film, when the electrostatic capacitance of the interfacial layer is low, a problem arises in that the electric field is less likely to be applied to the ferroelectric film to increase a voltage for causing polarization inversion. When the interfacial layer is made of a silicon oxide film or a silicon nitride film as described using FIG. 75, the electrostatic capacitance of the interfacial layer is small so that a voltage for causing polarization inversion as described above, i.e., voltage applied to the control gate electrode CG1 increases. Consequently, the power consumption of the ferroelectric memory increases to degrade the performance of the semiconductor device.

By contrast, in the present second modification, the metal film MF2 is inserted between the paraelectric film HK1 as the interfacial layer and the ferroelectric film HK2, and the interfacial layer is formed of the paraelectric film HK1 having a dielectric constant (relative permittivity) higher than that of silicon nitride. This prevent a situation in which the electric field generated by the voltage applied to the control gate electrode CG1 is less likely to be applied to the ferroelectric film HK2. Consequently, even a low gate voltage can control the polarization of the ferroelectric film HK2 and reduce the power consumption of the ferroelectric memory. Therefore, it is possible to improve the performance of the semiconductor device.

Second Embodiment

<Structure of Semiconductor Device>

Figure 25:
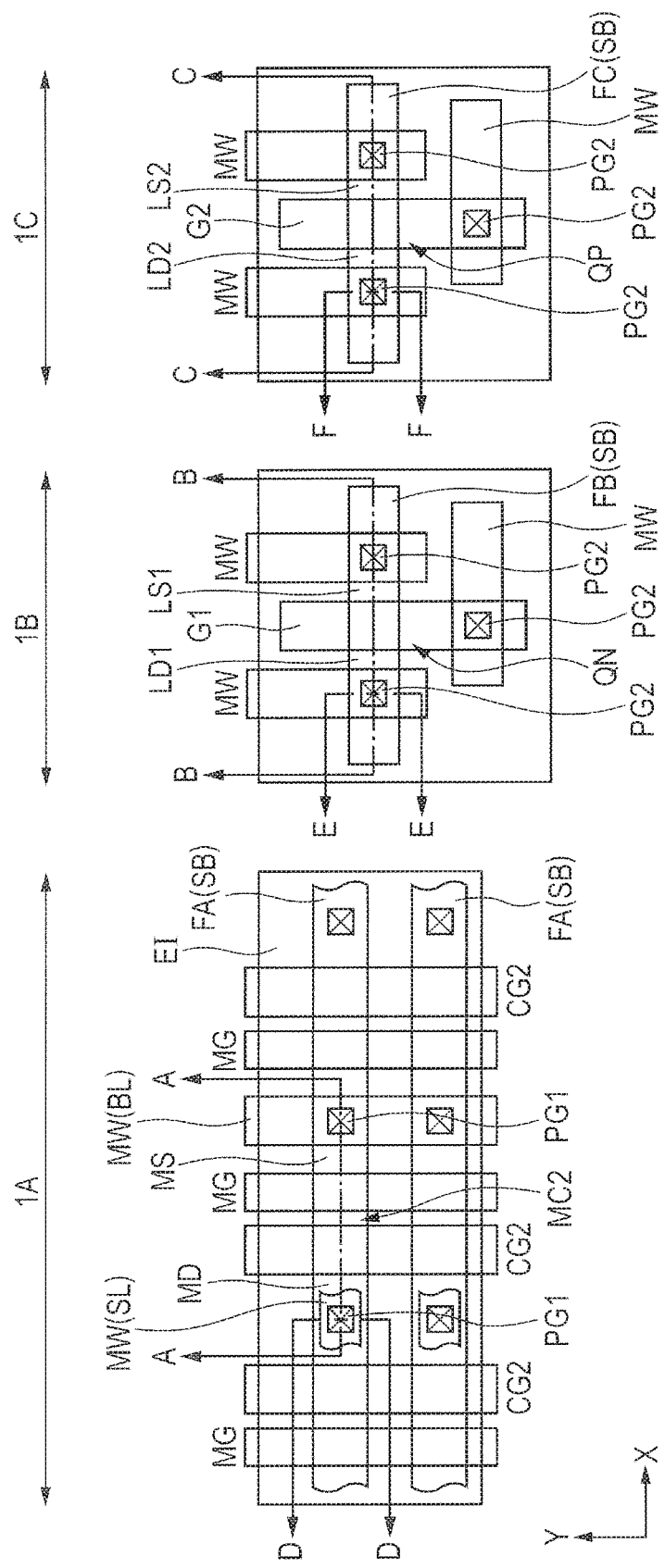
FIG. 25 is a plan view showing a semiconductor device as a second embodiment of the present invention.
Figure 26:
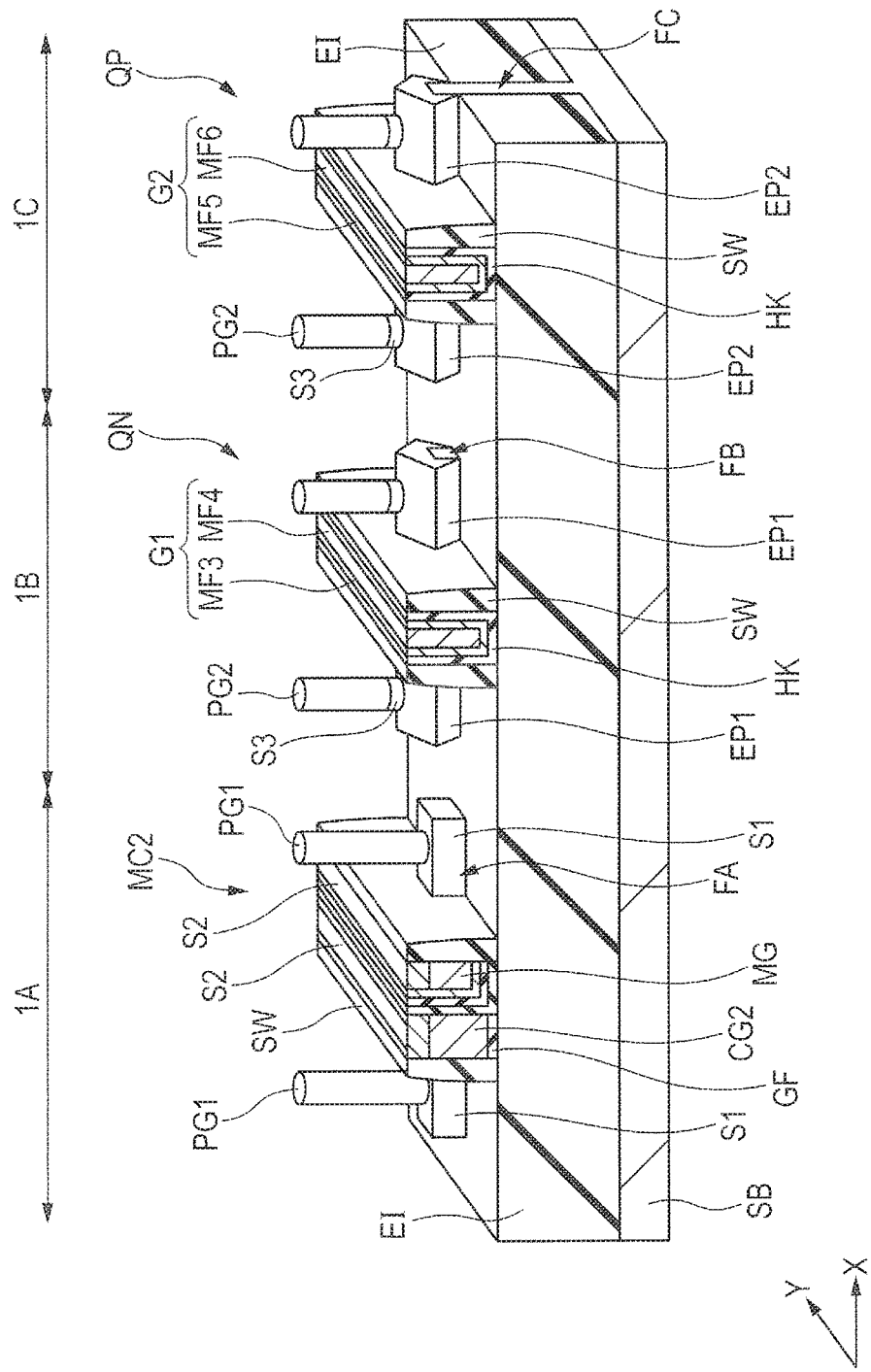
FIG. 26 is a perspective view showing the semiconductor device as the second embodiment of the present invention.
Figure 27:
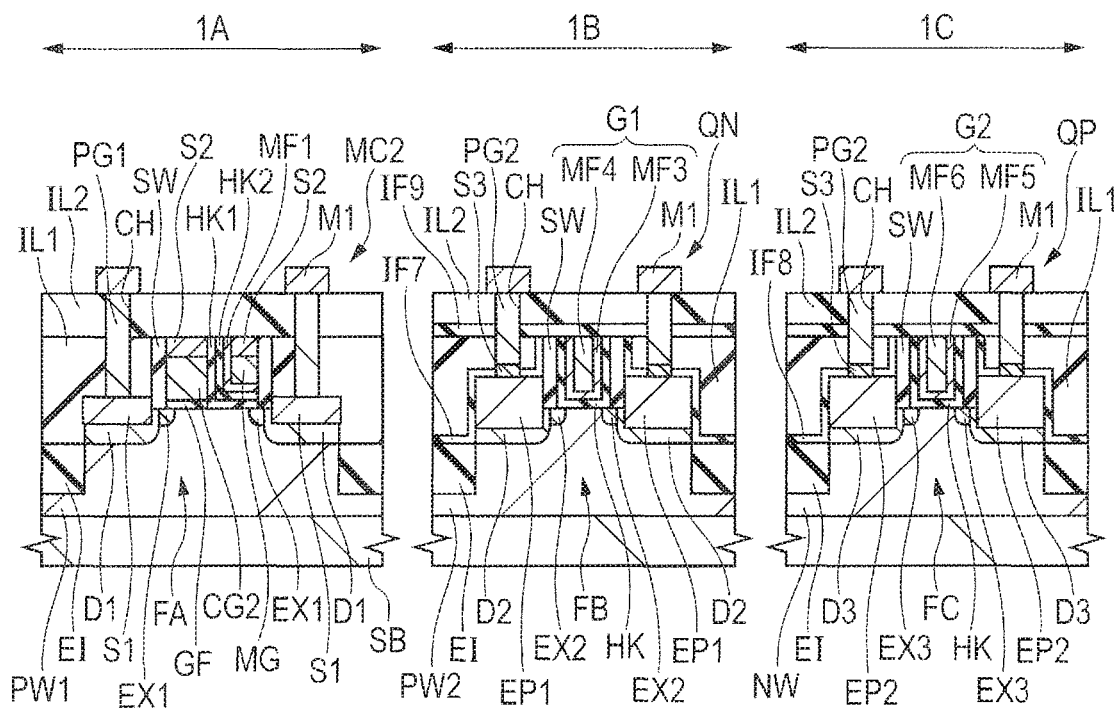
FIG. 27 is a cross-sectional view showing the semiconductor device as the second embodiment of the present invention.
Figure 28:
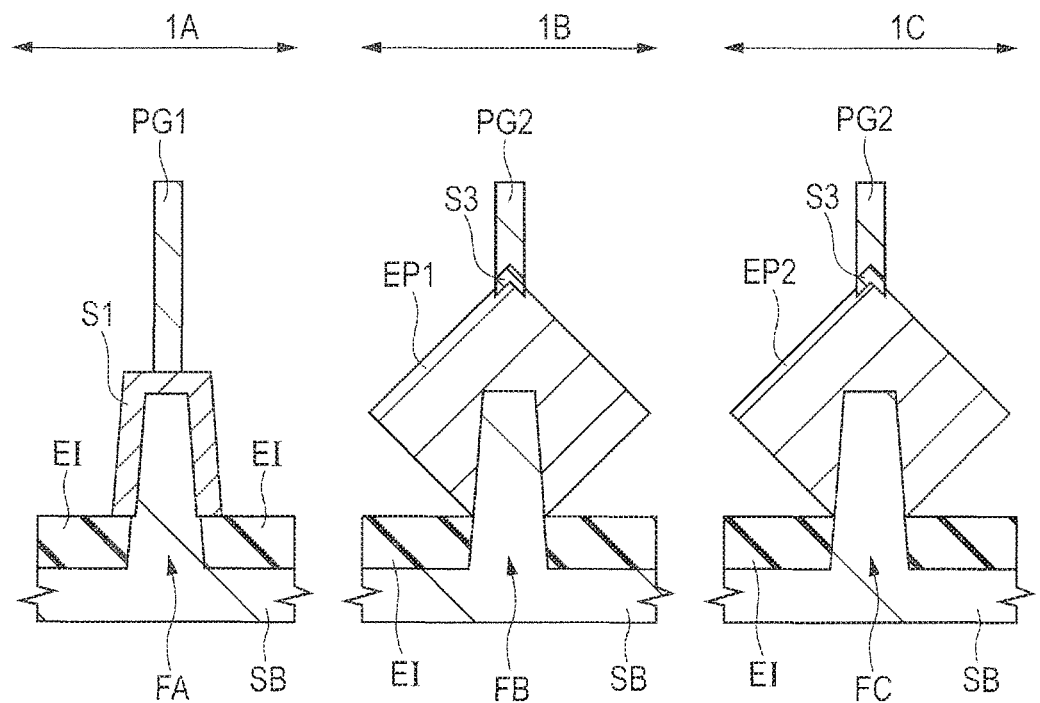
FIG. 28 is a cross-sectional view showing the semiconductor device as the second embodiment of the present invention.

The following will describe a structure of a semiconductor device in the present second embodiment. FIG. 25 is a plan view of the semiconductor device in the present second embodiment. FIG. 26 is a perspective view of the semiconductor device in the present second embodiment. FIGS. 27 and 28 are cross-sectional views of the semiconductor device in the present second embodiment. Note that, in FIGS. 26 and 28, the illustration of wells is omitted. Also, in FIG. 28, the illustration of source and drain regions is omitted.

In FIG. 25, a plan view of a memory cell array is shown in the memory cell region 1A, a plan view of an n-type transistor QN included in a logic circuit in a logic circuit region or the like is shown in the nMIS region 1B, and a plan view of a p-type transistor QP included in the logic circuit in the logic circuit region or the like is shown in a pMIS region 1C. As an example of the n-type transistor QN, an n-type MISFET is shown. As an example of the p-type transistor QP, a p-type MISFET is shown. The following may refer to the n-type MISFET as nMIS and refer to the p-type MISFET as the pMIS.

Each of memory cells MC2 formed in the memory cell region 1A is formed in, e.g., the ferroelectric memory CC5 in FIG. 1. The n-type transistor QN in the nMIS region 1B and the p-type transistor QP in the pMIS region 1C are formed in, e.g., the RAM CC2 and the CPU CC1 in FIG. 1 or the like.

As shown in FIG. 25, in the memory cell region 1A, a plurality of fins FA extending in the X-direction are equidistantly arranged in a Y-direction. The X-direction and the Y-direction are directions along the main surface of the semiconductor substrate SB. The X-direction is orthogonal to the Y-direction. For example, the fins FA are cuboidal protruding portions (projecting potions) selectively protruding from the main surface of the semiconductor substrate SB and having wall-like (plate-like) shapes. The lower end portions of the fins FA are surrounded by the isolation region EI covering the main surface of the semiconductor substrate SB. Each of the fins FA is a portion of the semiconductor substrate SB serving as the active region of the semiconductor substrate SB. In plan view, the spaces between the adjacent fins FA are filled with the isolation region EI so that the isolation region EI surrounds the peripheries of the fins FA. Each of the fins FA is the active region for forming the memory cell MC2.

Over the plurality of fins FA, a plurality of control gate electrodes CG2 and a plurality of memory gate electrodes MG each extending in the Y-direction are disposed. In the upper surfaces of the fins FA, drain regions MD closer to the control gate electrodes CG2 and source regions MS closer to the memory gate electrodes MG are formed such that the control gate electrodes CG2 and the memory gate electrodes MG are interposed therebetween. Specifically, the one of the control gate electrodes CG2 and the one of the memory gate electrodes MG which are adjacent to each other in the X-direction are located between the source region MS and the drain region MD.

The drain regions MD and the source regions MS are n-type semiconductor regions. Each of the drain regions MD is formed between the two control gate electrodes CG2 adjacent to each other in the X-direction, while each of the source regions MS is formed between the two memory gate electrodes MG adjacent to each other in the X-direction. Each of the memory cells MC2 is a nonvolatile storage element having the control gate electrode CG2, the memory gate electrode MG, the drain region MD, and the source region MS. In the following, the source region MS and the drain region which are included in the memory cell MC2 may be referred to also as source and drain regions.

The two memory cells MC2 adjacent to each other in the X-direction share the drain region MD or the source region MS. The two memory cells MC2 sharing the drain region MD are line-symmetric in the X-direction relative to the drain region MD extending in the Y-direction. The two memory cells MC2 sharing the source region MS are line-symmetric in the X-direction relative to the source region MS extending in the Y-direction.

In each of the fins FA, the plurality of memory cells MC2 arranged in the X-direction are formed. The respective drain regions MD of the individual memory cells MC2 are electrically coupled to a source line SL made of the wire M1 extending in the X-direction via plugs PG1 (plugs) formed in contact holes extending through an interlayer insulating film (not shown) formed over the memory cells MC2. On the other hand, the respective source regions MS of the plurality of memory cells MC2 arranged in the Y-direction are electrically coupled to a bit line BL made of the wire M1 extending in the Y-direction.

In the nMIS region 1B, a fin FB extending in, e.g., the X-direction is formed. The fin FB is a portion of the semiconductor substrate SB, similarly to the fins FA, and has a wall-like (plate-like) shape protruding over the main surface of the semiconductor substrate SB. The fin FB is the active region of the semiconductor substrate SB. The lower end portion of the fin FB is surrounded by the isolation region EI covering the main surface of the semiconductor substrate SB. Over the fin FB, a gate electrode G1 is disposed to extend in the Y-direction and, over the upper surface of the fin FB, a drain region LD1 and a source region LS1 are formed such that the gate electrode G1 is interposed therebetween. The drain region LD1 and the source region LS1 are n-type semiconductor regions.

The n-type transistor QN has the gate electrode G1, the drain region LD1, and the source region LS1. The gate electrode G1, the drain region LD1, and the source region LS1 are electrically coupled to the wires M1 via plugs PG2 formed in contact holes. The fin FB is the active region for forming the n-type transistor QN.

In the pMIS region 1C, a fin FC extending in the X-direction and the p-type transistor QP located thereover are formed. The layout of the p-type transistor QP including a gate electrode G2, a drain region LD2, and a source region LS2 is the same as that of, e.g., the n-type transistor QN.

Each of the fins FA, FB, and FC is, e.g., a cuboidal protruding portion protruding from the main surface of the semiconductor substrate SB in a direction perpendicular to the main surface. Each of the fins FA, FB, and FC need not necessarily have a cuboidal shape, but may also have a rectangular shape having rounded corners in cross-sectional view in a short-side direction. Also, as shown in FIG. 28, the respective side surfaces of the fins FA, FB, and FC may be perpendicular to the main surface of the semiconductor substrate SB or may have inclination angles close to 90 degrees. In short, the cross-sectional shape of each of the fins FA, FB, and FC is either a cuboid or a trapezoid. The respective side surfaces of the fins FA, FB, and FC are obliquely inclined relative to the main surface of the semiconductor substrate SB.

As shown in FIG. 25, the direction in which each of the fins FA, FB, and FC extends in plan view is the long-side direction of each of the fins, while the direction orthogonal to the long-side direction is the short-side direction of each of the fins. Thus, the length of each of the fins is larger than the width of the fin. Each of the fins FA, FB, and FC may have any shape as long as the fin is a protruding portion having a length, a width, and a height. For example, each of the fins FA, FB, and FC may also have a meandering layout in plan view.

FIGS. 26 to 28 show the memory cell region 1A, the nMIS region 1B, and the pMIS region 1C which are arranged in this order in a left-to-right direction. In FIG. 26, the illustration of the isolation region EI as well as the interlayer insulating film and the wires over each of the elements is omitted. Over the fins FA included in the semiconductor substrate SB in the memory cell region 1A, the memory cells MC2 are formed. Over the fin FB included in the semiconductor substrate SB in the nMIS region 1B, the n-type transistor QN is formed. Over the fin FC included in the semiconductor substrate SB in the pMIS region 1C, the p-type transistor QP is formed.

FIG. 27 shows a cross section of the semiconductor elements along the line A-A in FIG. 25, a cross section of the semiconductor elements along the line B-B in FIG. 25, and a cross section of the semiconductor elements along the line C-C in FIG. 25 in this order in the left-right direction. FIG. 28 shows a cross section of the semiconductor element along the line D-D in FIG. 25, a cross section of the semiconductor element along the line E-E in FIG. 25, and a cross section of the semiconductor element along the line F-F in FIG. 25 in this order in the left-right direction. Over each of the fins, the plurality of elements are formed but, in FIGS. 26 and 27, only one element is shown over each of the fins.

As shown in FIG. 26, the control gate electrode CG2 and the memory gate electrode MG extend in the Y-direction so as to mount over the fin FA, the gate electrode G1 extends in the Y-direction so as to mount over the fin FB, and the gate electrode G2 extends in the Y-direction so as to mount over the fin FC. The respective upper surfaces of the control gate electrode CG2 and the memory gate electrode MG are covered with silicide layers S2. The silicide layers S2 are made of, e.g., NiSi (nickel silicide). Note that the silicide layers S2 may also contain Pt (platinum).

As shown in FIGS. 26 to 28, the side and upper surfaces of the fin FA in which the diffusion regions D1 included in the source and drain regions in the memory cell region 1A are formed are covered with the silicide layers S1. The silicide layers S1 are made of, e.g., NiSi (nickel silicide). On the other hand, the side and upper surfaces of the fin FB in which the diffusion regions D2 included in the source and drain regions in the nMIS region 1B are formed are covered with epitaxial layers (semiconductor layers) EP1. Likewise, the side and upper surfaces of the fin FC in which diffusion regions D3 included in the source and drain regions in the pMIS region 1C are formed are covered with epitaxial layers (semiconductor layers) EP2.

The silicide layers S1 and the epitaxial layers EP1 and EP2 are each formed over the isolation region EI. The silicide layers S1 are each made of a layer extending along the upper and side surfaces of the fin FA.

On the other hand, each of the epitaxial layers EP1 and EP2 formed by an epitaxial growth method has a rhomboidal shape in a cross section (see FIG. 28) along the Y-direction. Specifically, the side surface of each of the epitaxial layers EP1 in the nMIS region 1B which is not in contact with the fin FB has a lower side surface and an upper side surface. The lower side surface is inclined so as to go away from the fin FB in a direction along the main surface of the semiconductor substrate SB as the distance from the isolation region EI increases upward. The upper side surface is inclined so as to come closer to the fin FB in the direction along the main surface of the semiconductor substrate SB as the distance from the isolation region EI increases upward. The upper end of the lower side surface is coupled to the lower end of the upper side surface.

In other words, in the Y-direction, the width of the epitaxial layer EP1 between the left terminal portion thereof and the right terminal portion thereof is larger at the middle portion between the upper and lower ends of the epitaxial layer EP1 than at the upper and lower ends thereof. Note that each of the epitaxial layers EP2 in the pMIS region 1C also has the same shape as that of each of the epitaxial layers EP1 in the nMIS region 1B. The epitaxial layers EP1 in the nMIS region 1B are made of, e.g., SiP (silicon phosphide) or SiC (silicon carbide). The epitaxial layers EP2 in the pMIS region 1C are made of SiGe (silicon germanium).

The epitaxial layers EP1 in the nMIS region 1B are semiconductor layers in which an n-type impurity (e.g., P (phosphorus) or As (arsenic)) is introduced and included in the diffusion regions D2 of the n-type transistor QN. The epitaxial layers EP2 in the pMIS region 1C are semiconductor layers in which a p-type impurity (e.g., B (boron)) is introduced and included in the diffusion regions D3 of the p-type transistor QP.

As shown in FIGS. 26 and 27, each of the lower portions of the respective side surfaces of the fins FA, FB, and FC is surrounded by the isolation region EI formed over the main surface of the semiconductor substrate SB. In short, the individual fins are isolated from each other by the isolation region EI. In each of the fins FA, the p-type well PW1 as the p-type semiconductor region is formed to extend from the upper surface of the fin FA to the lower portion thereof. Likewise, in the fin FB, the p-type well PW2 as the p-type semiconductor region is formed to extend from the upper surface of the fin FB to the lower portion thereof. In the fin FC, an n-type well NW as an n-type semiconductor region is formed to extend from the upper surface of the fin FC to the lower portion thereof.

Over the upper and side surfaces of each of the fins FA, the control gate electrode CG2 is formed via a gate insulating film GF. In the region adjacent to the control gate electrode CG2 in the long-side direction (X-direction) of the fin FA, the memory gate electrode MG is formed via a multi-layer film including the paraelectric film HK1, the ferroelectric film HK2, and the metal film MF1. Between the control gate electrode CG2 and the memory gate electrode MG, the multi-layer film is interposed. The control gate electrode CG2 and the memory gate electrode MG are electrically isolated from each other by the paraelectric film HK1 as the insulating film and the ferroelectric film HK2 as the insulating film. Between the memory gate electrode MG and the upper surface of the fin FA, the multi-layer film including the paraelectric film HK1, the ferroelectric film HK2, and the metal film MF1 which are stacked in this order over the fin FA is interposed. The multi-layer film is formed continuously so as to cover the side and bottom surfaces of the memory gate electrode MG. Consequently, each of the paraelectric film HK1, the ferroelectric film HK2, and the metal film MF1 which are included in the multi-layer film has an L-shaped cross-sectional shape.

The gate insulating film GF is a thermal oxidation film (silicon oxide film) formed by thermally oxidizing the upper and side surfaces of the fin FA as the protruding portion of the semiconductor substrate SB made of silicon. The gate insulating film GF has a thickness of, e.g., 2 nm. The paraelectric film HK1, the ferroelectric film HK2, and the metal film MF1 are made of the same materials as in the foregoing first embodiment and have the same thicknesses as in the foregoing first embodiment.

As shown in the memory cell region 1A, in the short-side direction (Y-direction) of the fin FA, the control gate electrode CG2 extends along the upper and side surfaces of the fin FA and the upper surface of the isolation region EI via the gate insulating film GE. Likewise, in the short-side direction of the fin FA, the memory gate electrode MG extends along the upper and side surfaces of the fin FA and the upper surface of the isolation region EI via the multi-layer film. Over the respective main surfaces of the control gate electrode CG2 and the memory gate electrode MG, the silicide layers S2 are formed.

The side surfaces of a pattern including the control gate electrode CG2, the memory gate electrode MG, the gate insulating film GF, the paraelectric film HK1, the ferroelectric film HK2, the metal film MF1, and the silicide layers S2 are covered with the sidewall spacers SW. Each of the sidewall spacers SW is made of a multi-layer structure including, e.g., a silicon nitride film and a silicon oxide film. The silicide layers S1 cover the respective surfaces of the pattern including the control gate electrode CG2 and the fins FA exposed from the foregoing sidewall spacers SW.

As shown in FIG. 27, the pair of source and drain regions are formed in the upper surface of the fin FA such that the upper surface of the fin FA located immediately below the pattern including the control gate electrode CG2 is interposed therebetween. Each of the source region and the drain region includes the extension region EX1 as an n$^-$-type semiconductor region and the diffusion region D1 as an n$^+$-type semiconductor region. The diffusion region D1 has an impurity concentration higher than that of the extension region EX1 and is formed deeper than the extension region EX1. In each of the source region and the drain region, the extension region EX1 and the diffusion region D1 are in contact with each other. The extension region EX1 is located closer to the upper surface of the fin FA immediately below the foregoing pattern, i.e., closer to the channel region than the diffusion region D1.

By thus forming the source and drain regions each having a structure including the lower-impurity-concentration extension region EX1 and the higher-impurity-concentration diffusion region D1, i.e., an LDD structure, it is possible to improve the short channel property of the transistor having the source and drain regions. The source region corresponds to the source region MS shown in FIG. 25. The drain region corresponds to the drain region MD shown in FIG. 25.

Over the fin FA and the isolation region EI, an interlayer insulating film IL1 made of, e.g., a silicon oxide film is formed. Over the respective upper surfaces of the interlayer insulating film IL1, the control gate electrode CG2, the memory gate electrode MG, the sidewall spacers SW, and the silicide layers S2, an interlayer insulating film IL2 made of, e.g., a silicon oxide film is formed. The upper surface of the interlayer insulating film IL1 is planarized to be generally flush with the respective upper surfaces of the paraelectric film HK1, the ferroelectric film HK2, the metal film MF1, the sidewall spacers SW, and the silicide layers S2.

Over the interlayer insulating film IL2, the plurality of wires M1 are formed. The wires M1 are electrically coupled to the foregoing source region and the foregoing drain region of the memory cell MC2 via the plugs PG1 provided in contact holes CH extending through the interlayer insulating films IL2 and IL1. As a result, the bottom surfaces of the plugs PG1 are in direct contact with the upper surfaces of the silicide layers S1 so that the plugs PG1 are electrically coupled to the source and drain regions via the silicide layers S1. The silicide layers S1 have the function of reducing the coupling resistances between the plugs PG1 as the coupling portions made of a metal film mainly containing, e.g., tungsten (W) and the source and drain regions in the fin FA made of a semiconductor.

A description will be given herein of the case where each of the contact holes CH and the plugs PG1 and PG2 has a round shape in plan view. Alternatively, each of the contact holes CH and the plugs PG1 and PG2 may also have a rectangular shape in plan view. Each of the contact holes CH and the plugs PG1 and PG2 may also have a width larger than that of each of the silicide layers S1 and the epitaxial layers EP1 and EP2 in the short-side direction (Y-direction) of each of the fins.

By covering the fin FA in which the source and drain regions are formed with the silicide layer S1, it is possible to reduce the resistances of the source and drain regions and thus improve the performance of the memory cell MC2.

The memory cell MC2 includes the control gate electrode CG2, the paraelectric film HK1, the ferroelectric film HK2, the memory gate electrode MG, the drain region, and the source region. The control gate electrode CG2 and the source and drain regions are included in a control transistor. The paraelectric film HK1, the ferroelectric film HK2, the memory gate electrode MG, and the source and drain regions are included in a memory transistor. The memory cell MC2 includes the control transistor and the memory transistor. In short, the control transistor and the memory transistor share the source and drain regions. The distance between the drain region and the source region of the control gate electrode CG2 and the memory gate electrode MG in the gate length direction (X-direction) corresponds to the channel length of the memory cell MC2.

In the nMIS region 1B, over the main and side surfaces of the fin FB, the gate electrode G1 is formed via an insulating film HK functioning as a gate insulating film. Note that the insulating film HK continuously covers the bottom and side surfaces of the gate electrode G1. The insulating film HK is an insulating material film having a dielectric constant (relative permittivity) higher than that of silicon nitride, i.e., a so-called high-k film (high-dielectric-constant film). The gate electrode G1 includes a metal film MF3 covering the top surface of the insulating film HK and a metal film MF4 formed over the insulating film HK via the metal film MF3. The metal film MF3 is made of, e.g., TiAl (titanium aluminum). The metal film MF4 is made of, e.g., Al (aluminum). Note that, between the fin FB and the insulating film HK, a silicon oxide film may also be formed as a portion of the gate insulating film, but the silicon oxide film is not shown herein.

In the short-side direction (Y-direction) of the fin FB, the gate electrode G1 continuously extends along the upper and side surfaces of the fin FB and the upper surface of the isolation region EI via the insulating film HK. The side surfaces of the gate electrode G1 are covered with the sidewall spacers SW.

Each of the source region and the drain region which are provided in areas lateral to the gate electrode G1 such that the gate electrode G1 is interposed therebetween in the X-direction includes the extension region EX2 as an n$^-$-type semiconductor region and the diffusion region D2 as an n$^+$-type semiconductor region, i.e., has an LDD structure. The diffusion region D2 is formed extensively in the fin FB and the epitaxial layer EP1 formed lateral to the gate electrode G1 via the sidewall spacer SW. The extension region EX2 is formed in the fin FB. The source region corresponds to the source region LS1 shown in FIG. 25, while the drain region corresponds to the drain region LD1 shown in FIG. 25.

In the nMIS region 1B, over the fin FB and the isolation region EI, the interlayer insulating films IL1 and IL2 are formed in this order in the same manner as in the memory cell region 1A. However, between the interlayer insulating film IL1 and the interlayer insulating film IL2, an insulating film IF9 is formed so as to cover the upper surface of the gate electrode G1. The upper surface of the interlayer insulating film IL1 is planarized together with the respective upper surfaces of the gate electrode G1, the insulating film HK, and the sidewall spacers SW. The interlayer insulating film IL1 covers the upper surfaces of the epitaxial layers EP1 so that the upper surfaces of the epitaxial layer EP1 are in direct contact with the interlayer insulating film IL1. Consequently, between the upper surfaces of the epitaxial layers EP1 and the interlayer insulating film IL1, no silicide layer is interposed.

Over the interlayer insulating film IL2, the wires M1 are formed and electrically coupled to the source region and the drain region via the plugs PG2 provided in the contact holes CH extending through the interlayer insulating films IL2 and IL1. Between the plugs PG2 and the epitaxial layers EP1, silicide layers S3 are interposed. The silicide layers S3 are made of, e.g., TiSi$_2$ (titanium silicide).

The silicide layers S3 are formed immediately below the plugs PG2, i.e., only at the bottom portions of the contact holes CH. The upper surfaces of the epitaxial layers EP1 located in the areas lateral to the plugs PG2 are exposed from the silicide layers S3. The silicide layers S3 have the function of reducing the coupling resistances between the plugs PG2 as the coupling portions made of a metal film mainly containing, e.g., tungsten (W) and the source and drain regions in the epitaxial layers EP1 made of the semiconductor.

The n-type transistor QN includes the gate electrode G1, the drain region, and the source region. The distance between the drain region and the source region of the gate electrode G1 in the gate length direction (X-direction) corresponds to the channel length of the n-type transistor QN.

In the pMIS region 1C, over the main and side surfaces of the fin FC, the gate electrode G2 is formed via the insulating film HK functioning as a gate insulating film. Note that the insulating film HK continuously covers the bottom and side surfaces of the gate electrode G2. The insulating film HK is an insulating material film having a dielectric constant (relative permittivity) higher than that of silicon nitride, i.e., a so-called high-k film (high-dielectric-constant film). The gate electrode G2 includes a metal film MF5 covering the top surface of the insulating film HK and a metal film MF6 formed over the insulating film HK via the metal film MF5. The metal film MF5 is made of, e.g., TiAl (titanium aluminum), while the metal film MF6 is made of, e.g., Al (aluminum). Note that, between the fin FC and the insulating film HK, a silicon oxide film may also be formed as a portion of the gate insulating film, but the silicon oxide film is not shown herein.

In the short-side direction (Y-direction) of the fin FC, the gate electrode G2 continuously extends along the upper and side surfaces of the fin FC and the upper surface of the isolation region EI via the insulating film HK. The side surfaces of the gate electrode G2 are covered with the sidewall spacers SW.

Each of the source region and the drain region which are provided in areas lateral to the gate electrode G2 such that the gate electrode G2 is interposed therebetween in the X-direction includes an extension region EX3 as a $p^-$-type semiconductor region and the diffusion region D3 as a $p^+$-type semiconductor region, i.e., has an LDD structure. The diffusion region D3 is formed extensively in the fin FC and the epitaxial layer EP2 formed lateral to the gate electrode G2 via the sidewall spacer SW. The extension region EX3 is formed in the fin FC. The source region corresponds to the source region LS2 shown in FIG. 25, while the drain region corresponds to the drain region LD2 shown in FIG. 25.

In the pMIS region 1C, over the fin FC and the isolation region EI, the interlayer insulating film IL1, the insulating film IF9, and the interlayer insulating film IL2 are formed in this order in the same manner as in the nMIS region 1B. The upper surface of the interlayer insulating film IL1 is planarized together with the respective upper surfaces of the gate electrode G2, the insulating film HK, and the sidewall spacers SW. The interlayer insulating film IL1 covers the upper surfaces of the epitaxial layers EP2 so that the upper surfaces of the epitaxial layers EP2 are in direct contact with the interlayer insulating film IL1. Consequently, between the upper surfaces of the epitaxial layers EP2 and the interlayer insulating film IL1, no silicide layer is interposed.

Over the interlayer insulating film IL2, the wires M1 are formed and electrically coupled to the source region and the drain region via the plugs PG2 provided in the contact holes CH extending through the interlayer insulating films IL2 and IL1. Between the plugs PG2 and the epitaxial layers EP2, the silicide layers S3 are interposed. The silicide layers S3 are made of, e.g., $TiSi_2$ (titanium silicide).

The silicide layer S3 are formed immediately below the plugs PG2, i.e., only at the bottom portions of the contact holes CH. The upper surfaces of the epitaxial layers EP2 located in the areas lateral to the plugs PG2 are exposed from the silicide layers S3. The silicide layers S3 have the function of reducing the coupling resistances between the plugs PG2 as the coupling portions made of the metal film mainly containing, e.g., tungsten (W) and the source and drain regions in the epitaxial layers EP2 made of a semiconductor.

The p-type transistor QP includes the gate electrode G2, the drain region, and the source region. The distance between the drain region and the source region of the gate electrode G2 in the gate length direction (X-direction) corresponds to the channel length of the p-type transistor QP.

<Operations in Nonvolatile Memory>

Next, a description will be given of an example of operations in the nonvolatile memory with reference to FIG. 29.

Figures 29, 30:
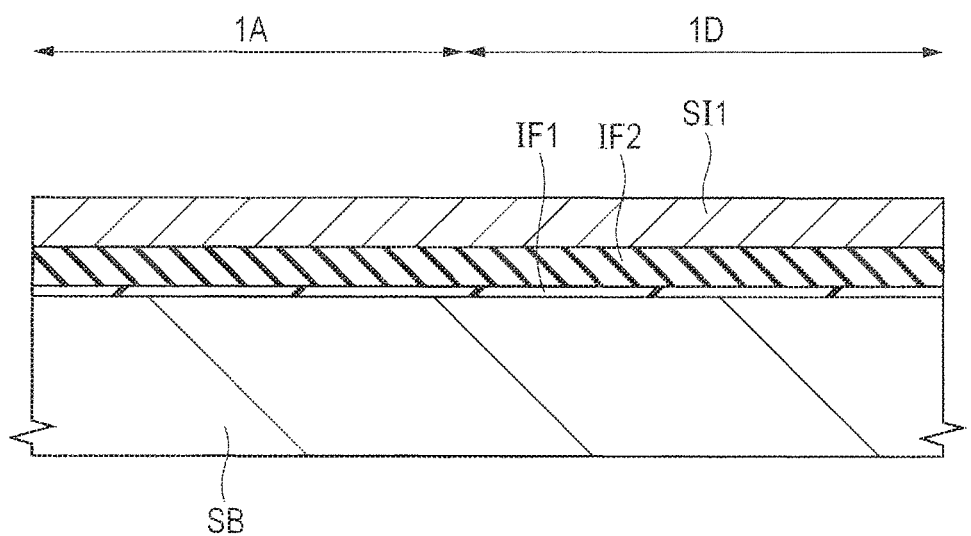
FIG. 29 is a table showing an example of conditions under which voltages are applied to the individual portions of a selected memory cell during "Write", "Erase", and "Read" operations in the semiconductor device as the second embodiment of the present invention.
FIG. 30 is a cross-sectional view illustrating a manufacturing process of the semiconductor device as the second embodiment of the present invention.

FIG. 29 is a table showing an example of conditions under which voltages are applied to the individual portions of a selected memory cell during "Write", "Erase", and "Read" operations. In the table of FIG. 29, the voltage Vd applied to the drain region of the memory cell (selected memory cell) MC2 shown in FIG. 28, a voltage Vcg applied to the control gate electrode CG2 thereof, a voltage Vmg applied to the memory gate electrode MG thereof, the voltage Vs applied to the source region thereof, and the voltage Vb applied to the p-type well PW1 thereof during each of the "Write", "Erase", and "Read" operations are shown. Note that what is shown in the table of FIG. 29 is a preferred example of the conditions for voltage application. The conditions for voltage application are not limited thereto, and can variously be changed as necessary.

In the present second embodiment, bringing the memory cell MC2 into the state where the ferroelectric film HK2 is upwardly polarized and the threshold voltage of the transistor included in the memory cell MC2 is relatively high is defined as the "Write" operation. On the other hand, bringing the memory cell MC2 into the state where the ferroelectric film HK2 is downwardly polarized and the threshold voltage of the transistor included in the memory cell MC2 is relatively low is defined as the "Erase" operation".

In the present second embodiment, the "Write" operation to the memory cell MC2 is performed by applying a negative voltage to the memory gate electrode MG thereof. Specifically, such voltages as shown in, e.g., the "Write" row in FIG. 29 are applied to the individual portions of the selected memory cell to which the "Write" operation is performed. Thus, the ferroelectric film HK2 of the selected memory cell is upwardly polarized to effect the "Write" operation. This increases the threshold voltage of the transistor included in the memory cell MC2. As a result, the memory cell MC2 is brought into the written state.

In the present second embodiment, the "Erase" operation to the memory cell MC2 is performed by applying a positive voltage to the memory gate electrode MG thereof. Specifically, such voltages as shown in, e.g., the "Erase" row in FIG. 29 are applied to the individual portions of the selected memory cell to which the "Erase" operation is performed. Thus, the ferroelectric film HK2 of the selected memory cell is downwardly polarized to effect the "Erase" operation. This reduces the threshold voltage of the transistor included in the memory cell MC2. As a result, the memory cell MC2 is brought into the erased state.

When the "Read" operation is performed, such voltages as shown in, e.g., the "Read" row in FIG. 29 are applied to the individual portions of the selected memory cell to which the "Read" operation is performed. By setting the voltage Vmg to be applied to the memory gate electrode MG during the "Read" operation to a value between the threshold voltage of the foregoing transistor in the written state and the threshold voltage of the foregoing transistor in the erased state, the written state or the erased state can be determined.

<Effects of Semiconductor Device>

From the semiconductor device in the present second embodiment, the same effects as obtained from the semiconductor device in the foregoing first embodiment can be obtained.

Specifically, by forming the paraelectric film HK1 as the interfacial layer, it is possible to prevent the electric field induced in the ferroelectric film HK2 from causing dielectric breakdown of the interfacial layer. As a result, it is possible to improve the reliability of the semiconductor device. In addition, as described using FIG. 3, the crystals GR2 included in the ferroelectric film HK2 are formed larger than the crystals GR1 included in the paraelectric film HK1 to allow residual polarization in the ferroelectric film HK2 to be increased. This can reduce the operating voltage of the ferroelectric memory and improve the information retention property of the ferroelectric memory. Therefore, it is possible to improve the performance of the semiconductor device.

Under the ferroelectric film HK2, the paraelectric film HK1 is formed herein to come in contact with the lower surface of the ferroelectric film HK2 so that crystal nuclei are less likely to be formed over the upper surface of the paraelectric film HK1 as the interfacial layer. This can reduce the number of the crystals GR2 included in the ferroelectric film HK2 and allow each of the crystals GR2 to be grown large.

<Manufacturing Process of Semiconductor Device>

Using FIGS. 30 to 74, the following will describe a method of manufacturing the semiconductor device in the present second embodiment. FIGS. 30, 32, 34, 36, 39, 41, and 43 to 74 are cross-sectional views of the semiconductor device in the present second embodiment during the formation process thereof. FIGS. 31, 33, 35, 37, 38, 40, and 42 are perspective views of the semiconductor device in the present second embodiment during the formation process thereof. FIGS. 32, 34, 36, 39, 41, and 43 are views showing cross sections at the same position in FIGS. 31, 33, 35, 38, 40, and 42 along the Y-direction. In the foregoing perspective views, the illustration of the wells is omitted.

FIGS. 30 to 44 show the memory cell region 1A and the logic circuit region 1D which are arranged in this order in the left-to-right direction. FIGS. 45 to 74 show the memory cell region 1A, the nMIS region 1B, and the pMIS region 1C which are arranged in this order in the left-to-right direction. The nMIS region 1B and the pMIS region 1C are included in the logic circuit region 1D.

First, as shown in FIG. 30, the semiconductor substrate SB is provided herein and, over the main surface of the semiconductor substrate SB, an insulating film IF1, an insulating film IF2, and a semiconductor film SI1 are formed in this order. The semiconductor substrate SB is made of p-type monocrystalline silicon having a specific resistance of, e.g., about 1 to 10 Ωcm or the like. The insulating film IF1 is made of, e.g., a silicon oxide film and can be formed using, e.g., an oxidation method or a CVD method. The insulating film IF1 has a thickness of about 2 to 10 nm. The insulating film IF2 is made of, e.g., a silicon nitride film and has a thickness of about 20 to 100 nm. The insulating film IF2 is formed by, e.g., a CVD method. The semiconductor film SI1 is made of, e.g., a silicon film and formed by, e.g., a CVD method. The semiconductor film SI1 has a thickness of, e.g., 20 to 200 nm.

Figure 31:
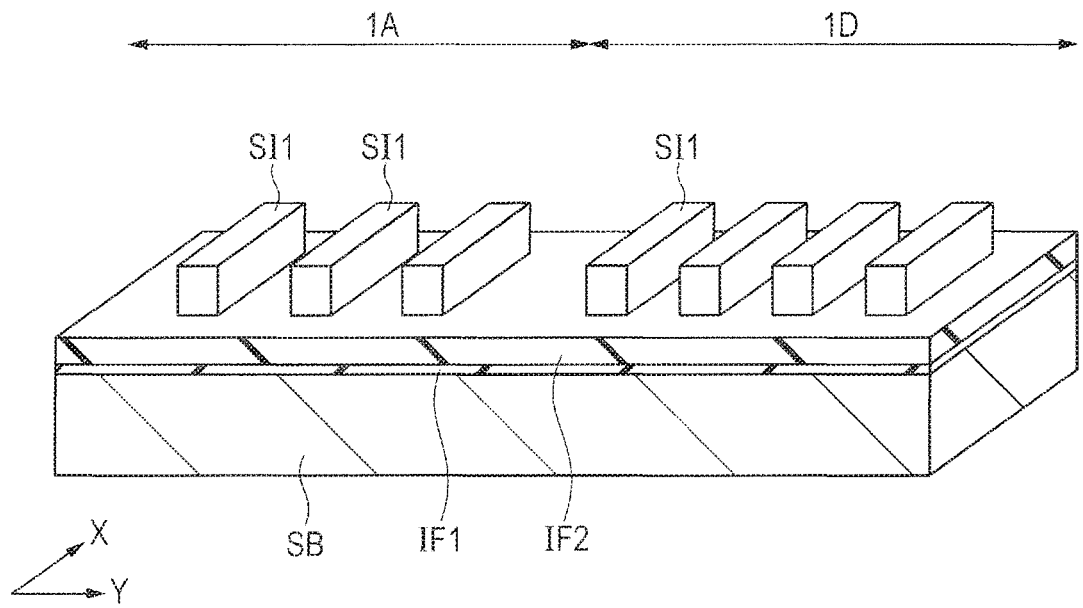
FIG. 31 is a perspective view illustrating the manufacturing process of the semiconductor device, which is subsequent to FIG. 30.
Figure 32:
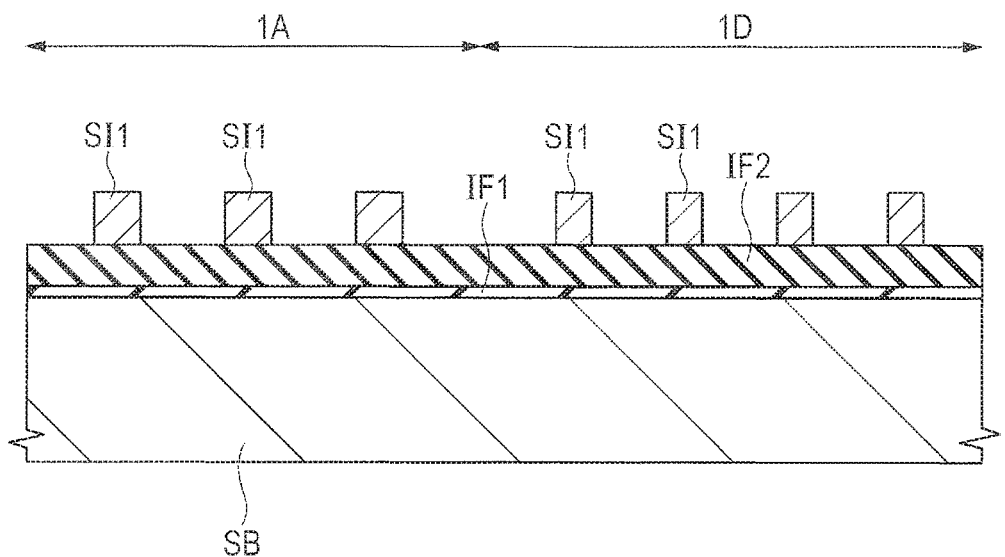
FIG. 32 is a cross-sectional view of the semiconductor device shown in FIG. 31 along a Y-direction during the manufacturing process thereof.

Next, as shown in FIGS. 31 and 32, using a photolithographic technique and an etching method, the semiconductor film SI1 located in the memory cell region 1A and the logic circuit region 1D is processed. As a result, over the insulating film IF2, a plurality of patterns made of the plurality of semiconductor films SI1 extending in the X-direction are formed to be arranged in the Y-direction. FIG. 32 is a cross-sectional view including the patterns made of the plurality of semiconductor films SI1 shown in FIG. 31.

The width of each of the patterns in the Y-direction in the memory cell region 1A is larger than the width of each of the patterns in the Y-direction in the logic circuit region 1D. In the Y-direction, the intervals between the patterns arranged in the memory cell region 1A are larger than the intervals between the patterns arranged in the logic circuit region 1D. Since the fins are formed in the areas close to the semiconductor film SI1 in the Y-direction in the subsequent step, the intervals between the adjacent fins can be adjusted by changing the widths of the patterns and the intervals therebetween.

Figure 33:
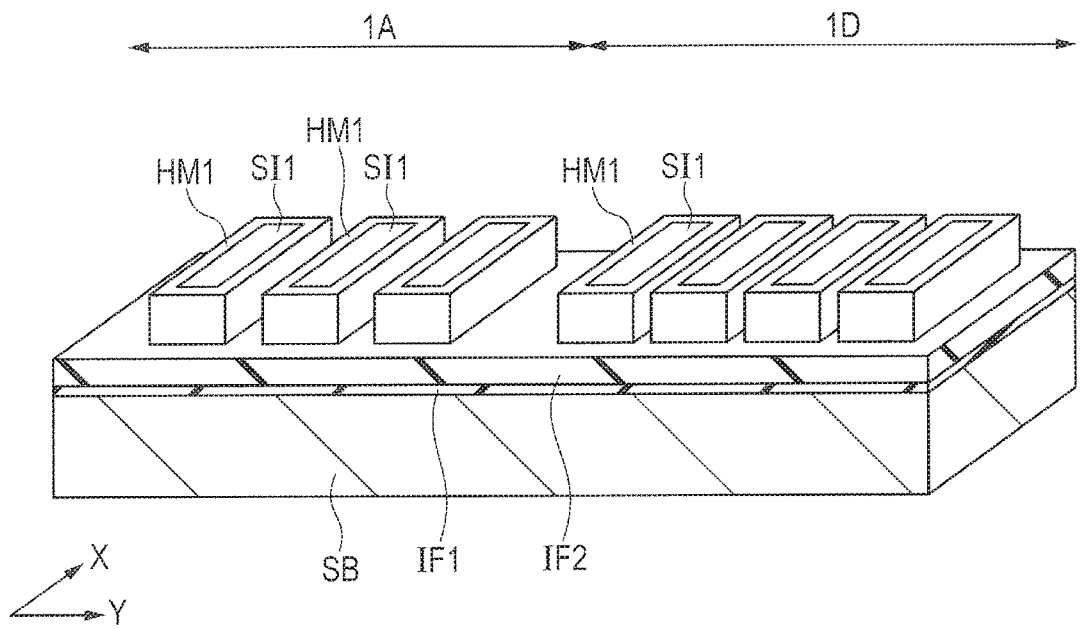
FIG. 33 is a perspective view illustrating the manufacturing process of the semiconductor device, which is subsequent to FIG. 32.
Figure 34:
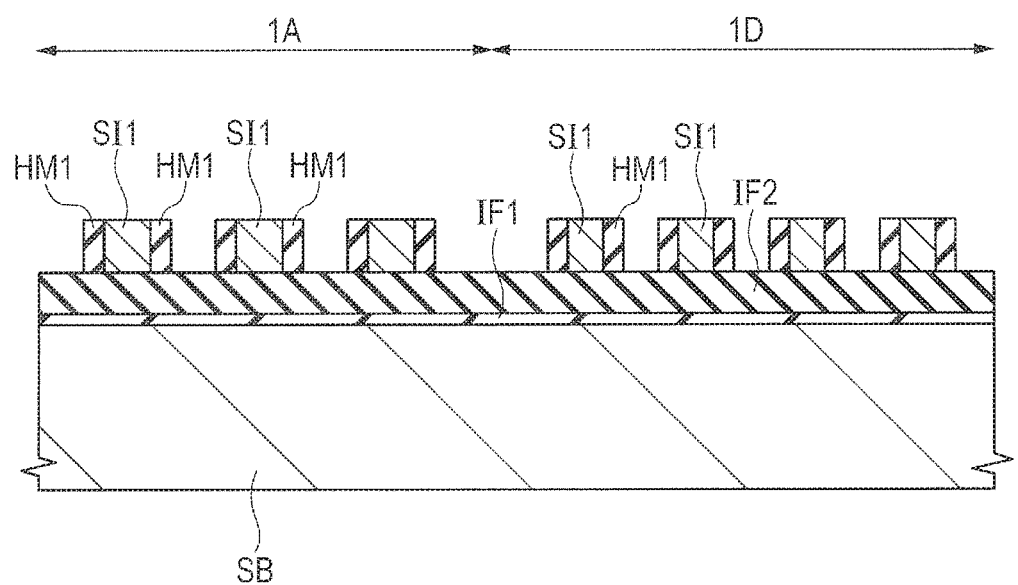
FIG. 34 is a cross-sectional view of the semiconductor device shown in FIG. 33 along the Y-direction during the manufacturing process thereof.

Next, as shown in FIGS. 33 and 34, hard masks HN1 are formed to cover the respective side surfaces of the plurality of semiconductor films SI1. For example, over the semiconductor substrate SB, a silicon oxide film having a thickness of 10 to 40 nm is formed herein using a CVD method and then dry-etched by anisotropic etching. By thus exposing the respective upper surfaces of the insulating film IF2 and the semiconductor films SI1, the hard masks HM1 made of the silicon oxide film remaining over the side surfaces of the semiconductor films SI1 are formed. The hard masks HM1 do not completely fill up the spaces between the adjacent semiconductor films SI1. As shown in FIG. 33, the hard masks HM1 are each formed in an annular shape so as to surround the respective semiconductor films SI1.

Figure 35:
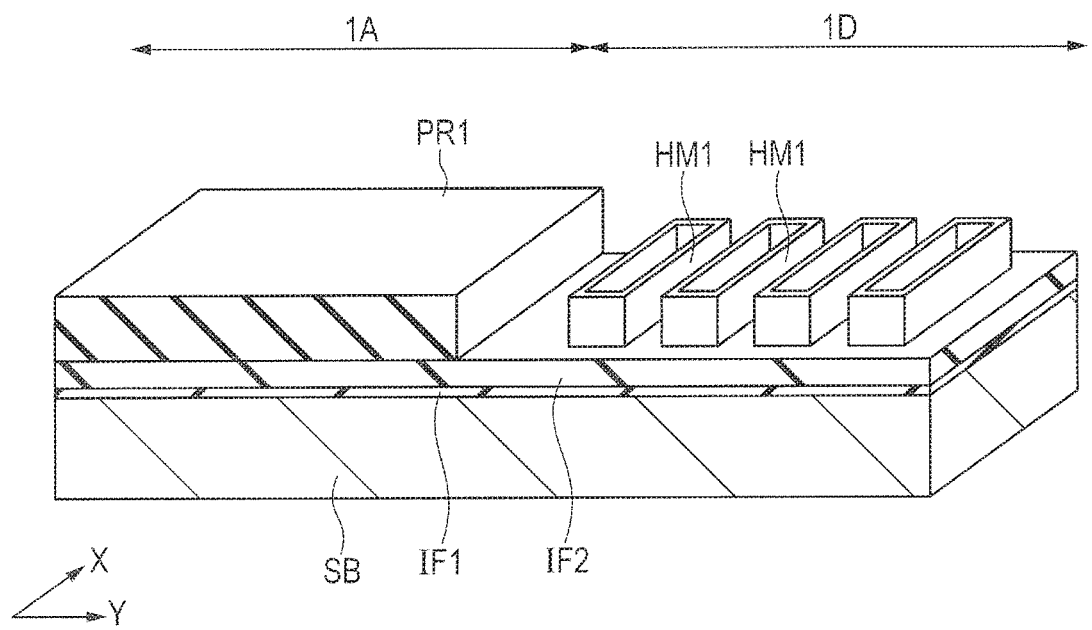
FIG. 35 is a perspective view illustrating the manufacturing process of the semiconductor device, which is subsequent to FIG. 34.
Figure 36:
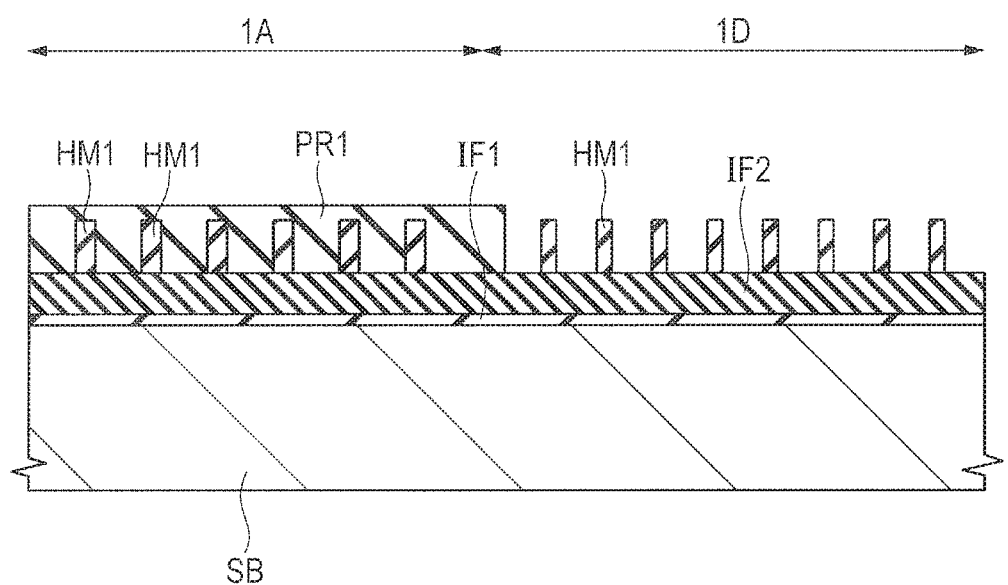
FIG. 36 is a cross-sectional view of the semiconductor device shown in FIG. 35 along the Y-direction during the manufacturing process thereof.

Next, as shown in FIGS. 35 and 36, using a wet etching method, the semiconductor films SI1 are removed. Subsequently, a photoresist film PR1 is formed to cover the hard masks HM1 in the memory cell region 1A and expose the hard masks HM1 in the logic region 1D. Subsequently, wet etching is performed to partly remove the top surfaces of the hard masks HM1. Thus, the width of each of the hard masks HM1 in the logic circuit region 1D is reduced. Note that the width mentioned in the present invention refers to a length of a pattern or the like in a direction along the main surface of the semiconductor substrate SB.

The hard masks HM1 are used to form the fins immediately therebelow. Accordingly, by producing the difference between the width of each of the hard masks HM1 in the memory cell region 1A and the width of each of the hard masks HM1 in the logic circuit region 1D as described above, it is possible to produce the difference between the width of the fin formed in the memory region 1A and the width of the fin formed in the logic circuit region 1D.

Figure 37:
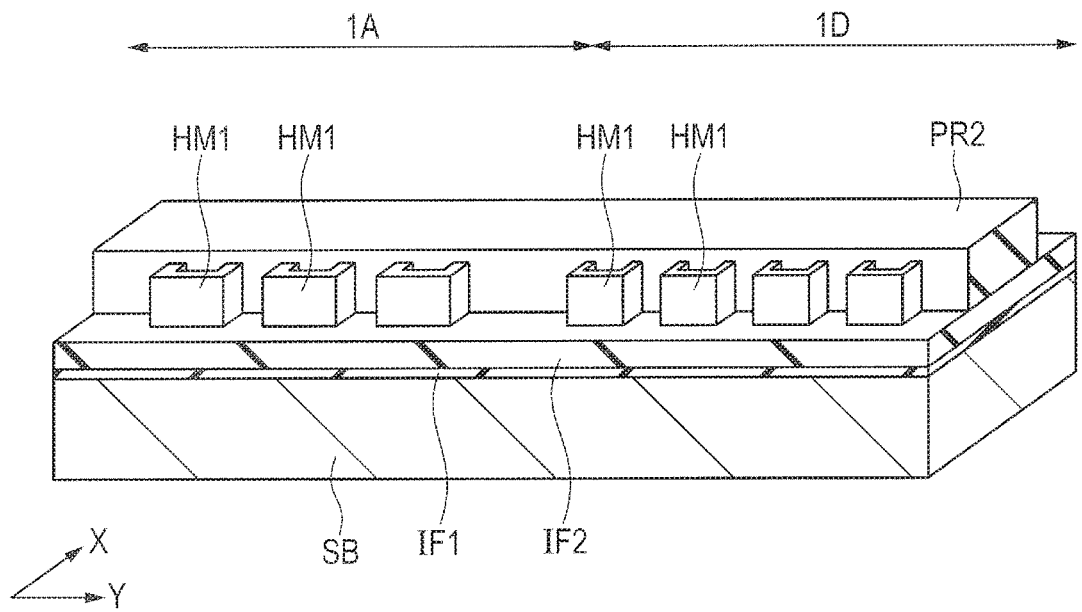
FIG. 37 is a perspective view illustrating the manufacturing process of the semiconductor device, which is subsequent to FIG. 36.

Next, as shown in FIG. 37, the photoresist film PR1 is removed, and then a photoresist film PR2 is formed to partly cover each of the hard masks HM1 in the memory cell region 1A and each of the hard masks HM1 in the logic circuit region 1D. The photoresist film PR2 is a resist pattern covering the portions of the hard masks HM1 extending in the X-direction and exposing the ends of the portions thereof extending in the X-direction and the portions of the hard masks HM1 extending in the Y-direction. As a result, the both ends of the hard masks HM1 in the X-direction are exposed from the photoresist film PR2.

Figure 38:
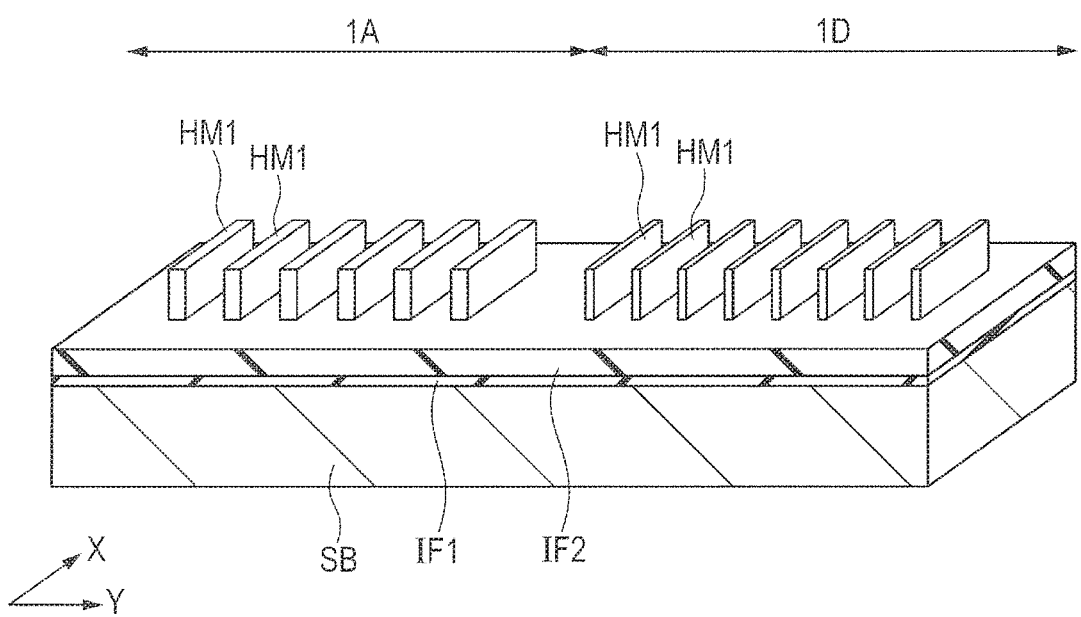
FIG. 38 is a perspective view illustrating the manufacturing process of the semiconductor device, which is subsequent to FIG. 37.
Figure 39:
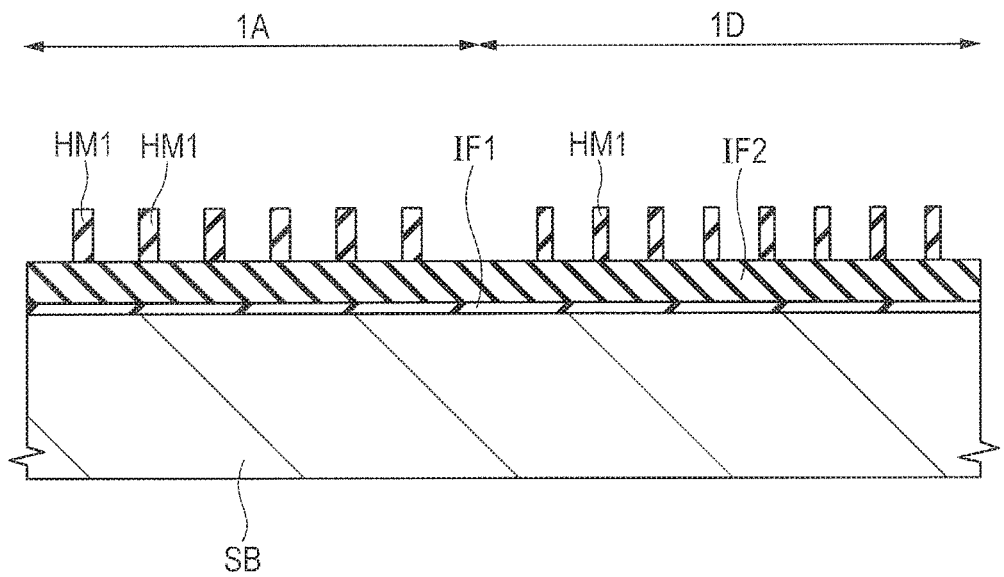
FIG. 39 is a cross-sectional view of the semiconductor device shown in FIG. 38 along the Y-direction during the manufacturing process thereof.

Next, as shown in FIGS. 38 and 39, etching is performed using the photoresist film PR2 as a mask to partly remove each of the hard masks HM1 and then remove the photoresist film PR2. As a result, only the portions of the hard masks HM1 extending in the X-direction are left. In other words, over the insulating film IF2, the plurality of hard masks HM1 in the patterns extending in the X-direction are disposed to be arranged in the Y-direction.

Figure 40:
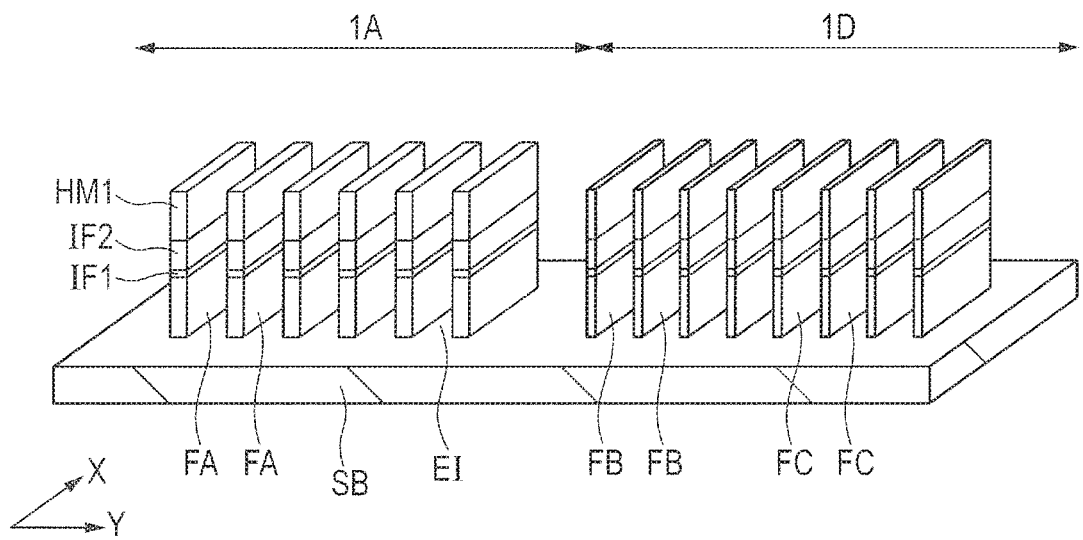
FIG. 40 is a perspective view illustrating the manufacturing process of the semiconductor device, which is subsequent to FIG. 39.
Figure 41:
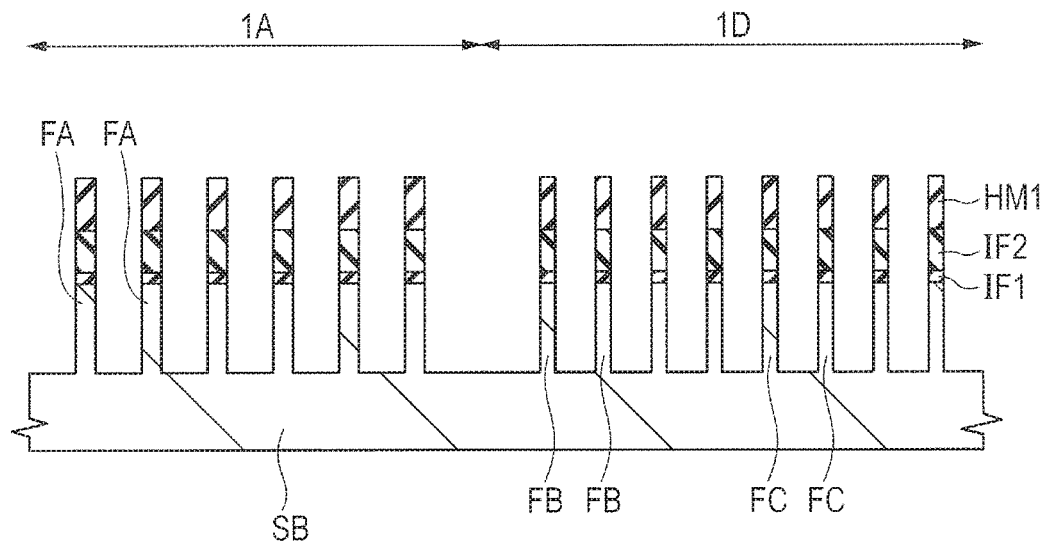
FIG. 41 is a cross-sectional view of the semiconductor device shown in FIG. 40 along the Y-direction during the manufacturing process thereof.

Next, as shown in FIGS. 40 and 41, using the hard masks HM1 as a mask, anisotropic dry etching is performed on the insulating films IF2 and IF1 and the semiconductor substrate SB. Thus, immediately below the hard masks HM1, patterns as the portions of the semiconductor substrate SB which are processed into plate-like shapes (wall-like shapes), i.e., the fins FA, FB, and FC are formed. By lowering the level of the main surface of the semiconductor substrate SB located in the areas exposed from the hard masks HM1 by 100 to 250 nm, the fins FA, FB, and FC each having a height of 100 to 250 nm from the main surface of the semiconductor substrate SB can be formed.

Figure 42:
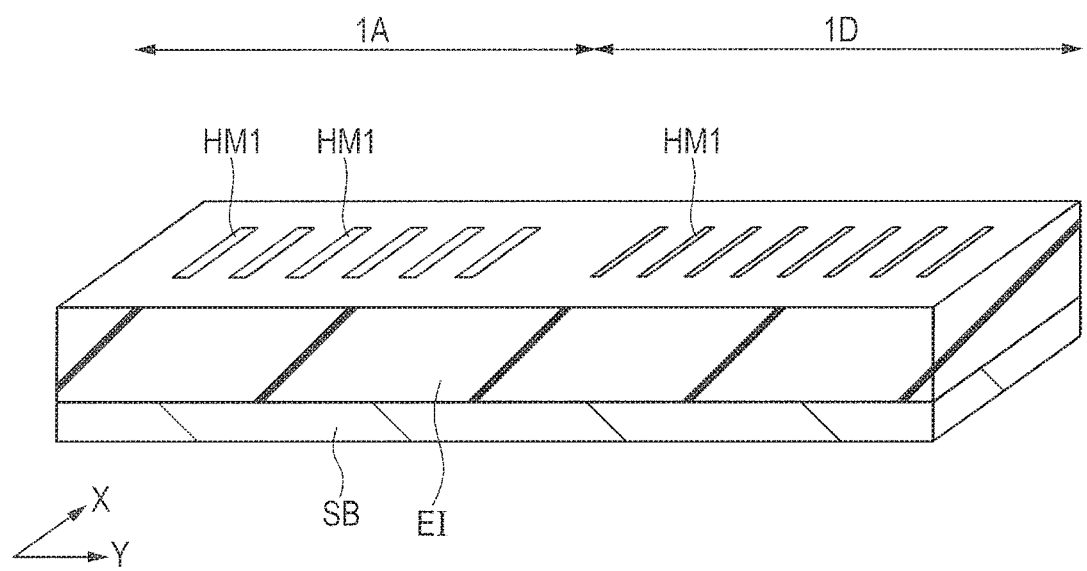
FIG. 42 is a perspective view illustrating the manufacturing process of the semiconductor device, which is subsequent to FIG. 41.
Figure 43:
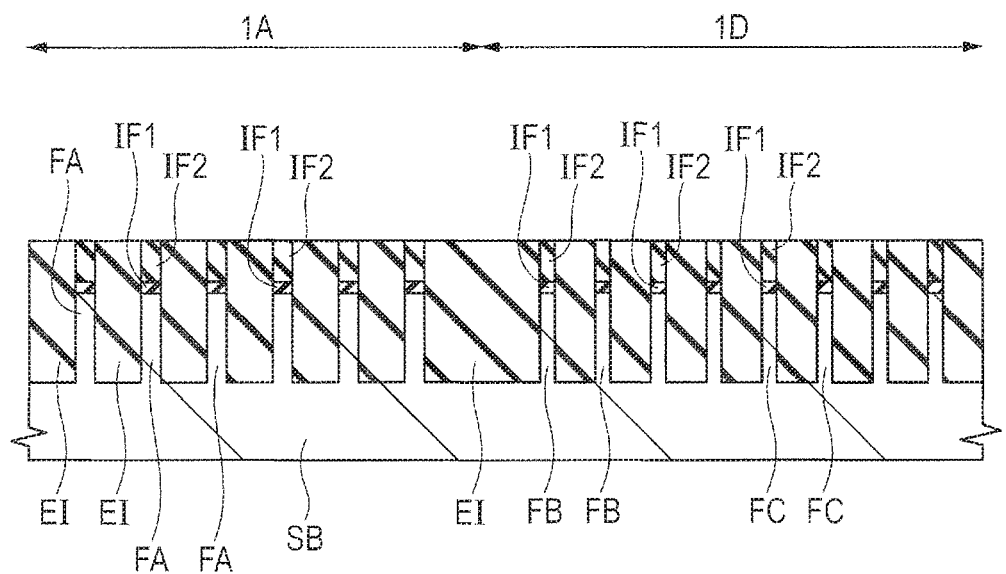
FIG. 43 is a cross-sectional view of the semiconductor device shown in FIG. 42 along the Y-direction during the manufacturing process thereof.

Next, as shown in FIGS. 42 and 43, over the semiconductor substrate SB, an insulating film made of a silicon oxide film or the like is deposited such that the fins FA, FB, and FC and the insulating films IF1 and IF2 are completely buried therein. Subsequently, a polishing process using a CMP method is performed on the insulating film to expose the upper surface of the insulating film IF2. Thus, the isolation region EI made of the insulating film is formed. By the CMP step, the hard masks HM1 are removed. Note that the hard masks HM1 may also be removed before the insulating film forming the isolation region EI is formed.

Figure 44:
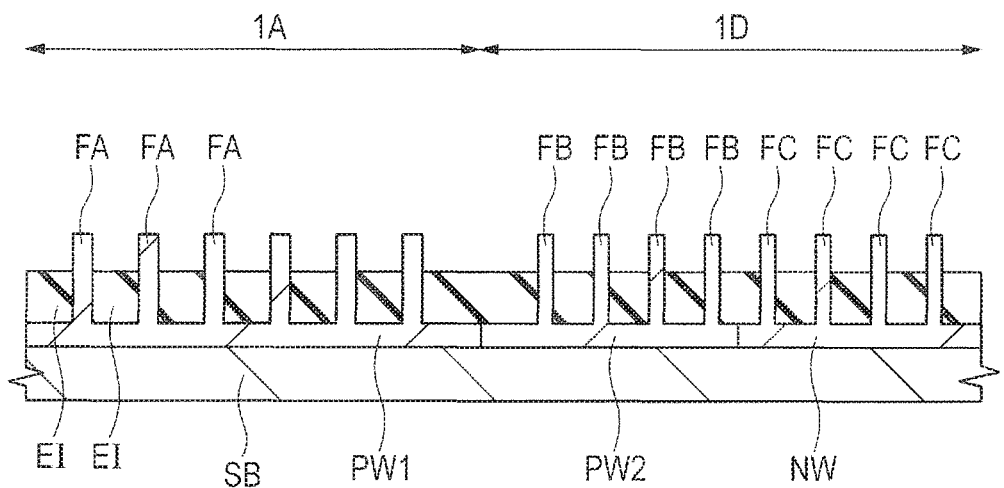
FIG. 44 is a cross-sectional view illustrating the manufacturing process of the semiconductor device, which is subsequent to FIG. 43.

Next, as shown in FIG. 44, the insulating films IF1 and IF2 are removed. Subsequently, an etching process is performed on the upper surface of the isolation region EI to retreat (lower) the upper surface of the isolation region EI in a height direction. This partly exposes each of the side surfaces of the fins FA, FB, and FC and exposes the entire upper surfaces of the fins FA, FB, and FC.

Subsequently, using an ion implantation method, an impurity is introduced into the main surface of the semiconductor substrate SB to form the p-type well PW1 in the fin FA in the memory cell region 1A, form the p-type well PW2 in the fin FB in the logic circuit region 1D, and form the n-type well NW in the fin FC in the logic circuit region 1D. The p-type wells PW1 and PW2 are formed by implanting a p-type impurity (e.g., B (boron)). The n-type well NW is formed by implanting an n-type impurity (e.g., P (phosphorus) or As (arsenic)). The wells are formed to extend into the entire fins and into the portions of the semiconductor substrate SB located under the fins.

Figure 45:
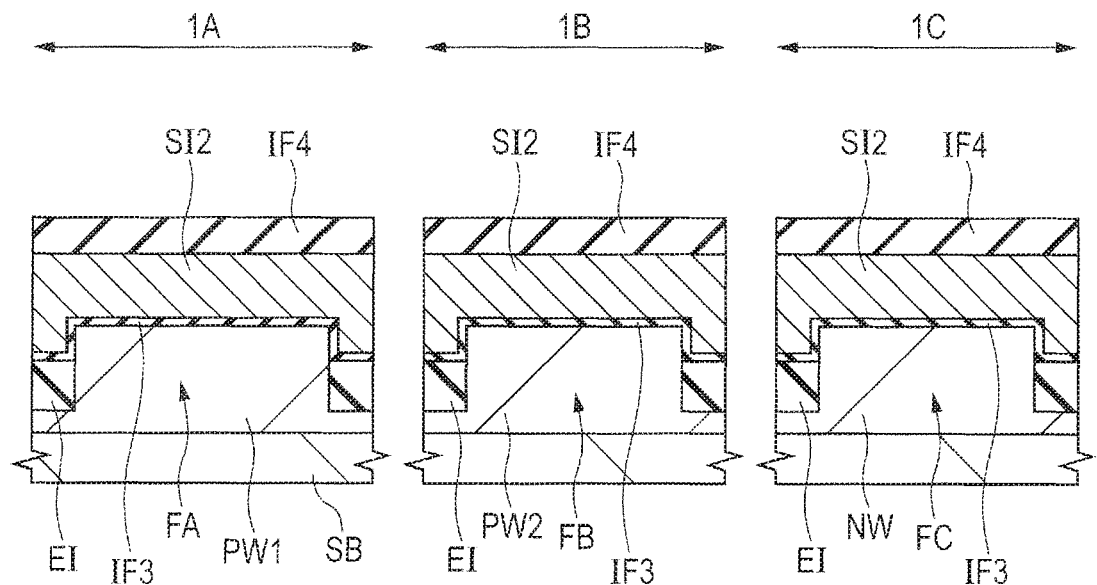
FIG. 45 is a cross-sectional view illustrating the manufacturing process of the semiconductor device, which is subsequent to FIG. 44.

Next, as shown in FIG. 45, an insulating film IF3 is formed to cover the respective upper and side surfaces of the fins FA, FB, and FC. The insulating film IF3 can be formed by, e.g., a thermal oxidation method and made of a silicon oxide film having a thickness of, e.g., about 2 nm. Subsequently, over the insulating film IF3, a semiconductor film SI2 having a thickness of not less than the height of each of the fins FA, FB, and FC is deposited by a CVD method or the like. Then, by planarizing the upper surface of the semiconductor film SI2 by a CMP method or the like, the semiconductor film SI2 having a planarized upper surface is formed. Then, over the semiconductor film SI2, using, e.g., a CVD method, an insulating film IF4 is formed. The semiconductor film SI2 is made of, e.g., a polysilicon film (silicon film), while the insulating film IF4 is made of, e.g., a silicon nitride film. Even after the polishing step is performed on the semiconductor film SI2 using the CMP method as described above, the semiconductor film SI2 remains over the upper surface of each of the fins FA, FC, and FC.

Figure 46:
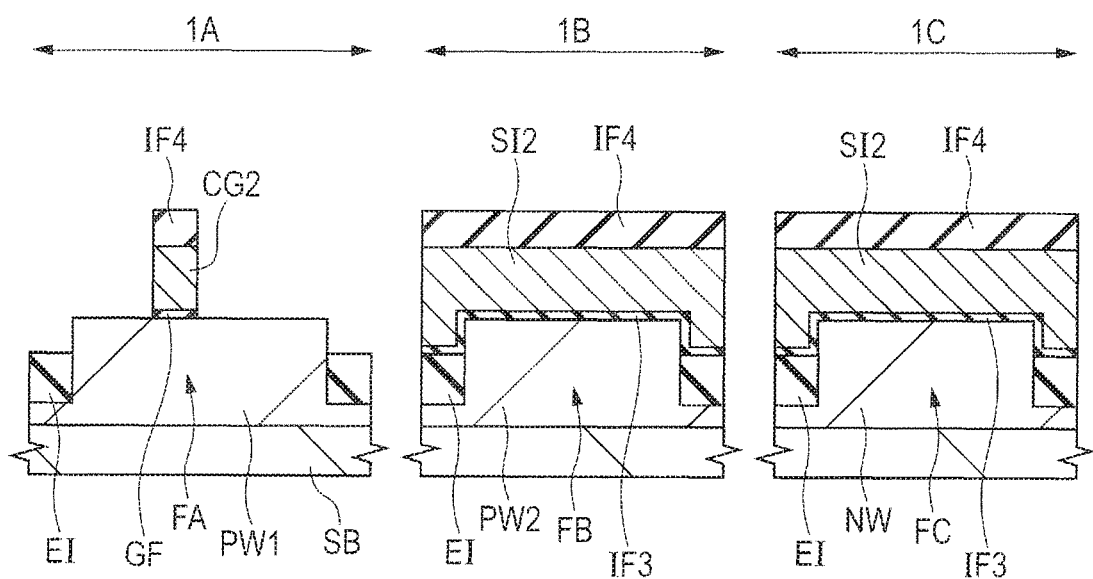
FIG. 46 is a cross-sectional view illustrating the manufacturing process of the semiconductor device, which is subsequent to FIG. 45.

Next, as shown in FIG. 46, a photoresist film (not shown) is formed to cover the upper surface of a portion of the fin FA in the memory cell region 1A as well as the nMIS region 1B and the pMIS region 1C. The photoresist film includes a resist pattern extending in the Y-direction which is formed to cover respective portions of the plurality of fins FA arranged in the Y-direction (depth direction in the drawing). In the area located lateral to the resist pattern, the upper surface of the fin FA is exposed from the photoresist film.

Subsequently, using the photoresist film as a mask, etching is performed to partly remove each of the insulating film IF4 and the semiconductor film SI2 in the memory cell region 1A to thus expose the upper surface of the isolation region EI and the top surface of the insulating film IF3 in the memory cell region 1A. As a result, each of the upper and side surfaces of the fin FA is partly exposed from the insulating film IF4 and the semiconductor film SI2. Thus, over the fin FA, the control gate electrode CG2 made of the semiconductor film SI2 is formed. In addition, the gate insulating film GF made of the insulating film IF3 located between the control gate electrode CG2 and the fin FA is also formed.

Note that a description will be given herein of the case where the insulating film IF3 covering the top surface of the fin FA exposed from the control gate electrode CG2 is removed by the foregoing etching and a cleaning step subsequently performed to expose the top surface of the fin FA. However, the upper and side surfaces of the fin FA may also remain covered with the insulating film IF3.

Figure 47:
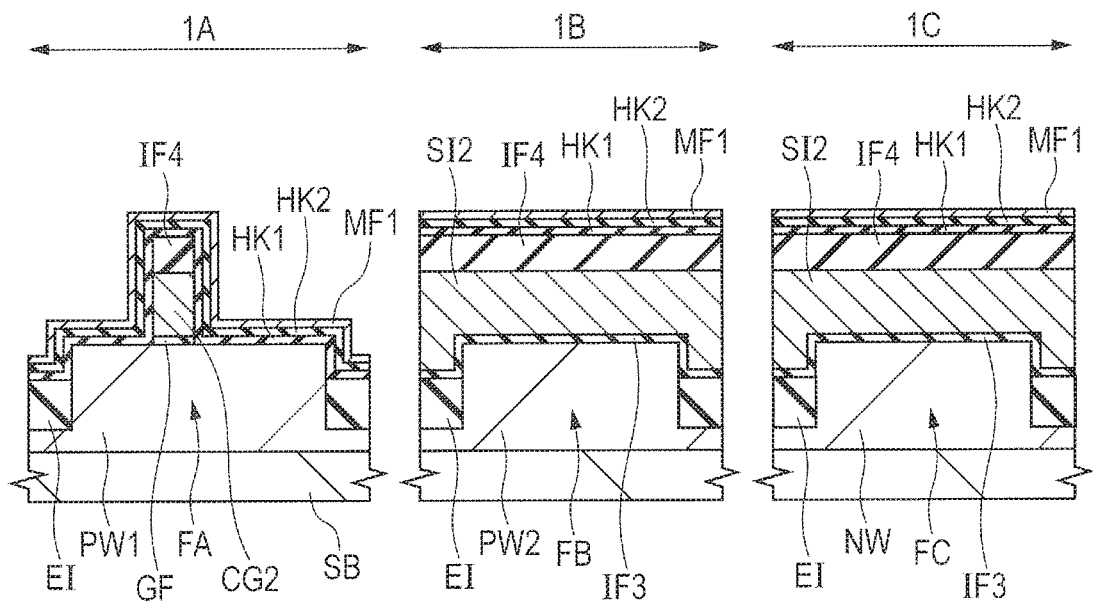
FIG. 47 is a cross-sectional view illustrating the manufacturing process of the semiconductor device, which is subsequent to FIG. 46.

Next, as shown in FIG. 47, over the semiconductor substrate SB, the paraelectric film HK1, the ferroelectric film HK2, and the metal film MF1 are formed by being deposited in this order. The steps of forming the paraelectric film HK1, the ferroelectric film HK2, and the metal film MF1 are the same as the steps described using FIGS. 8 to 13.

A multi-layer film including the paraelectric film HK1, the ferroelectric film HK2, and the metal film MF1 over the semiconductor substrate SB covers the upper surface of the isolation region EI and the upper and side surfaces of the fin FA. The multi-layer film also covers the upper and side surfaces of a multi-layer pattern including the control gate electrode CG2 and the insulating film IF4.

Figure 48:
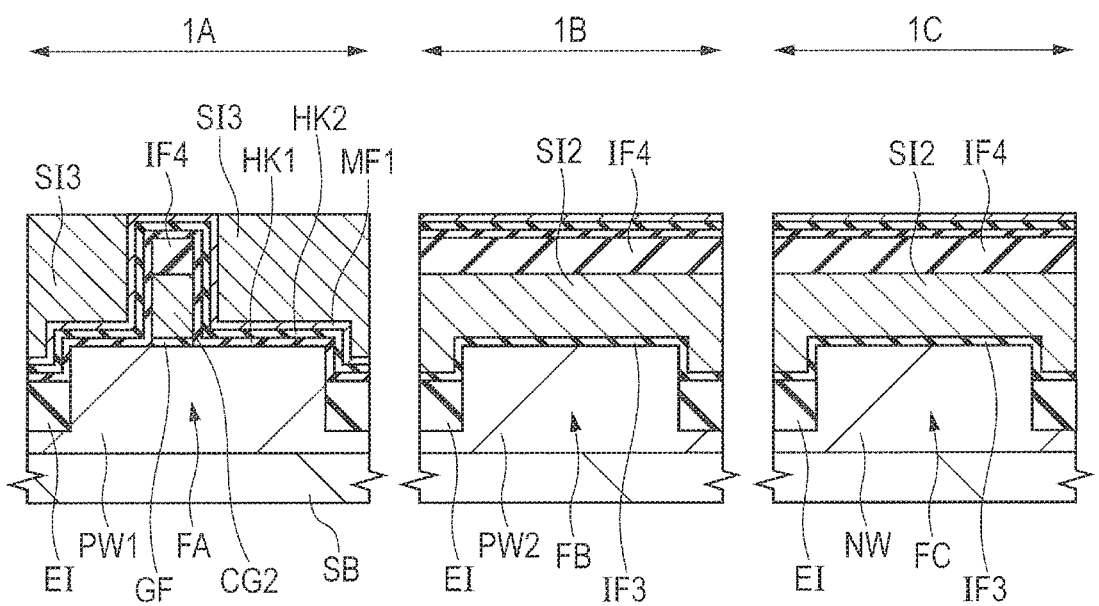
FIG. 48 is a cross-sectional view illustrating the manufacturing process of the semiconductor device, which is subsequent to FIG. 47.

Next, as shown in FIG. 48, over the semiconductor substrate SB, using, e.g., a CVD method, a semiconductor film S13 is formed. The semiconductor film S13 is made of, e.g., a polysilicon film and has a thickness larger than the height of the multi-layer body including the control gate electrode CG2 and the insulating film IF4. Subsequently, the upper surface of the semiconductor film S13 is polished by a CMP method to expose the upper surface of a multi-layer film including the ferroelectric film HK2 and the metal film MF1 over the insulating film IF4.

Figure 49:
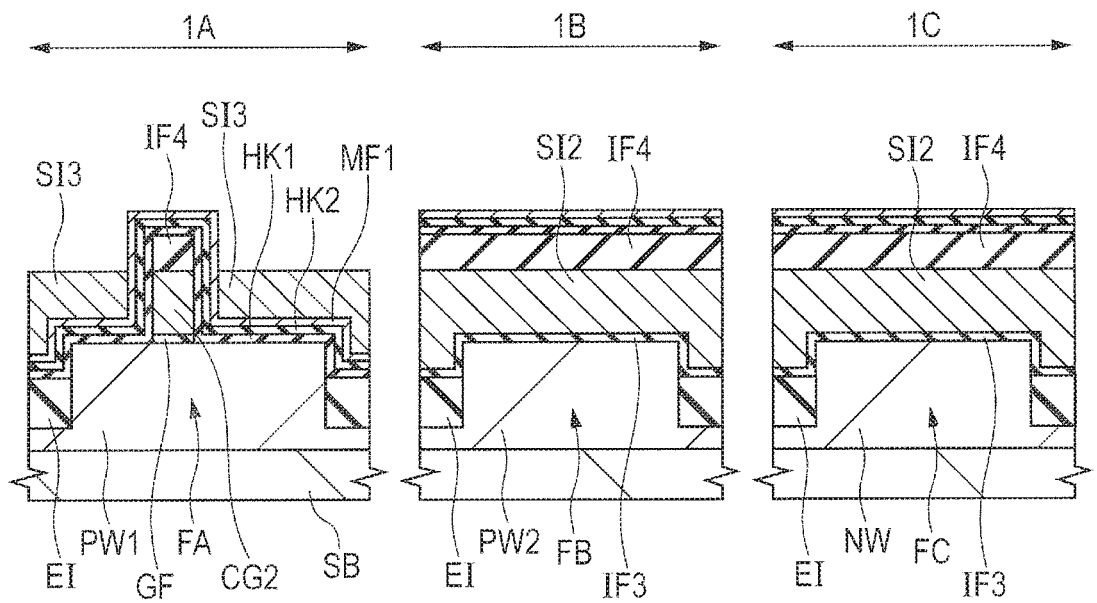
FIG. 49 is a cross-sectional view illustrating the manufacturing process of the semiconductor device, which is subsequent to FIG. 48.

Next, as shown in FIG. 49, an etch-back step is performed to retreat the upper surface of the semiconductor film S13. As a result, the position of the upper surface of the semiconductor film S13 is at a height substantially equal to that of, e.g., the position of the upper surface of the control gate electrode CG.

Figure 50:
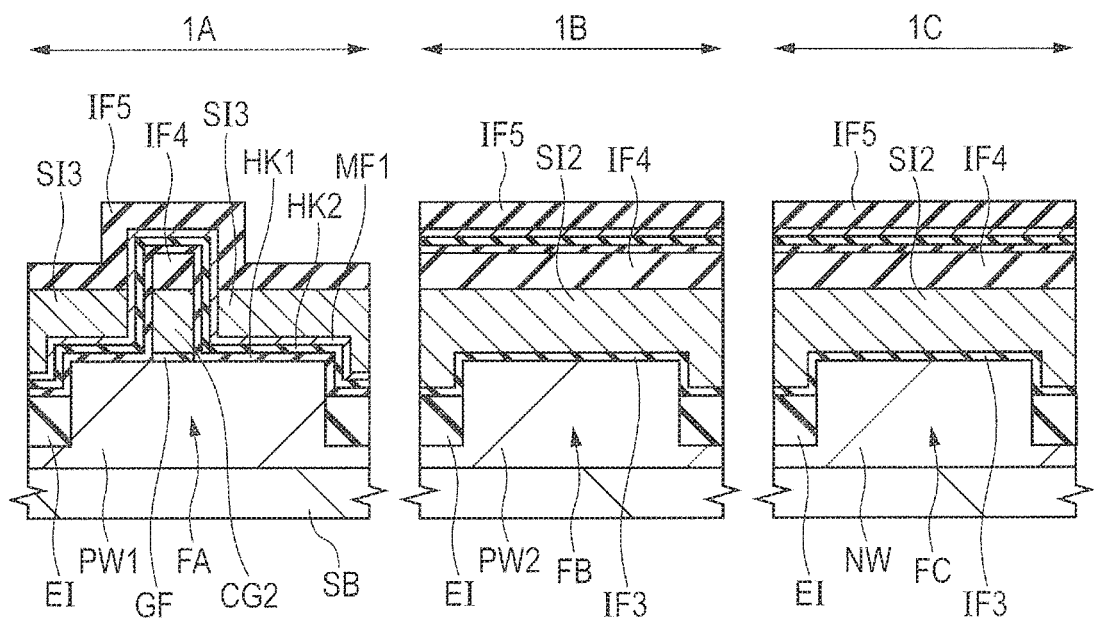
FIG. 50 is a cross-sectional view illustrating the manufacturing process of the semiconductor device, which is subsequent to FIG. 49.

Next, as shown in FIG. 50, over the semiconductor substrate SB, using, e.g., a CVD method, an insulating film IF5 is formed. The insulating film IF5 is made of, e.g., a silicon nitride film and covers the side and upper surfaces of the insulating film IF4 and the upper surface of the semiconductor film S13 via the foregoing multi-layer film.

Figure 51:
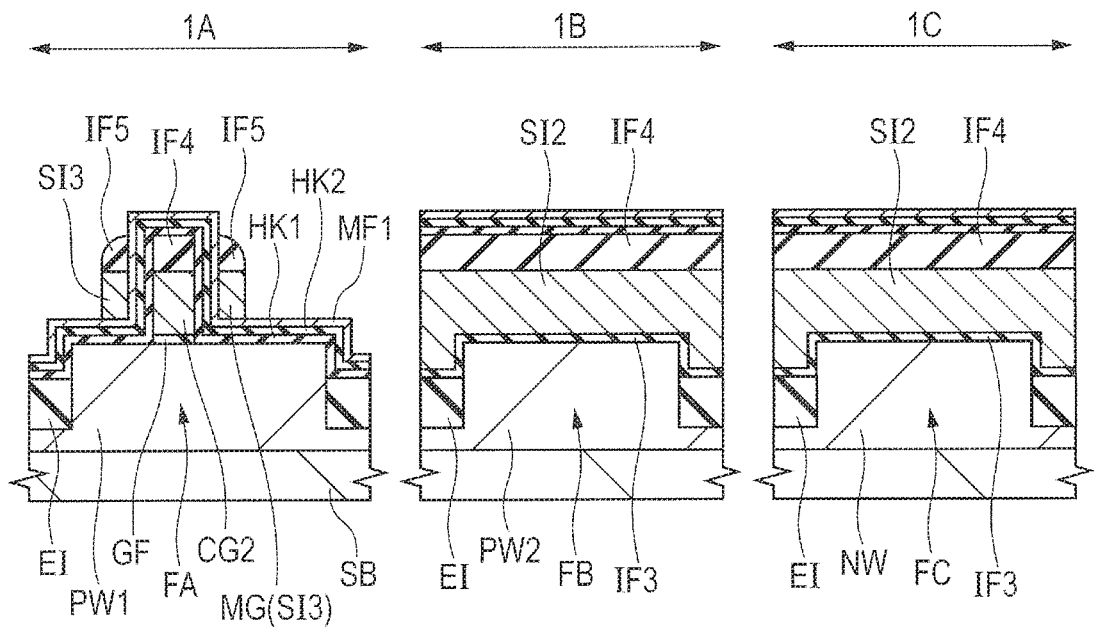
FIG. 51 is a cross-sectional view illustrating the manufacturing process of the semiconductor device, which is subsequent to FIG. 50.

Next, as shown in FIG. 51, dry etching is performed to partly remove the insulating film IF5 and thus partly expose the upper surface of the foregoing multi-layer film and the upper surface of the semiconductor film S13. As a result, the insulating film IF5 remains in a sidewall-like shape over each of the side surfaces of the insulating film IF4 via the foregoing multi-layer film. Subsequently, etching is performed using the insulating film IF5 as a mask to process the semiconductor film S13. As a result, the semiconductor film S13 remains in the areas close to the both side surfaces of the control gate electrode CG2, while the upper surface of the fin FA is exposed from the semiconductor film S13 in the area other than the areas close to the both side surfaces of the control gate electrode CG2.

The semiconductor film S13 close to one of the side surfaces of the control gate electrode CG2 in the gate length direction (X-direction) via the foregoing multi-layer film forms the memory gate electrode MG. The memory gate electrode MG extends in the Y-direction in parallel with the control gate electrode CG2 so as to mount over the plurality of fins FA.

Figure 52:
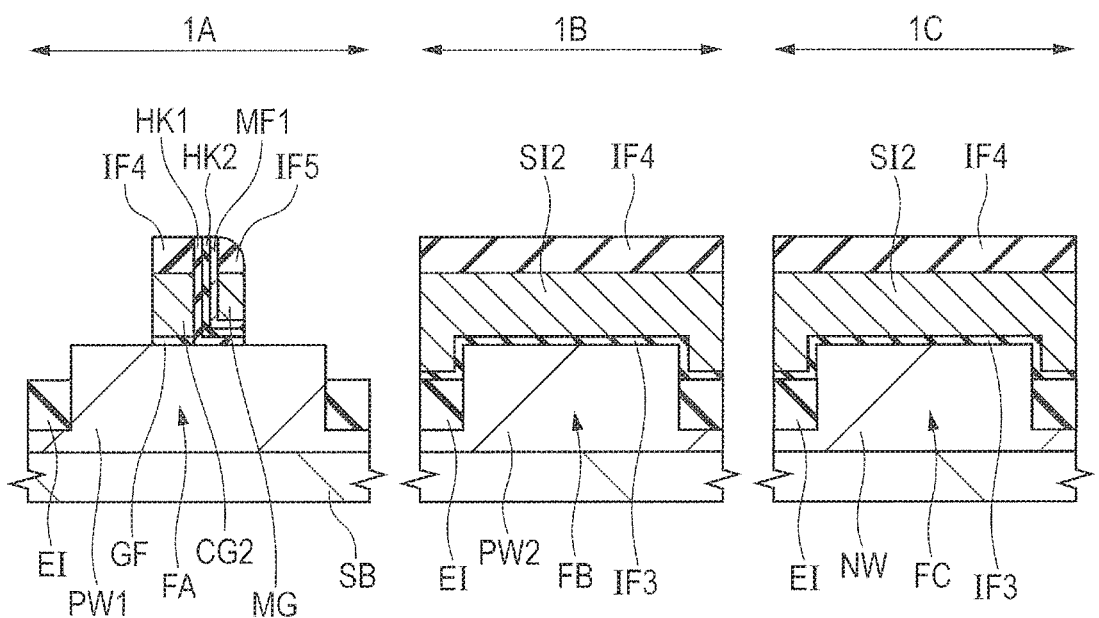
FIG. 52 is a cross-sectional view illustrating the manufacturing process of the semiconductor device, which is subsequent to FIG. 51.

Next, as shown in FIG. 52, a resist pattern (not shown) is formed to cover the memory gate electrode MG and the insulating film IF5 located immediately thereabove. Then, using the resist pattern as a mask, etching is performed to remove the insulating film IF5 and the semiconductor film S13 which are exposed from the resist pattern. As a result, over one of the side surfaces of the control gate electrode CG2 in the gate length direction, the memory gate electrode MG remains via the foregoing multi-layer film, while the other side surface of the control gate electrode CG2 is exposed from the semiconductor film S13.

Subsequently, etching is performed to remove the foregoing multi-layer film uncovered with the insulating film IF5 and the memory gate electrode MG. This exposes the upper surface of the insulating film IF4, the upper surface of the fin FA, the side surfaces of the fin FA, and the upper surface of the isolation region EI. This also exposes the side surface of the insulating film IF4 and the side surface of the control gate electrode CG2 which are uncovered with the memory gate electrode MG.

Figure 53:
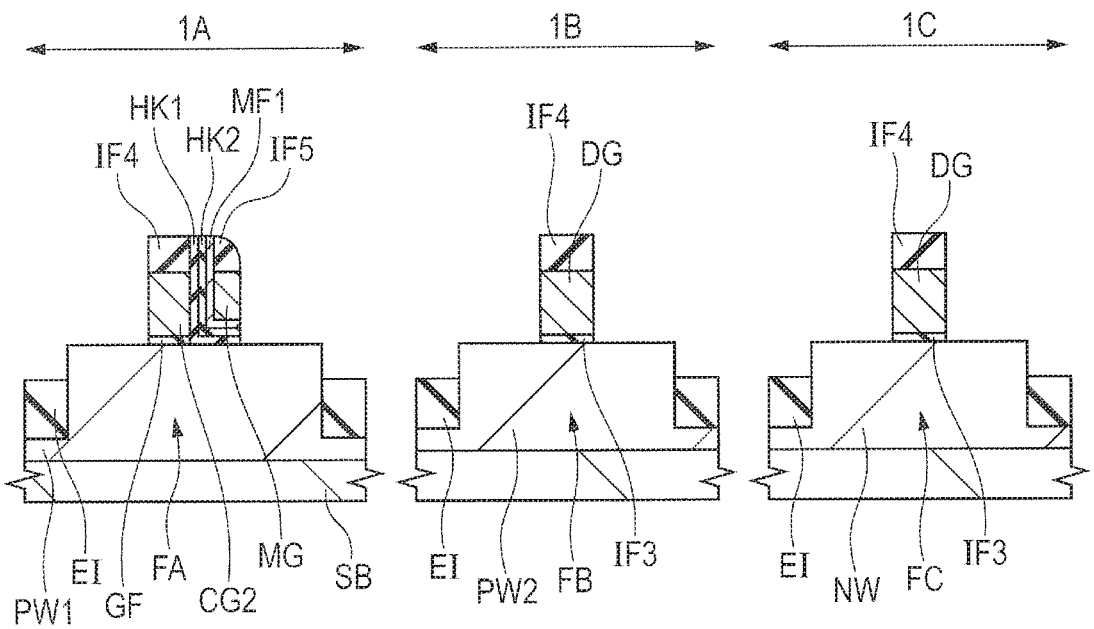
FIG. 53 is a cross-sectional view illustrating the manufacturing process of the semiconductor device, which is subsequent to FIG. 52.

Next, as shown in FIG. 53, a photoresist film (not shown) is formed to cover the memory cell region 1A and the upper surface of a portion of each of the fins FB and FC in the nMIS region 1B and the pMIS region 1C. The photoresist film includes a resist pattern formed to partly cover each of the plurality of fins FB arranged in the Y-direction (depth direction in the drawing) and extend in the Y-direction and a resist pattern formed to partly cover each of the plurality of fins FC arranged in the Y-direction and extend in the Y-direction. In the areas located lateral to the resist pattern, the respective upper surfaces of the fins FB and FC are exposed from the photoresist film.

Subsequently, using the photoresist film as a mask, etching is performed to partly remove each of the insulating film IF4 and the semiconductor film SI2 in the nMIS region 1B and the pMIS region 1C and thus expose the upper surface of the isolation region EI and the top surface of the insulating film IF3 in the nMIS region 1B and the pMIS region 1C. Consequently, the upper and side surfaces of each of the fins FB and FC are partly exposed from the insulating film IF4 and the semiconductor film SI2. Thus, over each of the fins FB and FC, a dummy gate electrode DG made of the semiconductor film SI2 is formed via the insulating film IF3.

The dummy gate electrode DG is a film to be removed in the subsequent step and replaced with a metal gate electrode, and does not remain in the completed semiconductor device. In other words, the dummy gate electrode DG is a pseudo gate electrode. Note that a description will be given herein of the case where the insulating film IF3 covering the top surface of each of the fins FB and FC exposed from the dummy gate electrodes DG is removed. Then, a silicon oxide film is formed to cover the side surfaces of the dummy gate electrodes DG, though the illustration thereof is omitted.

Figure 54:
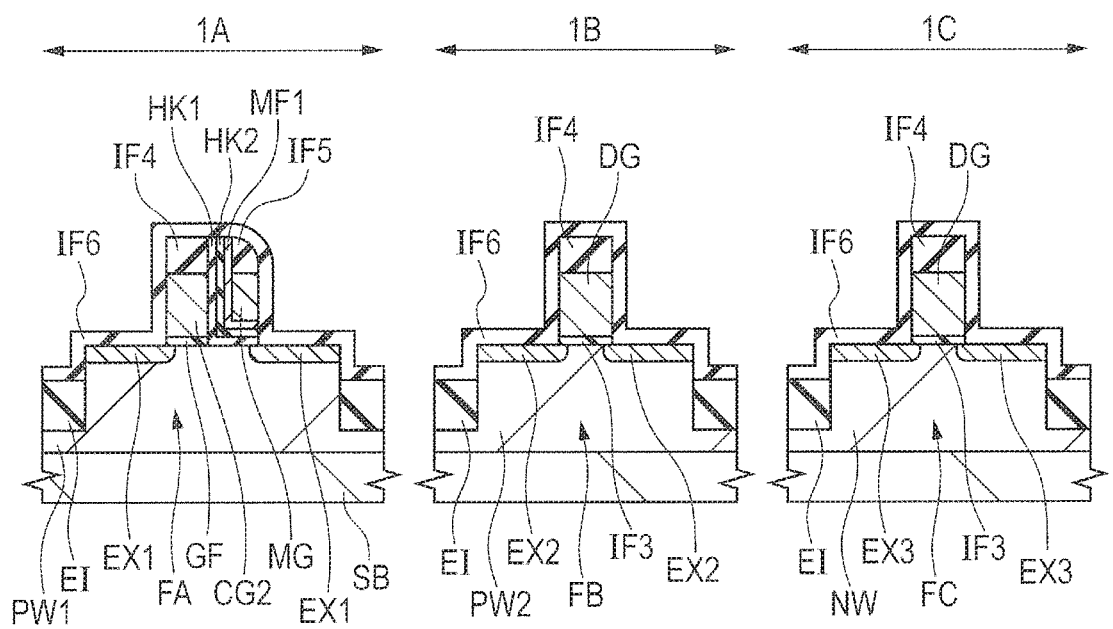
FIG. 54 is a cross-sectional view illustrating the manufacturing process of the semiconductor device, which is subsequent to FIG. 53.

Next, as shown in FIG. 54, using the insulating films IF4 and IF5, the control gate electrode CG2, the memory gate electrode MG, and the dummy gate electrodes DG as a mask, ion implantation is performed on the upper surface of each of the fins FA, FB, and FC. Thus, in the upper surface of each of the fins FA, the pair of extension regions EX1 as the n-type semiconductor regions are formed. Also, in the upper surface of each of the fins FB, the pair of extension regions EX2 as the n-type semiconductor regions are formed. Also, in the upper surface of each of the fins FC, the pair of extension regions EX3 as the p-type semiconductor regions are formed.

At least the extension regions EX3 are formed in the step different from the step of forming the extension regions EX1 and EX2. The extension regions EX1 and EX2 can be formed by implanting an n-type impurity (e.g., P (phosphorus) or As (arsenic)). The extension regions EX3 can be formed by implanting a p-type impurity (e.g., B (boron)).

Subsequently, over the semiconductor substrate SB, an insulating film IF6 is formed using, e.g., a CVD method. The insulating film IF6 is made of, e.g., a silicon nitride film. The insulating film IF6 covers the respective surfaces of the isolation region EI, the fins FA, FB, and FC, the control gate electrode CG2, the memory gate electrode MG, the dummy gate electrode DG, and the insulating films IF4 and IF5.

Figure 55:
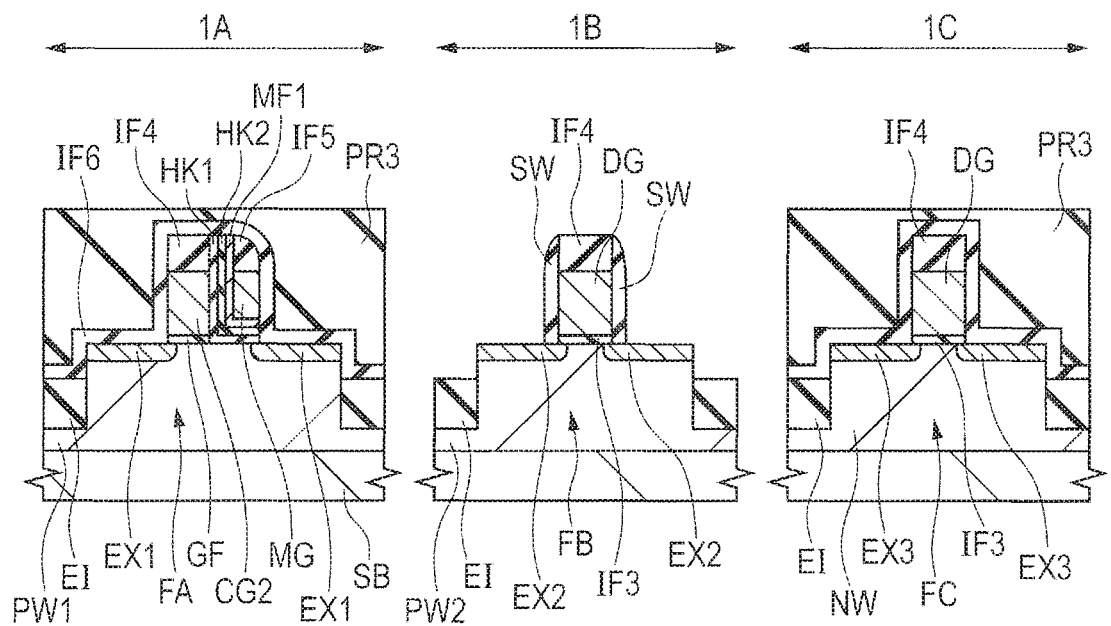
FIG. 55 is a cross-sectional view illustrating the manufacturing process of the semiconductor device, which is subsequent to FIG. 54.

Next, as shown in FIG. 55, a photoresist film PR3 is formed to expose the nMIS region 1B and cover the memory cell region 1A and the pMIS region 1C. Then, using the photoresist film PR3 as a mask, dry etching is performed to partly remove the insulating film IF6 in the nMIS region 1B and thus expose the respective upper surfaces of the isolation region EI, the fins FB, and the insulating film IF4. Over the side surfaces of a multi-layer body including the dummy gate electrode DG and the insulating film IF4 over the dummy gate electrode DG in the nMIS region 1B, the sidewall spacers SW made of the insulating film IF6 are formed.

At this time, it may also be possible to form sidewalls made of the insulating film IF6 over the side surfaces of each of the fins FB, but the illustration of the sidewalls formed over the side surfaces of the fin FB is omitted in the drawing. Even in the case where sidewalls are formed over the respective side surfaces of the fins FA and FC, the illustration of the sidewalls is omitted.

Figure 56:
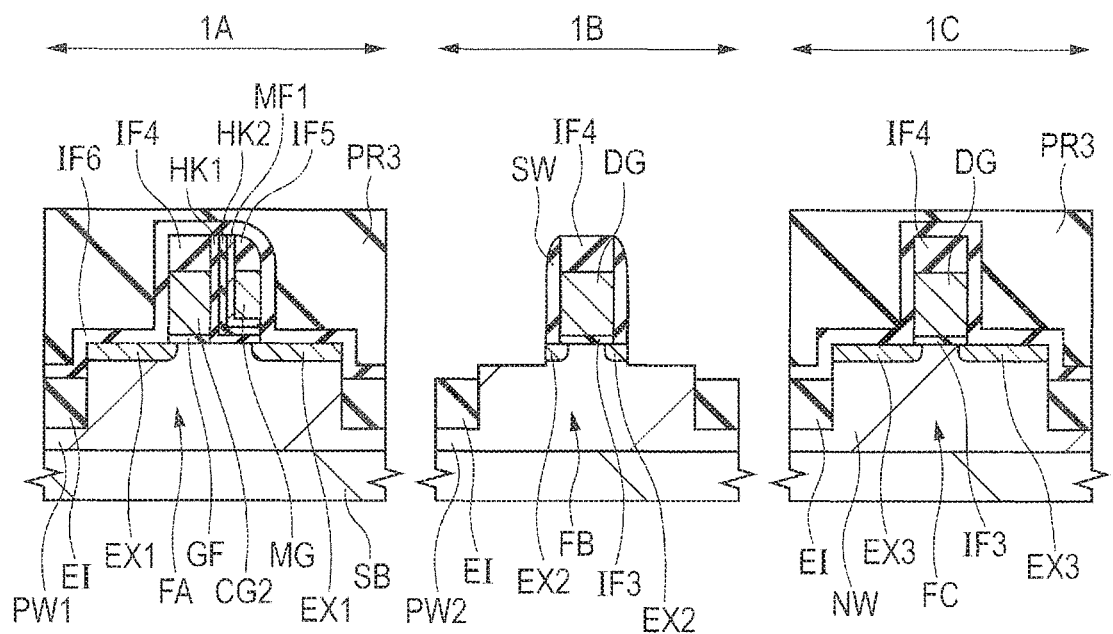
FIG. 56 is a cross-sectional view illustrating the manufacturing process of the semiconductor device, which is subsequent to FIG. 55.

Next, as shown in FIG. 56, using the photoresist film PR3, the insulating film IF4, and the sidewall spacers SW as a mask, dry etching is performed to retreat the upper surface of each of the fins FB exposed lateral to a pattern including the dummy gate electrode DG and the sidewall spacers SW in the nMIS region 1B. Thus, the upper surface of the fin FB exposed from the pattern is retreated to a position higher than that of the upper surface of the isolation region EI and lower than that of the upper surface of the fin FB immediately below the dummy gate electrode DG.

Figure 57:
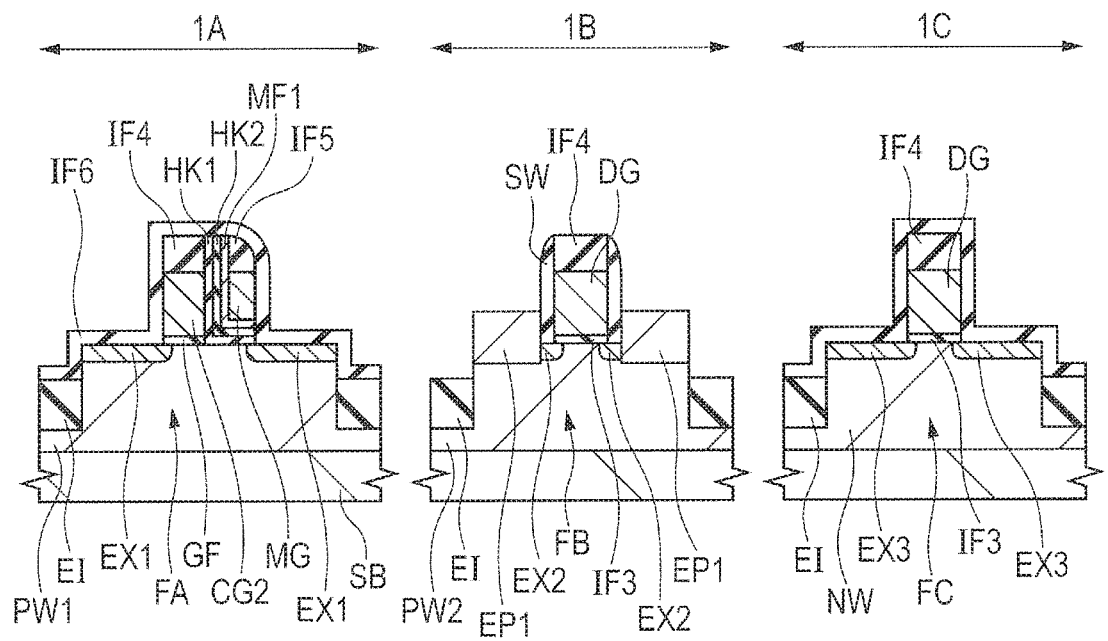
FIG. 57 is a cross-sectional view illustrating the manufacturing process of the semiconductor device, which is subsequent to FIG. 56.

Next, as shown in FIG. 57, the photoresist film PR3 is removed. Then, using an epitaxial growth method, the epitaxial layers EP1 are formed to cover the upper and side surfaces of each of the fins FB which are exposed lateral to the pattern including the dummy gate electrode DG and the sidewall spacers SW in the nMIS region 1B. The epitaxial layers EP1 are made of, e.g., Si (silicon). It may also be possible herein to form the epitaxial layers EP1 each made of, e.g., a SiP (silicon phosphide) film or a SiC (silicon carbide) film.

As described using FIG. 28, the epitaxial layers EP1 are the semiconductor layers each having the rhomboidal cross-sectional shape and covering the side surfaces of each of the fins FB in the Y-direction. In FIG. 57, the epitaxial layers EP1 do not cover the side surfaces of the fin FB in the X-direction, but the epitaxial layers EP1 may also cover the side surfaces. It is conceivable that, in the case where the side surfaces of the fin FB in the X-direction are covered with silicon oxide films or the like, the side surfaces are uncovered with the epitaxial layers EP1.

Figure 58:
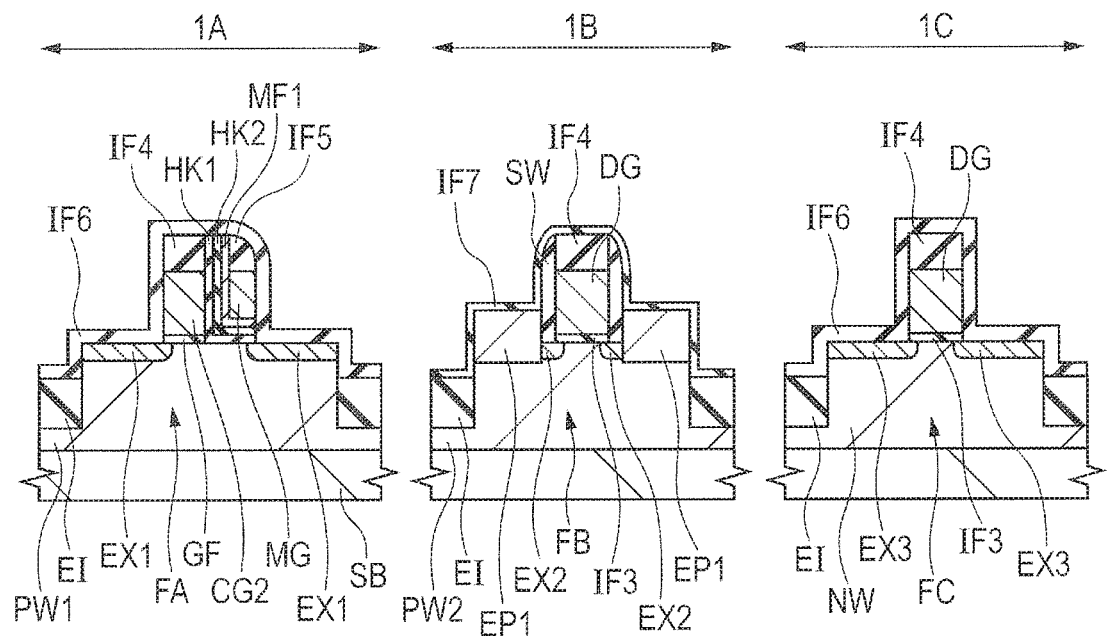
FIG. 58 is a cross-sectional view illustrating the manufacturing process of the semiconductor device, which is subsequent to FIG. 57.

Next, as shown in FIG. 58, over the semiconductor substrate, an insulating film IF7 made of, e.g., a silicon nitride film is formed. The insulating film IF7 can be formed using, e.g., a CVD method. In the memory cell region 1A and the pMIS region 1C, the insulating film IF7 is formed so as to cover the top surface of the insulating film IF6. However, in the drawing, the illustration of the insulating film IF7 in the memory cell region 1A and the pMIS region 1C is omitted on the assumption that the insulating film IF7 is integrated with the insulating film IF6.

Figure 59:
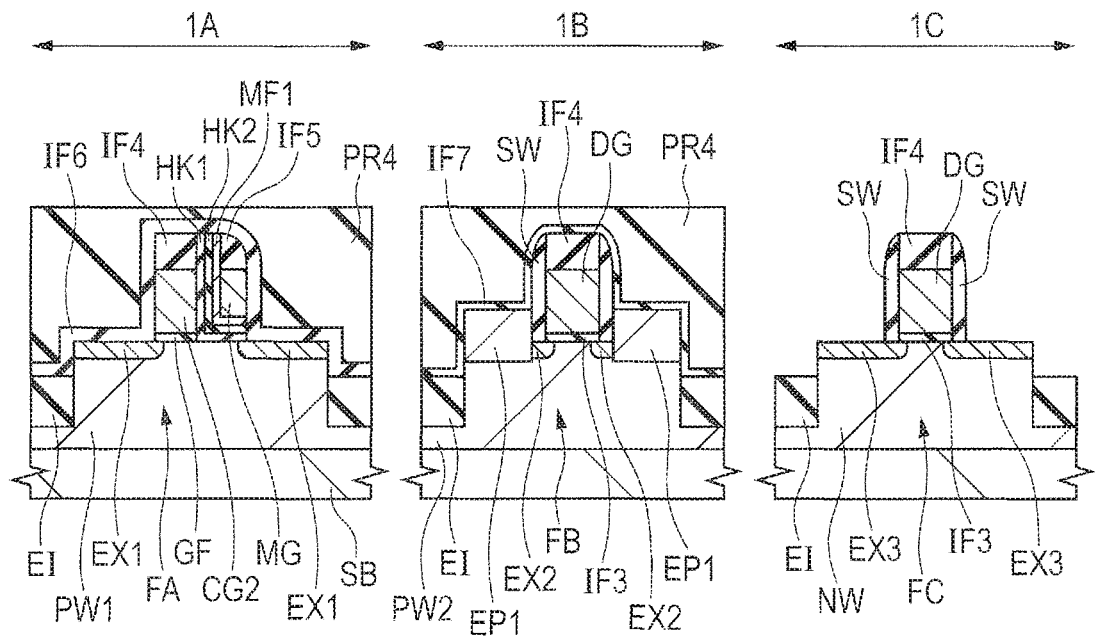
FIG. 59 is a cross-sectional view illustrating the manufacturing process of the semiconductor device, which is subsequent to FIG. 58.

Next, as shown in FIG. 59, a photoresist film PR4 is formed to expose the pMIS region 1C and cover the memory cell region 1A and the nMIS region 1B. Then, using the photoresist film PR4 as a mask, dry etching is performed to partly remove the insulating film IF6 in the pMIS region 1C and thus expose the respective upper surfaces of the isolation region EI, the fins FC, and the insulating film IF4. Over the side surfaces of a multi-layer body including the dummy gate electrode DG and the insulating film IF4 over the dummy gate electrode DG in the pMIS region 1C, the sidewall spacers SW made of the insulating film IF6 are formed.

Figure 60:
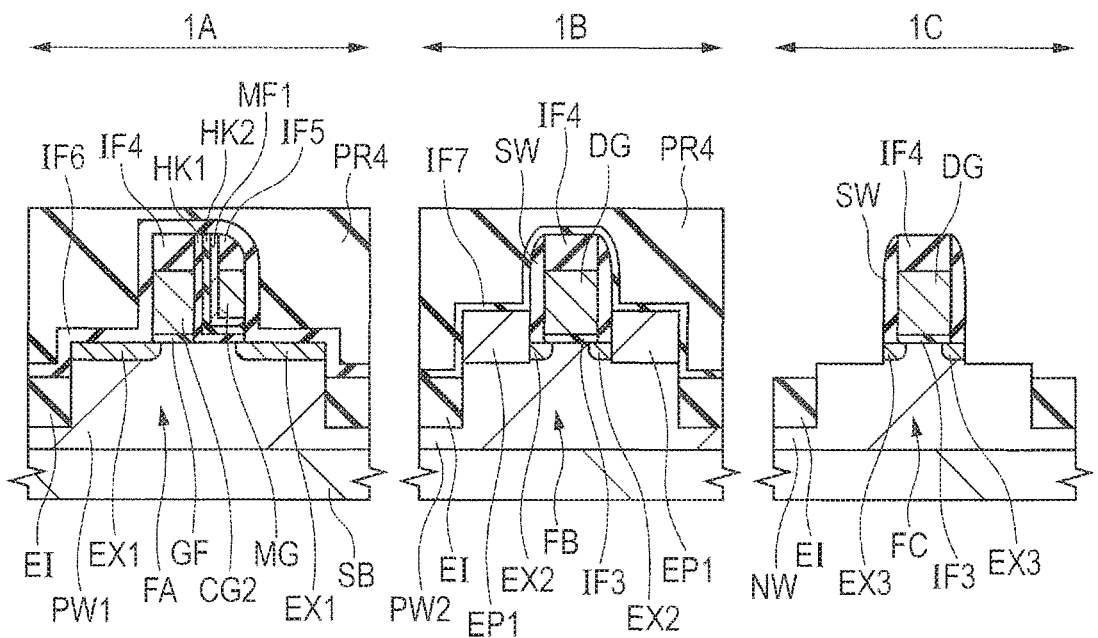
FIG. 60 is a cross-sectional view illustrating the manufacturing process of the semiconductor device, which is subsequent to FIG. 59.

Next, as shown in FIG. 60, using the photoresist film PR4, the insulating film IF4, and the sidewall spacers SW as a mask, dry etching is performed to retreat the upper surface of each of the fins FC exposed lateral to a pattern including the dummy gate electrode DG and the sidewall spacers SW in the pMIS region 1C. Thus, the upper surface of the fin FC exposed from the pattern is retreated to a position higher than that of the upper surface of the isolation region EI and lower than that of the upper surface of the fin FC immediately below the dummy gate electrode DG.

Figure 61:
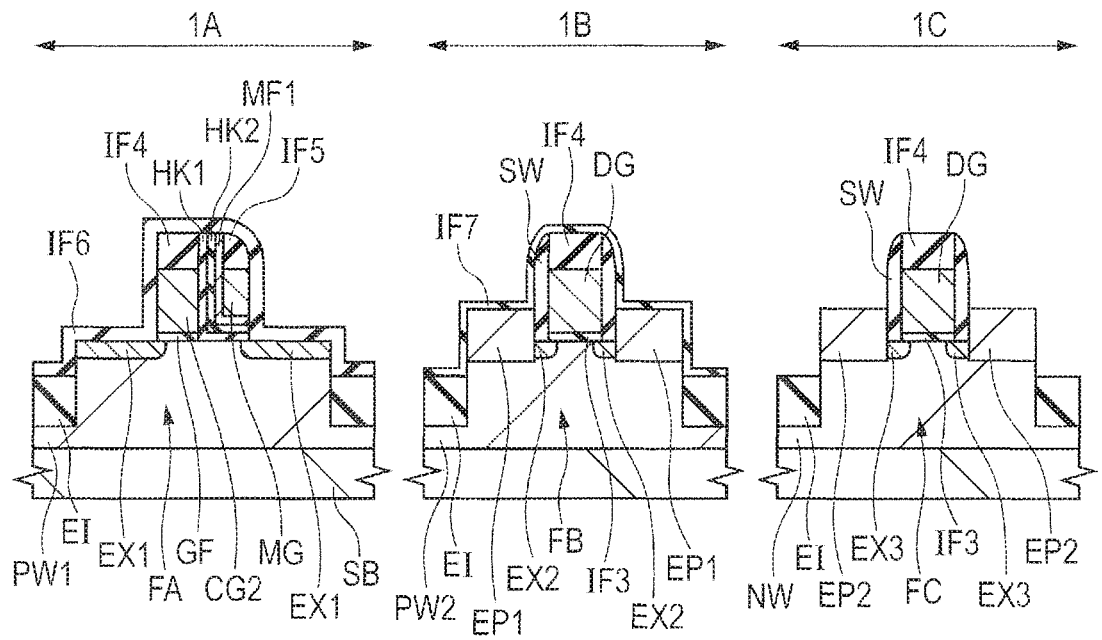
FIG. 61 is a cross-sectional view illustrating the manufacturing process of the semiconductor device, which is subsequent to FIG. 60.

Next, as shown in FIG. 61, the photoresist film PR4 is removed. Then, using an epitaxial growth method, the epitaxial layers EP2 are formed to cover the upper and side surfaces of each of the fins FC which are exposed lateral to the pattern including the dummy gate electrode DG and the sidewall spacers SW in the pMIS region 1C. The epitaxial layers EP2 are made of, e.g., SiGe (silicon germanium).

As described using FIG. 28, the epitaxial layers EP2 are the semiconductor layers each having the rhomboidal cross-sectional shape and covering the side surfaces of each of the fins FC in the Y-direction. In FIG. 61, the epitaxial layers EP2 do not cover the side surfaces of the fin FC in the X-direction, but the epitaxial layers EP2 may also cover the side surfaces. It is conceivable that, in the case where the side surfaces of the fin FC in the X-direction are covered with silicon oxide films or the like, the side surfaces are uncovered with the epitaxial layers EP2.

Figure 62:
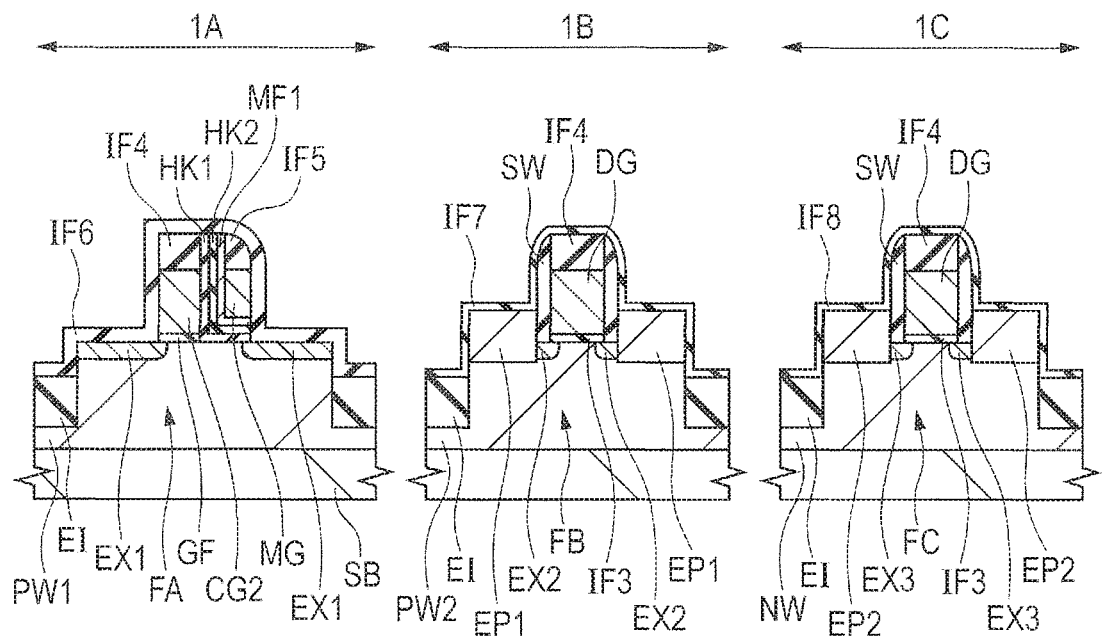
FIG. 62 is a cross-sectional view illustrating the manufacturing process of the semiconductor device, which is subsequent to FIG. 61.

Next, as shown in FIG. 62, over the semiconductor substrate, an insulating film IF8 made of, e.g., a silicon nitride film is formed. The insulating film IF8 can be formed using, e.g., a CVD method. The insulating film IF8 is formed so as to cover the top surface of the insulating film IF6 in the memory cell region 1A and cover the top surface of the insulating film IF7 in the nMIS region 1B. However, in the drawing, the illustration of the insulating film IF8 in the memory cell region 1A and the nMIS region 1B is omitted on the assumption that the insulating film IF8 is integrated with the insulating film IF6 in the memory cell region 1A and with the insulating film IF7 in the nMIS region 1B.

Figure 63:
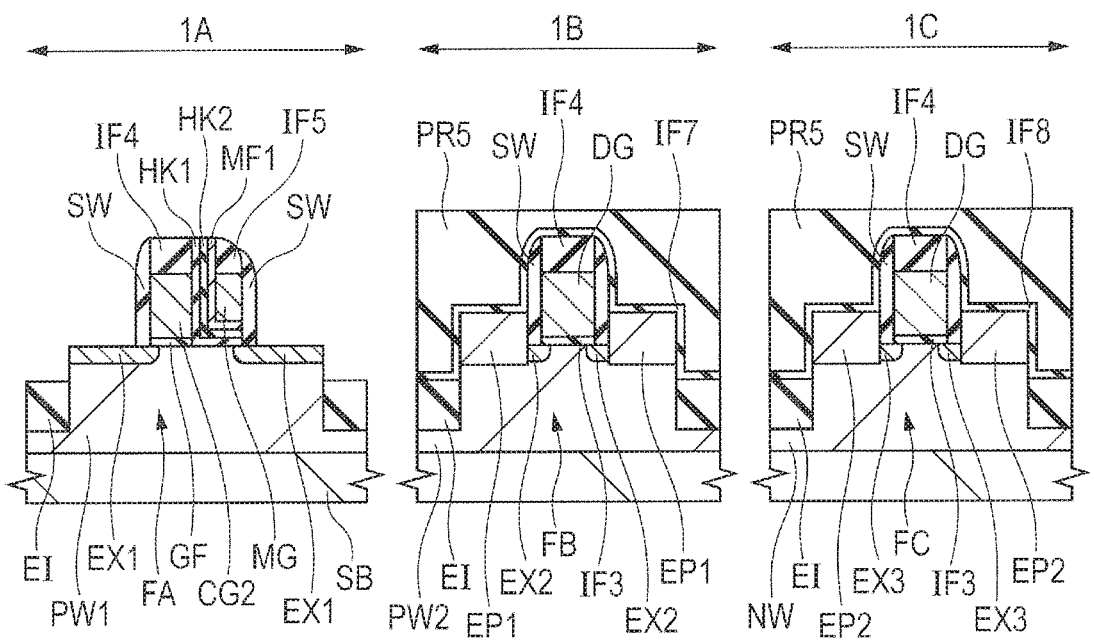
FIG. 63 is a cross-sectional view illustrating the manufacturing process of the semiconductor device, which is subsequent to FIG. 62.

Next, as shown in FIG. 63, a photoresist film PR5 is formed to cover the nMIS region 1B and the pMIS region 1C and expose the memory cell region 1A. Then, using the photoresist film PR5 as a mask, dry etching is performed to partly remove the insulating film IF6 in the memory cell region 1A and thus expose the respective upper surfaces of the isolation region EI, the fins FA, and the insulating films IF4 and IF5. Over the side surfaces of a multi-layer body including the control gate electrode CG2, the memory gate electrode MG, and the insulating films IF4 and IF5 in the memory cell region 1A, the sidewall spacers SW made of the insulating film IF6 are formed.

Figure 64:
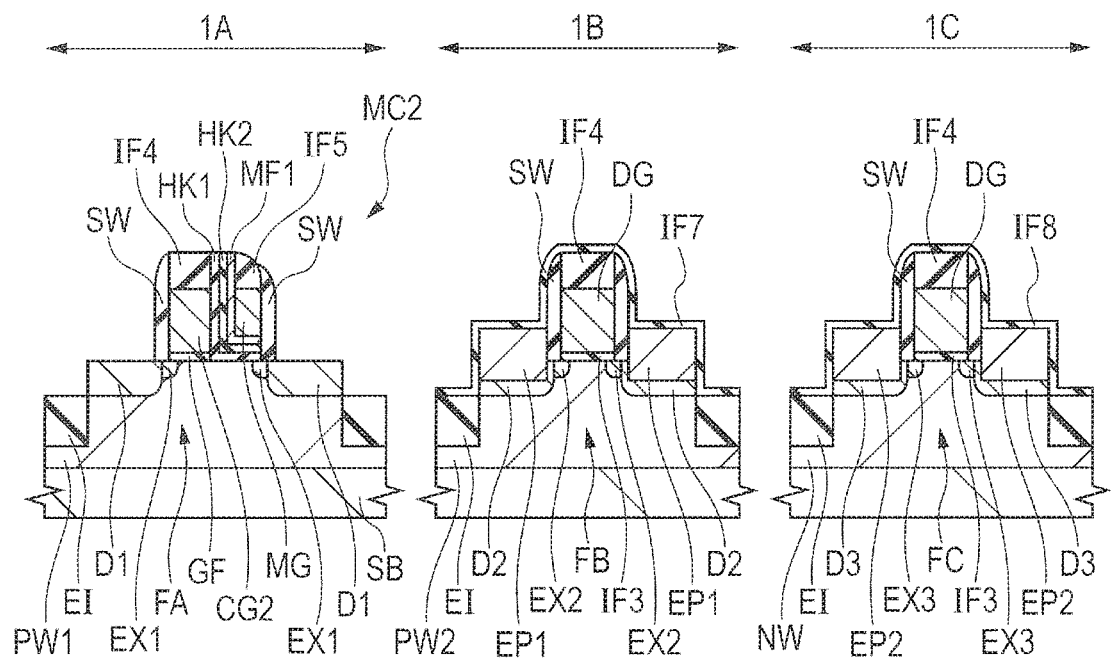
FIG. 64 is a cross-sectional view illustrating the manufacturing process of the semiconductor device, which is subsequent to FIG. 63.

Next, as shown in FIG. 64, the photoresist film PR5 is removed. Then, using the insulating films IF4 and IF5, the dummy gate electrodes DG, the control gate electrode CG, the memory gate electrode MG, and the sidewall spacers SW as a mask, ion implantation is performed on the upper surfaces of the fins FA, FB, and FC. Thus, in the upper surface of each of the fins FA, the pair of diffusion regions D1 as the n-type semiconductor regions are formed. In the upper surface of each of the fins FB, the pair of diffusion regions D2 as the n-type semiconductor regions are formed. In the upper surface of each of the fins FC, the pair of diffusion regions D3 as the p-type semiconductor regions are formed. In the nMIS region 1B and the pMIS region 1C, impurities are implanted herein into the fins FB and FC through the insulating films IF7 and IF8.

At least the diffusion regions D3 are formed in the step different from the step of forming the diffusion regions D1 and D2. The diffusion regions D1 and D2 can be formed by implanting an n-type impurity (e.g., P (phosphorus) or As (arsenic)). The diffusion regions D3 can be formed by implanting a p-type impurity (e.g., B (boron)). In the step of forming the diffusion regions D1 and D2, ion implantation is performed at an impurity concentration higher than that in the ion implantation step performed when the extension regions EX1 and EX2 are formed. In the step of forming the diffusion regions D3, ion implantation is performed at an impurity concentration higher than that in the ion implantation step performed when the extension regions EX3 are formed.

Thus, the source and drain regions including the diffusion regions D1 and the extension regions EX1, the source and drain regions including the diffusion regions D2 and the extension regions EX2, and the source and drain regions including the diffusion regions D3 and the extension regions EX3 are formed. In this ion implantation step, the diffusion regions D2 are formed in both of the epitaxial layers EP1 and the fin FB located under the epitaxial layers EP1, while the diffusion regions D3 are formed in both of the epitaxial layers EP2 and the fin FC located under the epitaxial layers EP2.

In the memory cell region 1A, the source and drain regions and the control gate electrode CG2 are included in the control transistor, while the source and drain regions and the memory gate electrode MG are included in the memory transistor. The control transistor and the memory transistor are included in the memory cell MC2.

The diffusion regions D1 to D3 are formed herein after the formation of the epitaxial layers EP1 and EP2. However, the diffusion regions D2 may also be formed after the formation of, e.g., the sidewall spacers SW described using FIG. 55 and before the etching step described using FIG. 56. The diffusion regions D3 may also be formed after the formation of, e.g., the sidewall spacers SW described using FIG. 59 and before the etching step described using FIG. 60.

Figure 65:
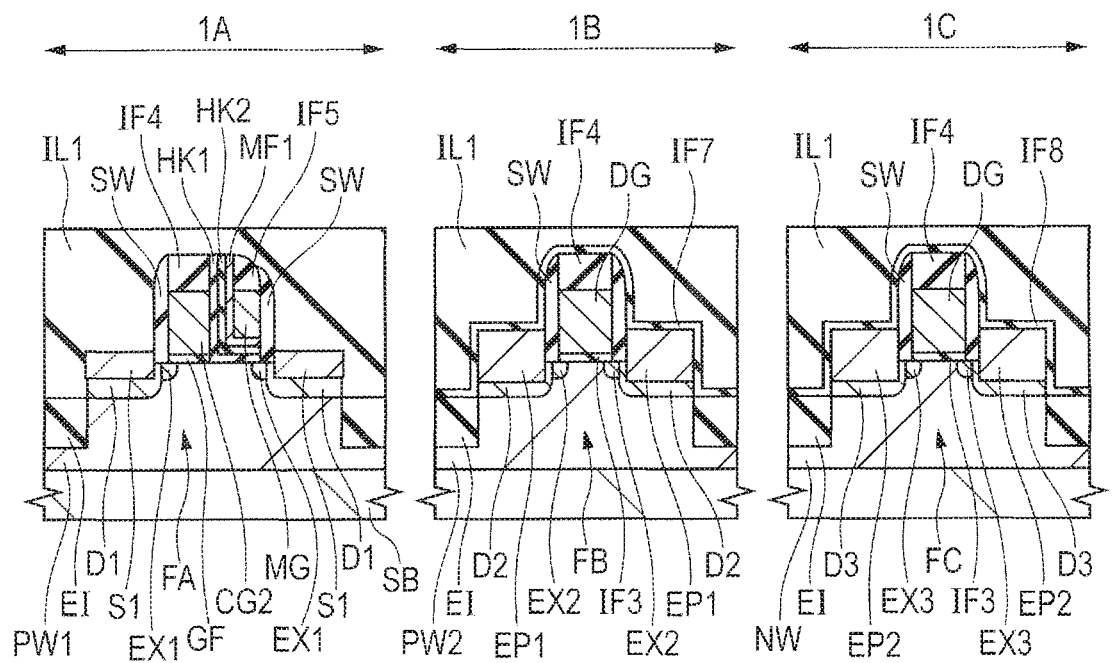
FIG. 65 is a cross-sectional view illustrating the manufacturing process of the semiconductor device, which is subsequent to FIG. 64.

Next, as shown in FIG. 65, by a known salicide process, the silicide layers S1 are formed to cover the source and drain regions formed in each of the fins FA in the memory cell region 1A. The silicide layers S1 formed herein cover the side and upper surfaces of the fin FA. In the nMIS region 1B and the pMIS region 1C, the fins FB and FC, the epitaxial layers EP1 and EP2, and the like are covered with the insulating films (protective films) IF7 and IF8 so that the respective surfaces of the fins FB and FC and the epitaxial layers EP1 and EP2 are protected from being silicidized. The positions of the uppermost surfaces of the silicide layers S1 are lower in level than those of the uppermost surfaces of the epitaxial layers EP1 and EP2.

Subsequently, over the main surface of the semiconductor substrate SB, a liner film (not shown) made of, e.g., a silicon nitride film and the interlayer insulating film IL1 made of a silicon oxide film are formed in this order. The liner film and the interlayer insulating film IL1 can be formed by, e.g., a CVD method. The interlayer insulating film IL1 has a thickness larger than the total height of each of the fins FA over the isolation region EI and a multi-layer body including the control gate electrode CG2 and the insulating film IF4. Then, using, e.g., a CMP method, the upper surface of the interlayer insulating film IL1 is planarized.

Figure 66:
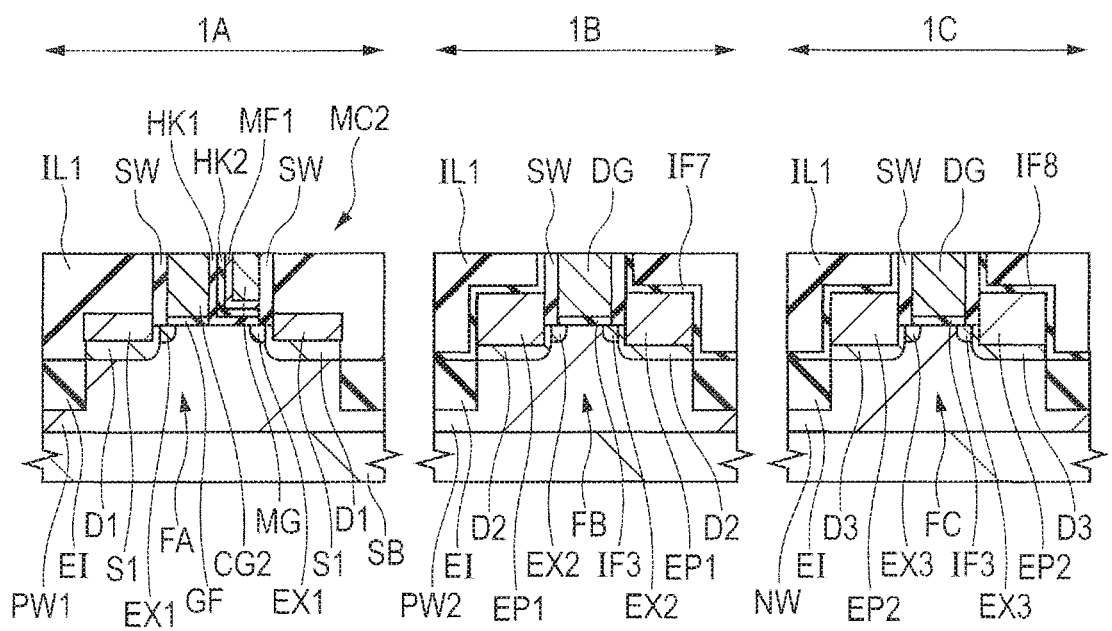
FIG. 66 is a cross-sectional view illustrating the manufacturing process of the semiconductor device, which is subsequent to FIG. 65.

Next, as shown in FIG. 66, using, e.g., a CMP method, polishing is performed on the upper surface of the interlayer insulating film IL1, the insulating films IF4 and IF5, and the sidewall spacers SW to expose the respective upper surfaces of the dummy gate electrodes DG in the nMIS region 1B and the pMIS region 1C. Thus, the insulating films IF4 and IF5 are removed to expose the respective upper surfaces of the control gate electrode CG2 and the memory gate electrode MG.

Figure 67:
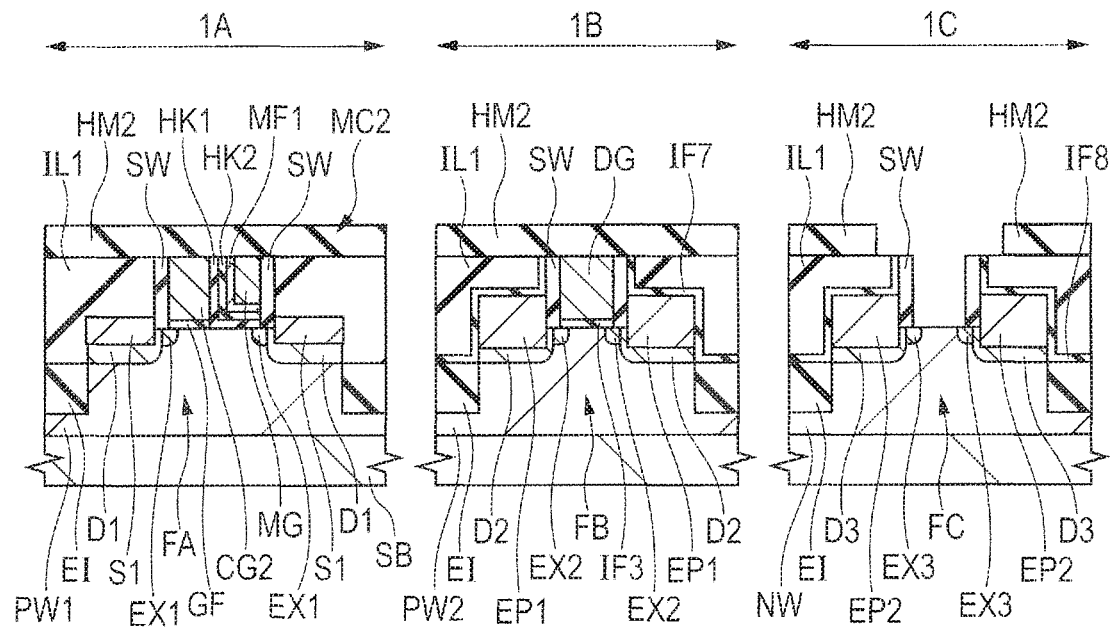
FIG. 67 is a cross-sectional view illustrating the manufacturing process of the semiconductor device, which is subsequent to FIG. 66.

Next, as shown in FIG. 67, the step of removing the dummy gate electrode DG exposed in the pMIS region 1C is performed. Specifically, after a hard mask HM2 is formed over the semiconductor substrate SB by, e.g., a CVD method, using a photolithographic technique and an etching method, the hard mask HM2 is removed from the pMIS region 1C to expose the dummy gate electrode DG in the pMIS region 1C. The hard mask HM2 is made of, e.g., a silicon oxide film or a TiN (titanium nitride) film. The respective gate electrodes in the nMIS region 1B and the memory cell region 1A are covered with the hard mask HM2.

Subsequently, the dummy gate electrode DG exposed from the hard mask HM2 is removed by wet etching. The insulating film IF3 under the dummy gate electrode DG is also removed herein, but the insulating film IF3 may also be left. Alternatively, after the insulating film IF3 is removed, an insulating film may also be formed to cover the bottom surface of a trench formed by removing the dummy gate electrode DG.

Figure 68:
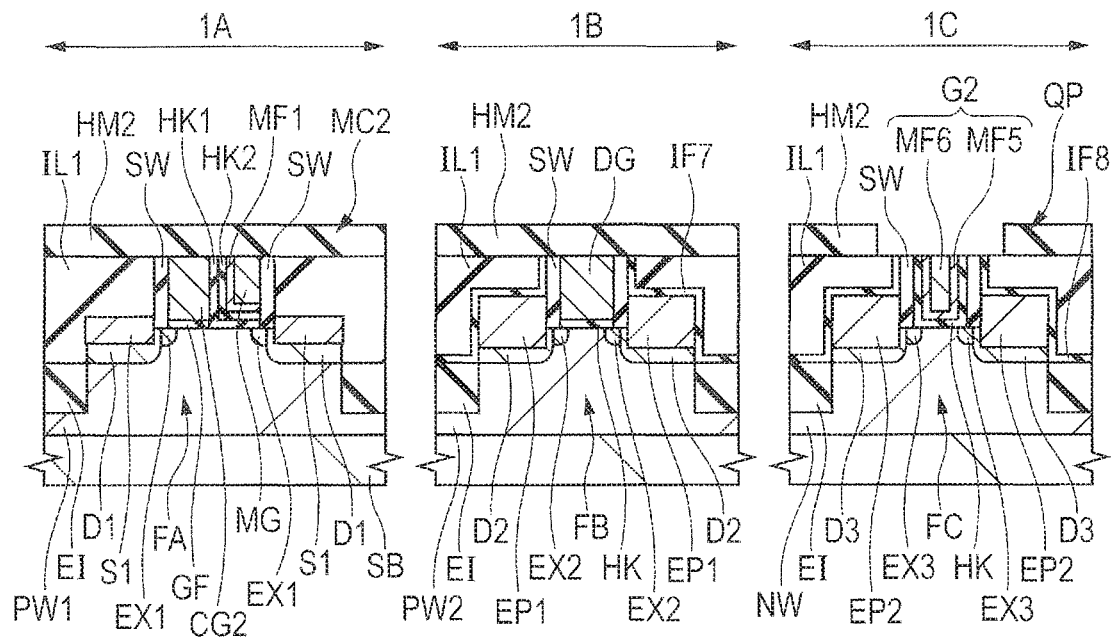
FIG. 68 is a cross-sectional view illustrating the manufacturing process of the semiconductor device, which is subsequent to FIG. 67.

Next, as shown in FIG. 68, in the trench, the insulating film HK as the gate insulating film and the gate electrode G2 as the metal gate electrode are formed. Specifically, first, over the semiconductor substrate SB including the hard mask HM2, the insulating film HK and the metal films MF5 and MF6 are formed in this order using, e.g., a CVD method and a sputtering method. The insulating film HK is a high-k film having a dielectric constant higher than that of a silicon nitride film. The insulating film HK is made of a hafnium oxide film herein, but may also be formed of another metal oxide film such as a zirconium oxide film, an aluminum oxide film, a tantalum oxide film, or a lanthanum oxide film.

The metal film MF5 is made of a titanium nitride (TiN) film herein but, as the meta film MF5, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium aluminum (TiAl) film, or the like may also be used instead. The metal film MF6 is made of, e.g., an aluminum (Al) film.

The trench formed by removing the dummy gate electrode DG from the pMIS region 1C is completely filled with a multi-layer film including the insulating film HK and the metal films MF5 and MF6. Then, the unneeded films over the interlayer insulating film IL1 are removed by, e.g., a CMP method to expose the upper surface of the interlayer insulating film IL1 in the pMIS region 1C and thus form the gate insulating film made of the insulating film HK embedded in the trench and the gate electrode G2 including the metal films MF5 and MF6 embedded in the trench. Thus, the p-type transistor QP including the gate electrode G2 and the source and drain regions in the pMIS region 1C is formed.

Figure 69:
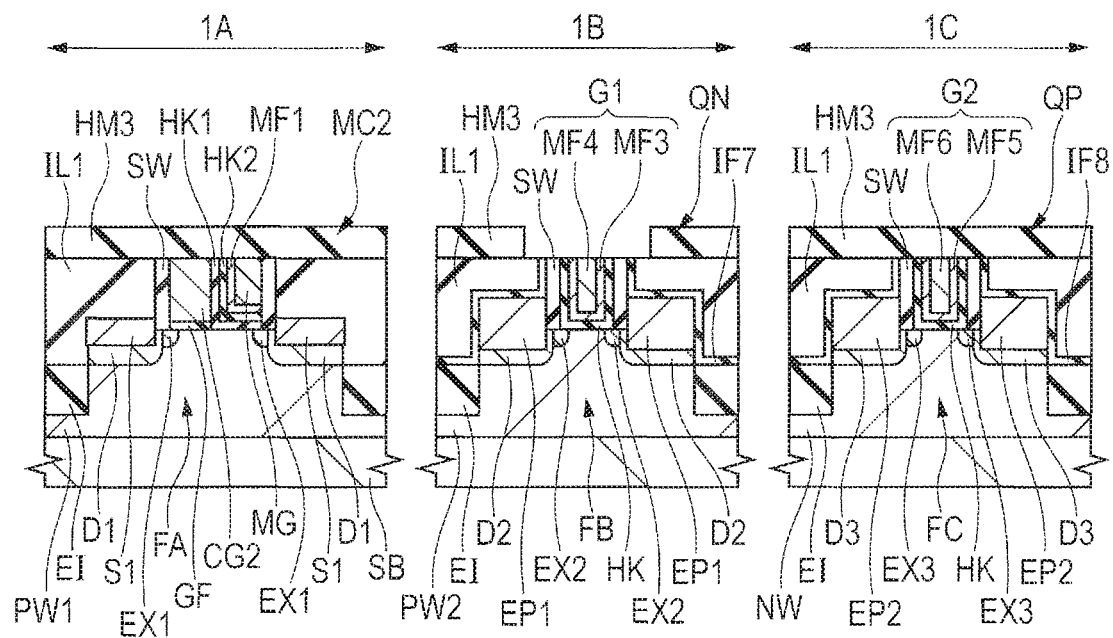
FIG. 69 is a cross-sectional view illustrating the manufacturing process of the semiconductor device, which is subsequent to FIG. 68.

Next, as shown in FIG. 69, the step of removing the dummy gate electrode DG exposed in the nMIS region 1B is performed. Specifically, the hard mask HM2 is removed, and subsequently a hard mask HM3 is formed over the semiconductor substrate SB by, e.g., a CVD method. Then, using a photolithographic technique and an etching method, the hard mask HM3 is removed from the nMIS region 1B to expose the dummy gate electrode DG in the nMIS region 1B. The hard mask HM3 is made of, e.g., a silicon oxide film or a TiN (titanium nitride) film. The respective gate electrodes in the pMIS region 1C and the memory cell region 1A are covered with the hard mask HM3.

Subsequently, the dummy gate electrode DG exposed from the hard mask HM3 is removed by wet etching. The insulating film IF3 under the dummy gate electrode DG is also removed herein, but the insulating film IF3 may also be left. Alternatively, after the insulating film IF3 is removed, an insulating film may also be formed to cover the bottom surface of a trench formed by removing the dummy gate electrode DG.

Subsequently, in the trench, the insulating film HK as the gate insulating film and the gate electrode G1 as the metal gate electrode are formed. Specifically, first, over the semiconductor substrate SB including the hard mask HM3, using, e.g., a CVD method and a sputtering method, the insulating film HK and the metal films MF3 and MF4 are formed in this order. The insulating film HK is a high-k film having a dielectric constant higher than that of a silicon nitride film. The insulating film HK is made of a hafnium oxide film herein, but may also be formed of another metal oxide film such as a zirconium oxide film, an aluminum oxide film, a tantalum oxide film, or a lanthanum oxide film.

The metal film MF3 is made of a titanium aluminum (TiAl) film herein but, as the metal film MF3, a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, or the like may also be used instead. The metal film MF4 is made of, e.g., an aluminum (Al) film.

The trench formed by removing the dummy gate electrode DG from the nMIS region 1B is completely filled with a multi-layer film including the insulating film HK and the metal films MF3 and MF4. Then, the unneeded films over the interlayer insulating film IL1 are removed by, e.g., a CMP method to expose the upper surface of the interlayer insulating film IL1 in the nMIS region 1B and thus form the gate insulating film made of the insulating film HK embedded in the trench and the gate electrode G1 including the metal films MF3 and MF4 embedded in the trench. Thus, the n-type transistor QN including the gate electrode G1 and the source and drain regions in the nMIS region 1B is formed.

Figure 70:
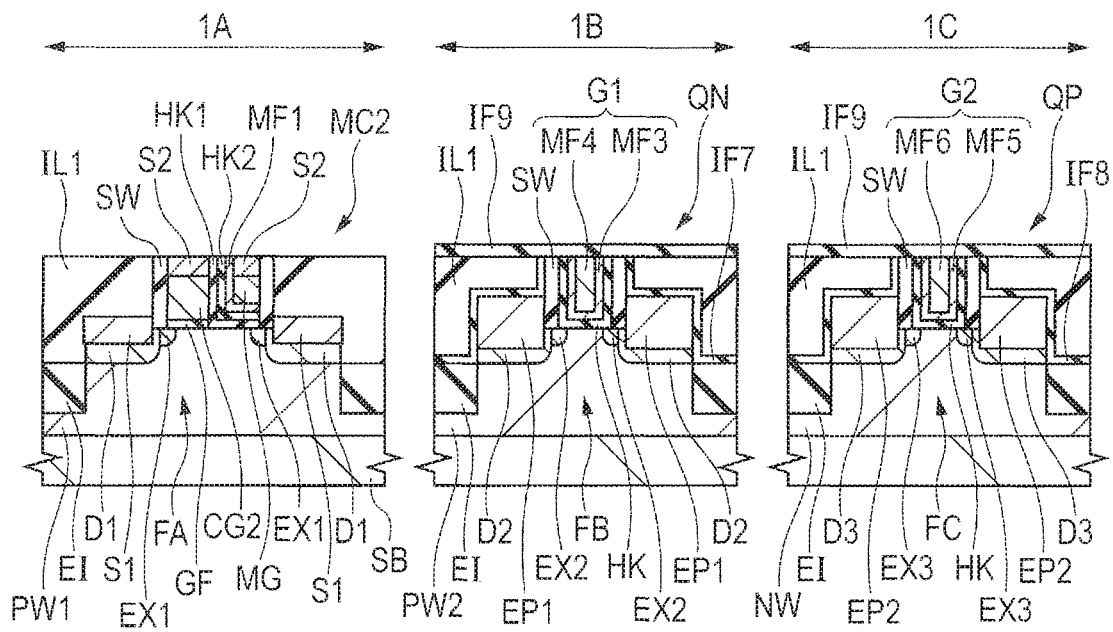
FIG. 70 is a cross-sectional view illustrating the manufacturing process of the semiconductor device, which is subsequent to FIG. 69.

Next, as shown in FIG. 70, the hard mask HM3 is removed and, subsequently, the insulating film IF9 is formed over the semiconductor substrate SB by, e.g., a CVD method. Then, using a photolithographic technique and an etching method, the insulating film IF9 is removed from the memory cell region 1A. As a result, the gate electrodes G1 and G2 in the nMIS region 1B and the pMIS region 1C are covered with the insulating film IF9, but the control gate electrode CG2 and the memory gate electrode MG are exposed from the insulating film IF9.

Subsequently, a known salicide process is performed to form the silicide layers S2 in the respective upper surfaces of the control gate electrode CG2 and the memory gate electrode MG. The silicide layers S1 and S2 are made of the same material.

Figure 71:
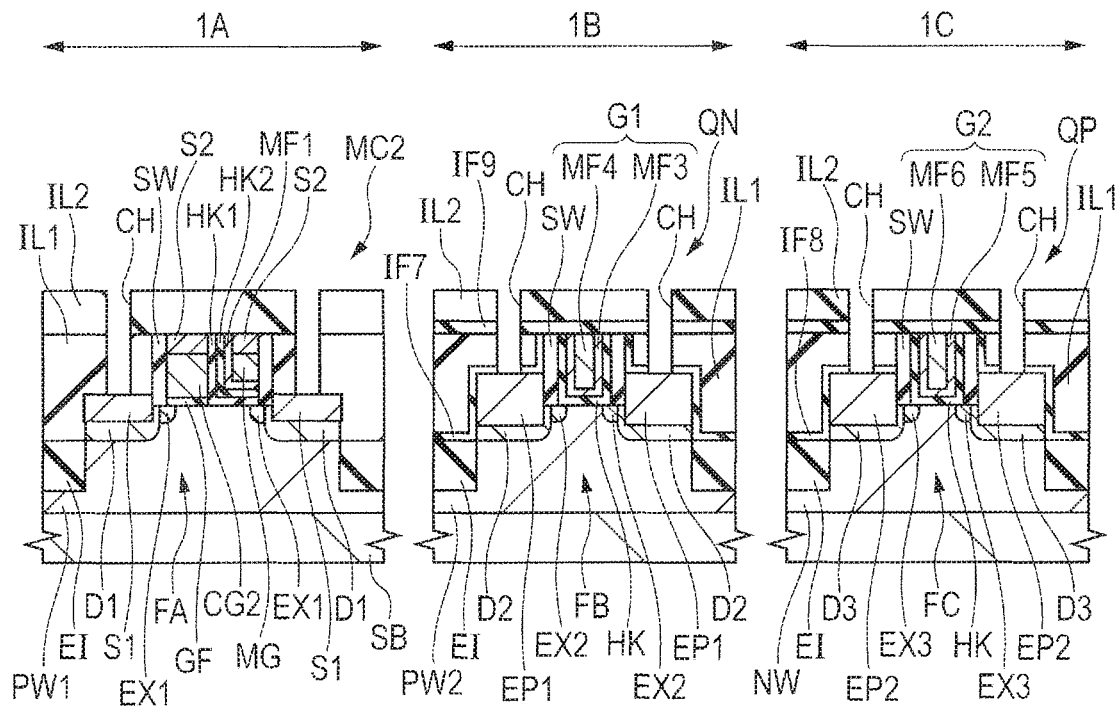
FIG. 71 is a cross-sectional view illustrating the manufacturing process of the semiconductor device, which is subsequent to FIG. 70.

Next, as shown in FIG. 71, using, e.g., a CVD method, over the semiconductor substrate SB including the insulating film IF9, the interlayer insulating film IL2 is formed. The interlayer insulating film IL2 is made of, e.g., a silicon oxide film. Subsequently, the upper surface of the interlayer insulating film IL2 is planarized by a CMP method or the like. Subsequently, using a photolithographic technique and a dry etching method, the plurality of contact holes CH are formed to extend through the interlayer insulating films IL2 and IL1. Note that, in the nMIS region 1B and the pMIS region 1C, the contact holes CH also extend through the insulating film IF9.

In the memory cell region 1A, at the bottom portions of the contact holes CH, the upper surfaces of the silicide layers S1 immediately above the source and drain regions are partly exposed. In the nMIS region 1B, at the bottom portions of the contact holes CH, the upper surfaces of the epitaxial layers EP1 as the portions of the source and drain regions are partly exposed. In the pMIS region 1C, at the bottom portions of the contact holes CH, the upper surfaces of the epitaxial layers EP2 as the portions of the source and drain regions are partly exposed.

In the region which is not illustrated, the contact holes CH are formed to partly expose the respective upper surfaces of the gate electrodes G1 and G2, the control gate electrode CG2, and the memory gate electrode MG. These contact holes CH do not extend through the interlayer insulating film IL1. In a direction perpendicular to the main surface of the semiconductor substrate SB, the lengths of the contact holes CH immediately above the epitaxial layers EP1 and EP2 are smaller than the lengths of the contact holes CH immediately above the silicide layers S1.

Figure 72:
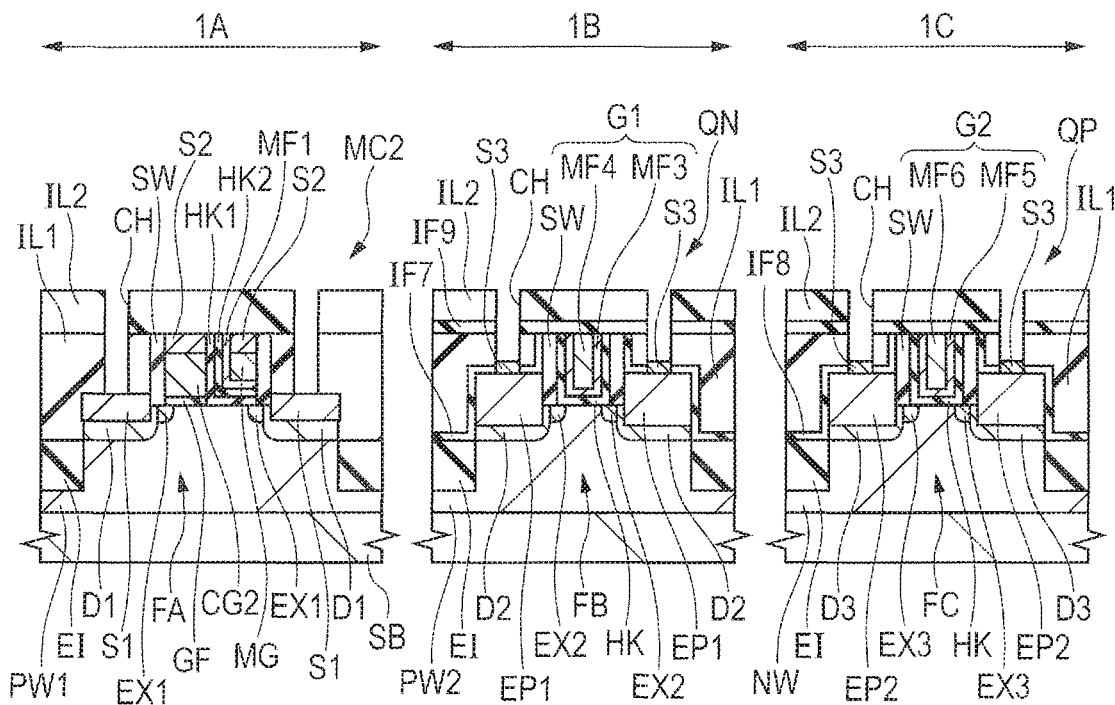
FIG. 72 is a cross-sectional view illustrating the manufacturing process of the semiconductor device, which is subsequent to FIG. 71.

Next, as shown in FIG. 72, using a known salicide process, over the respective upper surfaces of the epitaxial layers EP1 and EP2 exposed at the bottom portions of the contact holes CH in the nMIS region 1B and the pMIS region 1C, the silicide layers S3 are formed. Specifically, over the main surface of the semiconductor substrate SB including the inner portions of the contact holes CH, using, e.g., a CVD method, a metal film is formed. Then, heat treatment is performed to cause the metal film to react with the respective upper surfaces of the epitaxial layers EP1 and EP2 to form the silicide layers S3 at the bottom portions of the contact holes CH. Then the metal film is removed.

Since it is difficult herein to form a metal film in such thin openings as the contact holes CH by a sputtering method, the foregoing metal film is formed by a CVD method. However, since a Ni (nickel) film is hard to form by the CVD method, a Ti (titanium) film which is easy to form by the CVD method is formed as the metal film. Consequently, the silicide layers S3 are made of a TiSi$_2$ (titanium silicide) film. In other words, the silicide layers S3 are made of the material different from the materials of the silicide layers S1 and S2. Note that, in the step of forming the silicide layers S3, the Ti (titanium) film may also be left at the bottom portions of the contact holes CH immediately above the silicide layers S1 in the memory cell region 1A.

Figure 73:
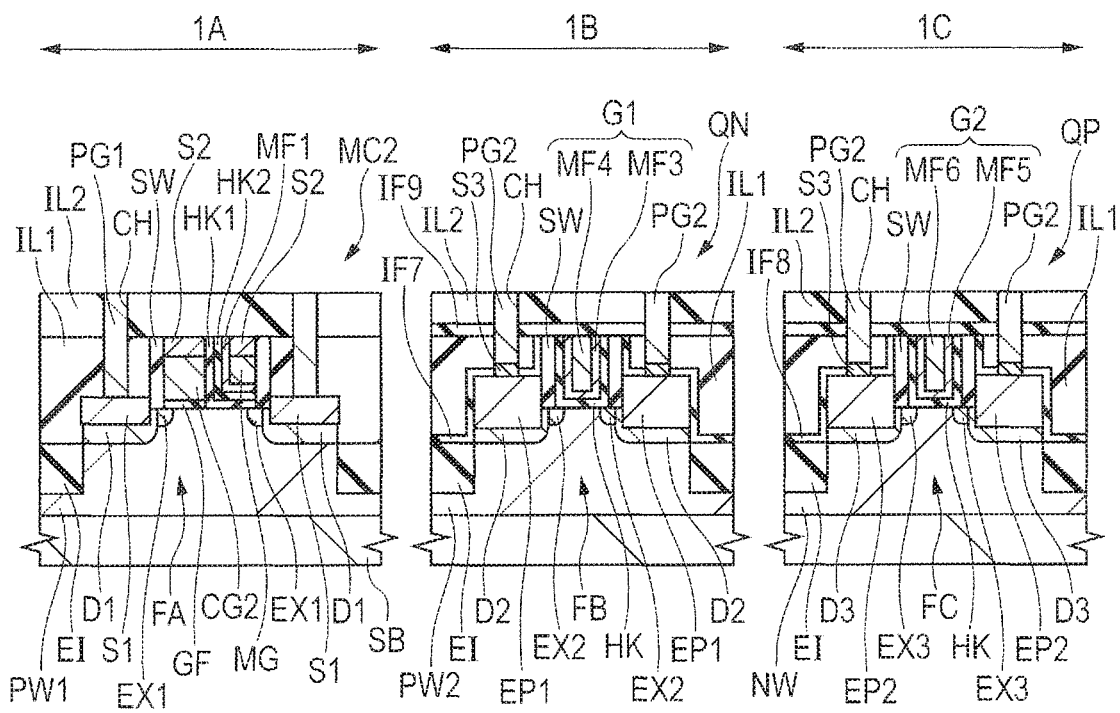
FIG. 73 is a cross-sectional view illustrating the manufacturing process of the semiconductor device, which is subsequent to FIG. 72.

Next, as shown in FIG. 73, in the contact holes CH, the conductive plugs PG1 and PG2 made of tungsten (W) or the like are formed as the coupling conductive members. Each of the plugs PG1 and PG2 has a multi-layer structure including a barrier conductor film (e.g., a titanium film, a titanium nitride film, or a multi-layer film thereof) and a main conductor film (e.g., a tungsten film) located over the barrier conductor film.

The plugs PG1 are electrically coupled to the source region and the drain region of the memory cell MC2 via the silicide layers S1. In the case where the Ti films remain over the silicide layers S1 as described above, the Ti films are interposed between the plugs PG1 and the silicide layers S1. The plugs PG2 are embedded in the contact holes CH in the nMIS region 1B and electrically coupled to the epitaxial layers EP1 via the silicide layers S3. Thus, the plugs PG2 are electrically coupled to the source and drain regions of the n-type transistor QN. The plugs PG2 are embedded in the contact holes CH in the pMIS region 1C and electrically coupled to the epitaxial layers EP2 via the silicide layers S3. Thus, the plugs PG2 are electrically coupled to the source and drain regions of the p-type transistor QP.

In a direction perpendicular to the main surface of the semiconductor substrate SB, the lengths of the contact holes CH immediately above the epitaxial layers EP1 and EP2 are smaller than the lengths of the contact holes CH immediately above the silicide layers S1. This is because the heights of the upper surfaces of the silicide layers S1 from the main surface of the semiconductor substrate SB are lower than the heights of the upper surfaces of the epitaxial layers EP1 and EP2 from the main surface of the semiconductor substrate SB.

The reason why the heights of the upper surfaces of the epitaxial layers EP1 and EP2 are higher than the heights of the upper surfaces of the silicide layers S1 is that the epitaxial layers EP1 and EP2 are formed to have large volumes and thus reduce the resistances of the source and drain regions of each of the n-type transistor QN and the p-type transistor QP. Specifically, since the silicide layers S1 in the memory cell region 1A are made of a material having a resistance value lower than that of a semiconductor layer, even when the volumes and thickness thereof are not large, it is possible to satisfactorily reduce the resistances of the source and drain regions of the memory cell MC2.

By contrast, the resistances of the epitaxial layers EP1 and EP2 are higher than those of the silicide layers S1. Accordingly, to reduce the resistances of the source and drain regions of each of the n-type transistor QN and the p-type transistor QP, it is necessary for the epitaxial layers EP1 and EP2 to have volumes and thicknesses larger than those of the silicide layers S1. In other words, by forming the epitaxial layers EP1 and EP2 such that the heights of the respective upper surfaces thereof are higher than the heights of the upper surfaces of the silicide layers S1, it is possible to reduce the resistances of the source and drain regions of each of the n-type transistor QN and the p-type transistor QP.

Note that, in the case where the metal film (titanium film) deposited to form the silicide layers S3 remains at the bottom portions of the contact holes CH over the silicide layers S1, the Ti (titanium) films are interposed between the upper surfaces of the silicide layers S1 and the plugs PG1.

Figure 74:
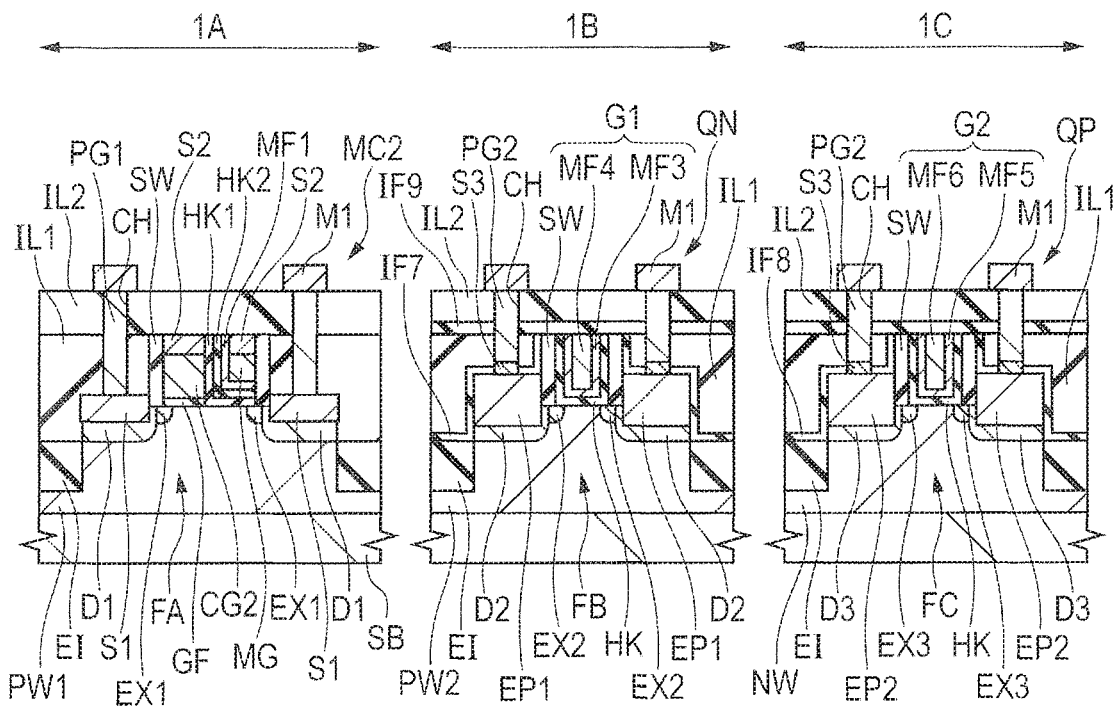
FIG. 74 is a cross-sectional view illustrating the manufacturing process of the semiconductor device, which is subsequent to FIG. 73.

Next, as shown in FIG. 74, over the interlayer insulating film IL2, the wires M1 are formed. Each of the wires M1 is made of a multi-layer structure including a barrier conductor film (such as, e.g., a titanium nitride film, a tantalum film, or a tantalum nitride film) and a main conductor film (copper film) formed over the barrier conductor film. In FIG. 3, for simpler illustration, the barrier conductor film and the main conductor film are integrally shown as each of the wires M1. The same applies also to the plugs PG1 and PG2.

The wires M1 can be formed by, e.g., a so-called single damascene method. Specifically, by forming an interlayer insulating film having wire trenches over the interlayer insulating film IL2 and embedding a metal film in the wire trenches, the wires M1 can be formed. However, the illustration of the interlayer insulating film located lateral to the wires M1 is omitted herein.

<Effects of Manufacturing Method of Semiconductor Device>

Next, a description will be given of the method of manufacturing the semiconductor device in the present second embodiment.

From the manufacturing method of the semiconductor device in the present second embodiment, the same effects as obtained from the manufacturing method of the semiconductor device in the foregoing first embodiment can be obtained. Specifically, since the paraelectric film HK1 is formed as the interfacial layer (block layer) between the ferroelectric film HK2 and the semiconductor substrate SB (fin FA), it is possible to prevent the electric field induced in the ferroelectric film HK2 from causing dielectric breakdown of the interfacial layer. Therefore, it is possible to improve the reliability of the semiconductor device.

Also, in the present second embodiment, as described using FIG. 3, the crystals GR2 in the ferroelectric film HK2 are formed larger than the crystals GR1 in the paraelectric film HK1 to allow the residual polarization in the ferroelectric film HK2 to be increased. This can reduce the operating voltage of the ferroelectric memory and improve the information retention property of the ferroelectric memory. Therefore, it is possible to improve the performance of the semiconductor device. Since the paraelectric film HK1 is formed herein as the interfacial layer in contact with the lower surface of the ferroelectric film HK2, the crystals GR2 can be formed larger than the crystals GR1.

Also, in the present second embodiment, in the step described using FIG. 47, the ferroelectric film HK2 is formed using a microwave. Specifically, in the second heat treatment described using FIGS. 12 and 13, heating is performed using the microwave having the electric field which vibrates in the direction perpendicular to the main surface of the semiconductor substrate SB. This allows an orthorhombic crystal which is polarized in the perpendicular direction to be grown in the ferroelectric film HK2. In other words, it is possible to prevent a crystal which is polarized in a direction other than the perpendicular direction from growing in the ferroelectric film HK2. As a result, the plurality of crystals included in the ferroelectric film HK2 are polarized in equal directions to allow the residual polarization in the ferroelectric film HK2 to be increased.

By performing the second heat treatment using the microwave, it is possible to achieve crystallization at a low temperature of not more than 400° C. and increase the likelihood of formation of an orthorhombic crystal in the ferroelectric film HK2 formed thereby. In other words, by increasing the ratio of the orthorhombic crystals to all the crystals included in the ferroelectric film HK2, it is possible to increase the residual polarization in the ferroelectric film HK2.

By performing the second heat treatment with the metal film MF1 being formed over the high-k film AM2 (see FIG. 11), it is possible to increase the likelihood of formation of the orthorhombic crystal in the ferroelectric film HK2.

As described above, by increasing the likelihood of formation of the orthorhombic crystal in the ferroelectric film HK2, it is possible to enhance the polarization performance of the ferroelectric film HK2. Briefly, even when the voltage applied to the control gate electrode CG1 of the memory cell MC2 is low, the ferroelectric film HK2 can be polarized to allow a reduction in the power consumption of the ferroelectric memory. In addition, the increased residual polarization allows an improvement in retention property. Therefore, it is possible to improve the performance of the semiconductor device.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

For example, in each of the foregoing first and second embodiments, the description has been given of the memory cell including the n-type transistor, but the transistor may also be formed as a p-type transistor. In that case, the conductivity types of the well, the source and drain regions, and the like each included in the transistor may appropriately be inverted.

Each of the first and second modifications of the foregoing first embodiment is also applicable to the foregoing second embodiment.

What is claimed is:

1. A semiconductor device, comprising:
   a semiconductor substrate;
   a first insulating film formed over the semiconductor substrate;
   a ferroelectric film formed over the first insulating film; and
   a first gate electrode formed over the ferroelectric film,
   wherein the ferroelectric film comprises a first hafnium oxide film,
   wherein the first insulating film has a dielectric constant higher than that of silicon nitride, and
   wherein the first insulating film is a paraelectric film comprising a second hafnium oxide film.

2. The semiconductor device according to claim 1, further comprising:
   source and drain regions formed in an upper surface of the semiconductor substrate such that the first gate electrode is interposed therebetween.

3. The semiconductor device according to claim 1, wherein the ferroelectric film has a thickness larger than that of the first insulating film.

4. The semiconductor device according to claim 1, wherein an average grain diameter of a plurality of first crystals included in the ferroelectric film is larger than an average grain diameter of a plurality of second crystals included in the first insulating film.

5. The semiconductor device according to claim 1, wherein an upper surface of the ferroelectric film has unevenness larger than that of an upper surface of the first insulating film.

6. The semiconductor device according to claim 1, wherein the ferroelectric film and the first insulating film comprise the same material.

7. The semiconductor device according to claim 6, wherein the ferroelectric film comprises a first crystal having an orthorhombic crystal phase, while the first insulating film comprises a second crystal having a non-orthorhombic crystal phase.

8. The semiconductor device according to claim 1, wherein the first insulating film has an impurity concentration lower than that of the ferroelectric film.

9. The semiconductor device according to claim 1, wherein, between the ferroelectric film and the first gate electrode, a metal film is additionally formed.

10. The semiconductor device according to claim 2, further comprising:
- a second gate electrode provided over the upper surface of the semiconductor substrate via a second insulating film to be adjacent to one side surface of the first gate electrode via the first insulating film and the ferroelectric film,
- wherein the first gate electrode, the second gate electrode, and the source and drain regions are included in a nonvolatile storage element.

11. The semiconductor device according to claim 10, further comprising:
- a protruding portion which is a portion of the semiconductor substrate protruding from the upper surface of the semiconductor substrate and extending in a first direction along the upper surface of the semiconductor substrate,
- wherein each of the first gate electrode and the second gate electrode extends in a second direction orthogonal to the first direction, and
- wherein the source and drain regions are formed in a top surface of the protruding portion such that a pattern including the first gate electrode and the second gate electrode is interposed therebetween in the first direction.

* * * * *